United States Patent [19]
Fujita et al.

[11] Patent Number: 5,977,888
[45] Date of Patent: Nov. 2, 1999

[54] SWITCHING DEVICE OF THIN TYPE AND DISPLAY DEVICE WITH SWITCH

[75] Inventors: Toshihiro Fujita; Akito Okamoto; Yoshitaka Tsuji, all of Osaka, Japan

[73] Assignee: Idec Izumi Corporation, Japan

[21] Appl. No.: 08/700,484

[22] PCT Filed: Dec. 25, 1996

[86] PCT No.: PCT/JP95/02671

§ 371 Date: Aug. 26, 1996

§ 102(e) Date: Aug. 26, 1996

[87] PCT Pub. No.: WO96/20490

PCT Pub. Date: Jul. 4, 1996

[30] Foreign Application Priority Data

Dec. 28, 1994 [JP] Japan .................................. 6-338647
Apr. 19, 1995 [JP] Japan .................................. 7-119210
Sep. 6, 1995 [JP] Japan .................................. 7-255648
Sep. 6, 1995 [JP] Japan .................................. 7-255651

[51] Int. Cl.⁶ .................................................. H03K 17/94
[52] U.S. Cl. .............................. 341/34; 341/175; 341/22; 345/173; 345/168; 345/111; 200/12; 200/5 A
[58] Field of Search ........................ 345/111, 168, 345/173; 341/22, 32, 24, 34, 175; 200/12, 5 A

[56] References Cited

U.S. PATENT DOCUMENTS

| Re. 31,942 | 7/1985 | Klehm, Jr. ............... 340/365 |
| 3,167,624 | 1/1965 | Jones, Jr. . |
| 3,987,259 | 10/1976 | Larson . |
| 4,054,944 | 10/1977 | Lau . |

(List continued on next page.)

FOREIGN PATENT DOCUMENTS

| 0059378 | 9/1982 | European Pat. Off. . |
| 2508228 | 12/1982 | France . |
| 3320107 | 12/1984 | Germany . |
| 8800983 | 7/1988 | Germany . |
| 5650662 | 11/1981 | Japan . |
| 0061723 | 1/1986 | Japan . |
| 6135326 | 3/1986 | Japan . |
| 63-118135 | 7/1987 | Japan . |
| 1129737 | 9/1989 | Japan . |
| 219861 | 5/1990 | Japan . |
| 3156816 | 7/1991 | Japan . |
| 471125 | 3/1992 | Japan . |
| 4111122 | 9/1992 | Japan . |
| 4245120 | 9/1992 | Japan . |
| 541134 | 2/1993 | Japan . |
| 5-41037 | 6/1993 | Japan . |
| 541037 | 6/1993 | Japan . |
| 0644857 | 2/1994 | Japan . |
| 1537872 | 1/1979 | United Kingdom . |
| 2099762 | 12/1982 | United Kingdom . |
| 2136633 | 9/1984 | United Kingdom . |

OTHER PUBLICATIONS

European Search Report dated Oct. 26, 1998.
Chinese Office Action dated Nov. 5, 1998.

*Primary Examiner*—Richard A. Hjerpe
*Assistant Examiner*—Henry N. Tran
*Attorney, Agent, or Firm*—Ostrolenk, Faber, Gerb & Soffen, LLP

[57] ABSTRACT

A touch panel (4) and an operation part (30) are provided on display means (2). A permanent magnet (52) is mounted on a push button (32), and a magnetic metal plate (58) is mounted on a support frame (36). When the push button (32) starts to be pushed down toward the touch panel (4), the push button (32) moves toward the touch panel (4) against magnetic attractive force of the permanent magnet (52) and the magnetic metal plate (58), and an operation forward end part (46) operates a touch switch (4a). Stroke feeling results from this movement. Further, the aforementioned magnetic attractive force abruptly reduces in an initial period of this movement, and an operator of the push button (32) can attain click feeling. Since the stroke feeling and the click feeling are caused in the operation of the push button (32), operability is improved while making the best use of such an advantage that the touch panel (4) is of a thin type.

39 Claims, 56 Drawing Sheets

U.S. PATENT DOCUMENTS

| | | | |
|---|---|---|---|
| 4,088,904 | 5/1978 | Green | 307/308 |
| 4,257,179 | 3/1981 | Oka et al. | 40/475 |
| 4,441,001 | 4/1984 | Miyano et al. | 200/308 |
| 4,594,482 | 6/1986 | Saito et al. . | |
| 4,598,181 | 7/1986 | Selby . | |
| 4,879,548 | 11/1989 | Mitarai et al. | 340/712 |
| 4,977,298 | 12/1990 | Fujiyama | 200/5 |
| 5,177,327 | 1/1993 | Knowles | 178/18 |
| 5,231,386 | 7/1993 | Brandenburg et al. | 340/709 |
| 5,283,558 | 2/1994 | Chan | 345/168 |
| 5,574,446 | 11/1996 | Dittrich et al. | 341/22 |

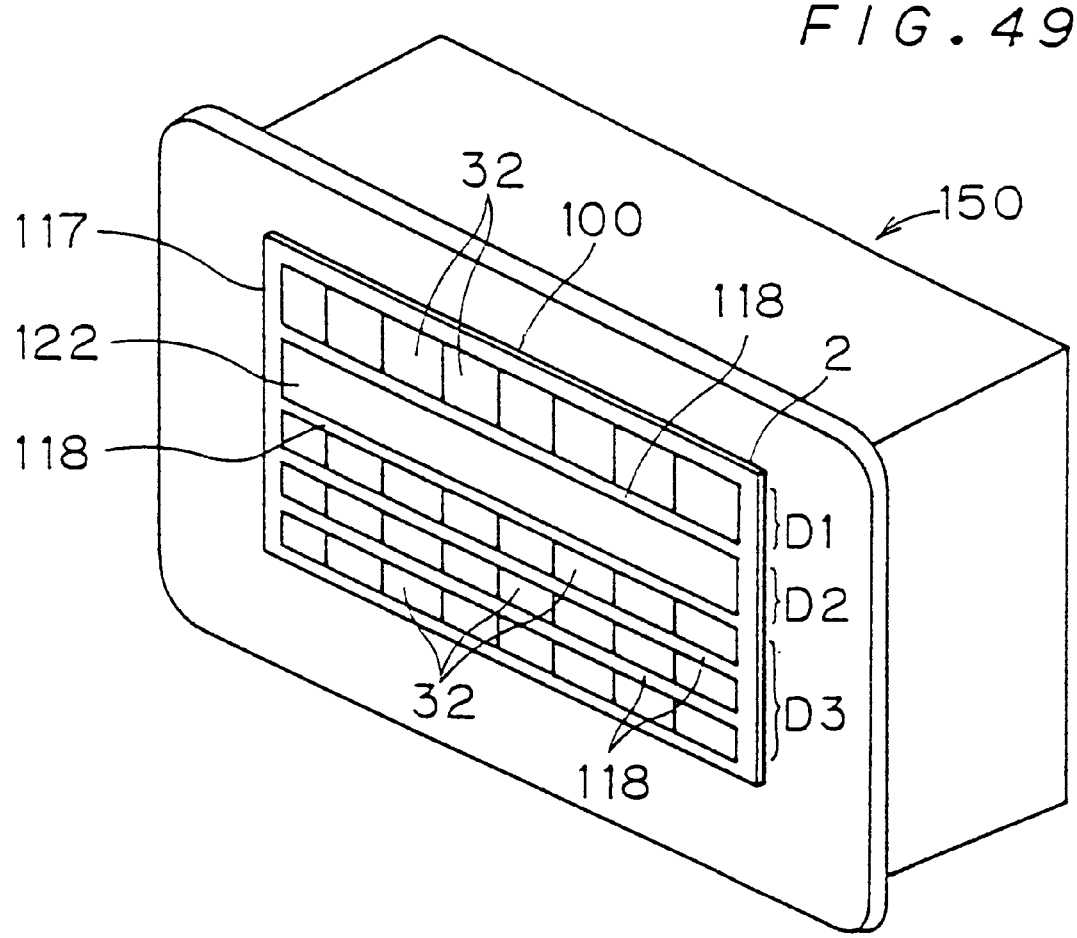

F I G . 50A

| D1 | LOCAL | MIDDLE-DISTANCE | COUPON TICKET | LTD. EXPRESS TICKET | | | | |
|---|---|---|---|---|---|---|---|---|
| D2 | SELECT YOUR TICKET TYPE ON THE MENU | | | | | | | |
| D3 | 1.00 | 1.50 | 2.00 | 2.50 | 3.00 | 3.50 | 4.00 | 4.50 |
| | 5.50 | 7.00 | 8.50 | 9.00 | 10.00 | 12.50 | 14.00 | 17.50 |
| | 20.00 | 21.50 | 23.00 | | | | | CHILD |

F I G . 50B

| D1 | LOCAL | MIDDLE-DISTANCE | COUPON TICKET | LTD. EXPRESS TICKET |
|---|---|---|---|---|
| D2 | SELECT DIRECTION | | | |
| D3 | NORTH | SOUTH | EAST | WEST |
| | | | | |
| | | | | |

FIG.50C

| D1 | OLD LINE | NEW LINE | | |
|---|---|---|---|---|
| D2 | OLD LINE --- SELECT YOUR DISTINATION ||||
| D3 | A | B | C | D | E | F | G | H |
|  | I | J | K | L | M | N | O | P |
|  | Q | R | S | T | U | V | W | X |

FIG.50D

| D1 | | | | |
|---|---|---|---|---|
| D2 | FARE TO "D" STATION IS $12.50 --- INSERT CARD OR CASH ||||
| D3 | | | | | | | | |
|  | | | | | | | | |
|  | | | | | | | | |

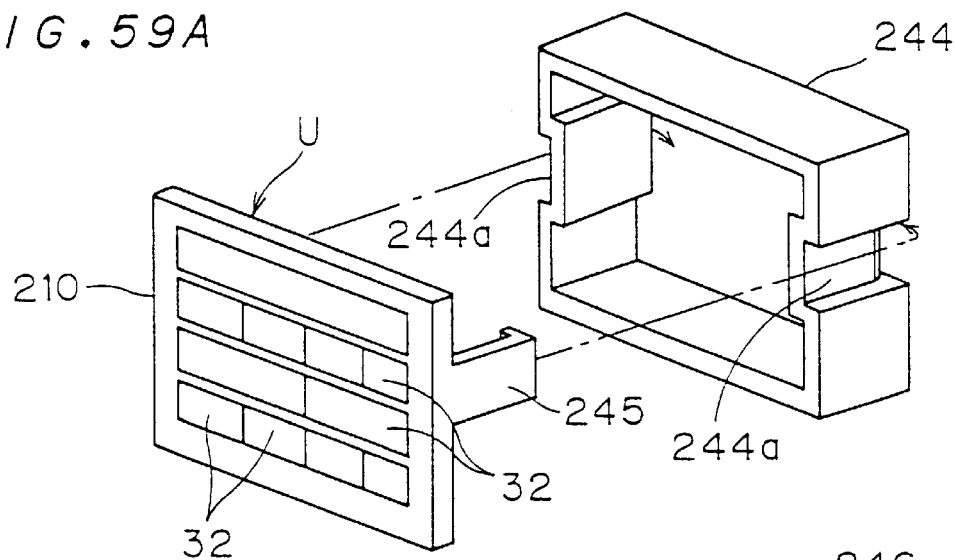
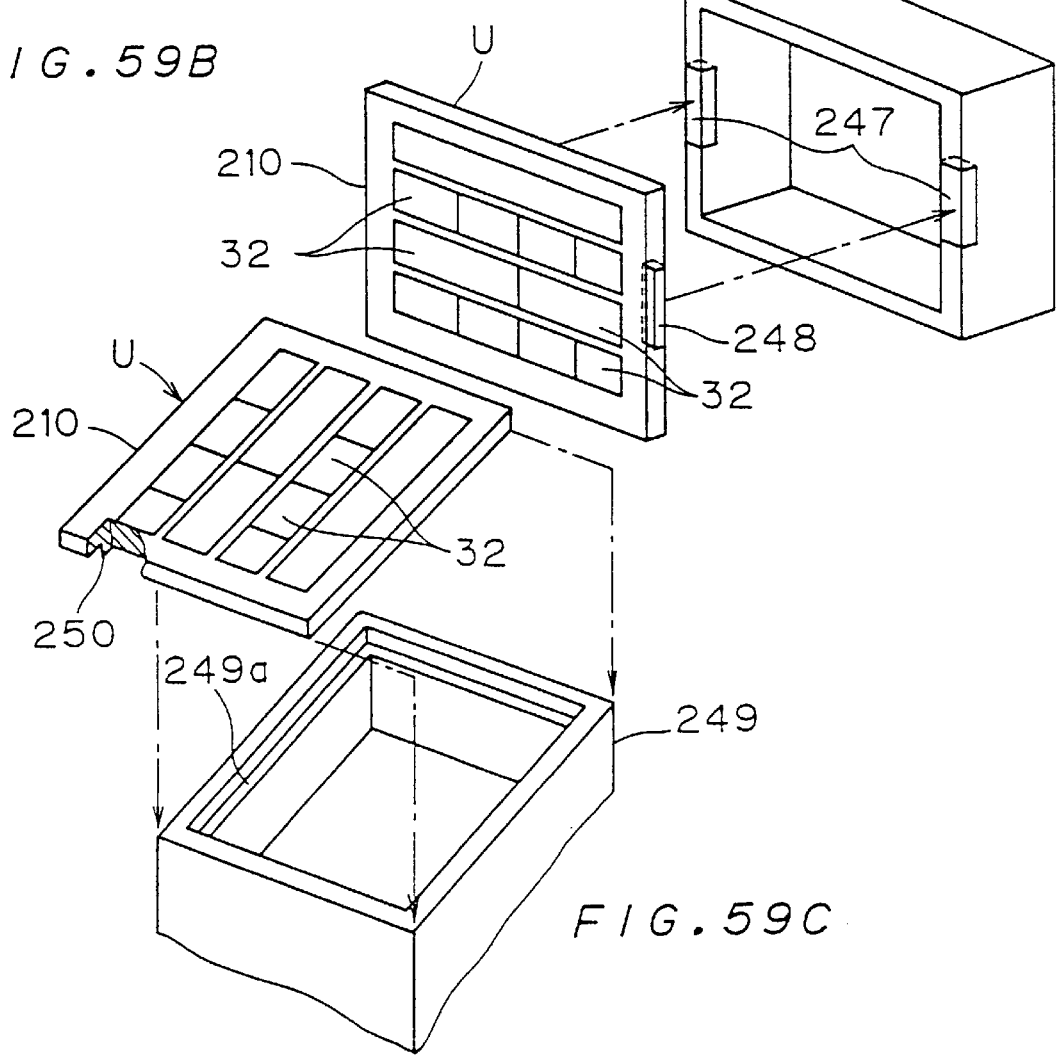

SWITCHING DEVICE OF THIN TYPE AND DISPLAY DEVICE WITH SWITCH

TECHNICAL FIELD

The present invention relates to a switching device of a thin type which is employed for a factory automation apparatus (FA apparatus), a vending machine, a ticket-vending machine, an information apparatus, a domestic electrical product, a medical operation apparatus or the like and a display device with a switch employing the same.

BACKGROUND ART

A touch panel is well-known in the art as a typical switch of a thin type. In brief, the touch panel is a panel-type switch which has at least one switch part and can operate it with a substantially zero push-in stroke, or a panel-type switch having at least one switch part which can be operated by touching or lightly pushing the same.

In relation to touch panels, there are 1) a resistor film type (this is also called a transparent electrode type. Identical for the rest) opposing upper and lower transparent electrodes to each other between a transparent thin plate with a small space, 2) a photoelectric type cutting off or damping light outgoing from a light emitting device and entering a photodetector with a finger or the like, 3) an ultrasonic wave type of cutting off or damping ultrasonic waves outgoing from an ultrasonic oscillation device and entering a receiving device, and the like.

A touch panel 4 shown in FIG. 1 is of the resistor film type, and in brief, it is formed by providing at least one switch part which is turned on by being pushed from the exterior lightly (namely, with a substantially zero stroke) between transparent thin plates. In detailed description, this touch panel 4 is formed by superposing a transparent thin plate 10 having a plurality of opening portions 12 on a transparent thin plate 6 which is formed with a transparent electrode 8 on its upper surface, and superposing a transparent thin plate 16 which is formed with a transparent electrode 18 on its lower surface further thereon. The transparent electrodes 8 and 18 may be a plurality of stripy electrodes which are perpendicular to each other, or one electrode, e.g., the transparent electrode 18 may be a plurality of electrodes and the other electrode, e.g., the transparent electrode 8 may be a common electrode. The transparent thin plates 6 and 16 have flexibility since the same are thin plates. However, the lower transparent thin film 6 may not have flexibility.

Switch parts 4a are formed in portions of the respective opening portions 12, and when the portion of a desired opening portion 12 is lightly pushed from the transparent thin plate 16 side in this example, the transparent thin plate 16 and the transparent electrode 18 in the pushed portion are deflected so that the transparent electrode 18 comes into contact with the lower transparent electrode 8 through the opening portion 12 to be electrically turned on. However, the size, shape, number etc. of the respective switch parts 4a are arbitrary, and a plurality of small switch parts 4a may be electrically connected in parallel with each other to be employed as a single integrated switch part.

It is possible to form a display panel with switches by superposing such a touch panel 4 on a display panel 2 having an information display function as shown in FIG. 2, for example. Such a display panel with switches is disclosed in JP-U-61,723 (1986), for example. The display panel 2 is typically a liquid crystal display.

On the display panel 2, display regions 2a displaying contents selected by operation of the switch parts 4a such as control contents in an FA apparatus, destinations in a ticket-vending machine or the like, for example, are formed around lower portions of the switch parts 4a of the touch panel 4 in general, as shown in FIG. 3, for example. Thus, selection-operation of a desired switch part 4a is made easy.

The aforementioned touch panel 4 has such an advantage that the same is extremely thin with a thickness of about 1 mm at the most as a whole, while there is such a problem that the push-in stroke for the switch part 4a is extremely small at about zero (in more concrete terms, about 0.1 to 0.2 mm) and hence displacement thereof cannot be recognized by a human finger and hence "stroke feeling" of operating the switch parts 4a cannot be attained. The stroke feeling is also called "operation feeling".

When the stroke feeling cannot be attained, the person who has operated any switch part 4a may feel so uneasy that he repeatedly and excessively strongly presses/operates the switch part 4a although the switch part 4a has already been turned on since he has felt no operation of the switch part 4a. Particularly when he pushes it with a globe, he can attain absolutely no stroke feeling.

The aforementioned photoelectric and ultrasonic wave type touch panels are also operated by touching surfaces thereof etc. with a finger (i.e., with a zero push-in stroke), and hence stroke feeling cannot be attained.

A display panel with switches shown in FIG. 4 is proposed as that solving the problem of such a stroke feeling shortage of the touch panel. Such a technique is disclosed in JP-A-644,857 (1994), for example.

This display panel with switches has a structure obtained by providing a switching unit 20 on each display region 2a of the aforementioned display panel 2 respectively.

Each switching unit 20 comprises a housing 22, a transparent push button 24, a switching mechanism 26 which is operated by this push button 24, and an image guide 28. The switching mechanism 26 has an electrical contact and a return spring for returning this electrical contact and the push button 24 (both are not shown). The image guide 28 is formed by bundling and integrating a plurality of optical fibers, whereby the display content of the display panel 2 can be floated up to an upper surface of this image guide 28. Such an image guide 28 is provided, for the purpose of preventing such a situation that the distance between the surface of the display panel 2 and the push button 24 inevitable increases due to the provision of the switching mechanism 26 and the display content of the display panel 2 is displayed in a considerably deep portion of the push button 24 to become inconspicuous in this state.

While stroke feeling can be attained in this display panel with switches since a push-in stroke for the push button 24 can be ensured to some extent, the thickness of the switching unit 20 is large since the mechanical switching mechanism 26 is employed, and hence the image guide 28 is necessary for the aforementioned reasons and there are the following problems following this: Namely, the image guide 28 is formed by bundling a plurality of optical fibers as described above, and the picture quality is coarse and fine-grained display is difficult since there is a limit in increase of the number of the optical fibers. Further, light is emitted from upper end surfaces of the optical fibers forming the image guide 28 only in a range of about 70 degrees from just above at the most, and hence the display content of the display panel 2 is hard to recognize from an oblique direction. Further, such an image guide 28 is so high-priced that the overall display panel with switches is also high-priced.

A situation in case of employing such a conventional display panel (control panel) with switches for a control panel is now described.

In a control panel which is employed in a factory or the like, information necessary for a human for performing operation, driving, recognition, monitoring, maintenance and the like on a system which is constructed by machines equipment and the like is integrated, and the control panel is importantly placed as a man-machine interface mediating between the human and the machines.

Therefore, it is desired that the control panel is a man-machine interface which is friendly to the human and considerate toward a human engineering aspect capable of providing handiness, in order to reliably, efficiently and safely work the system.

While a skilled operator performs operation/driving of a system in a factory etc. in a control panel in a system such as an FA apparatus, a general human operates an apparatus as an operator in a system such as a ticket-vending machine in the yard of a railway station, for example, and it is extremely important to attain improvement of handiness and operability. The ticket-vending machine or the like is also referred to as a control panel in the broad sense here.

There are two necessary and indispensable man-machine interface functions for the control panel in the aforementioned system as viewed from the human who is an operator, and one is that the human recognizes the state of the machine and the other is that the human operates the machine.

Namely, it is a basic operation that the state in the system is displayed on the control panel by a display, the human recognizes and decides the displayed information, and the human operates the operation apparatus of the machine.

Therefore, to improve handiness as a control panel can be expressed in other words that improvement of operability for the human and improvement of recognition for the human, i.e., improvement of displayability is important.

Information displayed on the control panel includes fixed information in which the display content is fixed and variable information which can freely change the display content, and conventional examples of devices utilizing these information display means are described with reference to FIG. 5 and FIG. 6 respectively.

FIG. 5 shows an example comprising variable information display means, indicating a panel surface of a control panel CPI which is generally used at present.

On the panel surface, a liquid crystal display as a display panel 2 for displaying information such as a control content in an FA apparatus or the like is provided.

The liquid crystal display is an example of a display panel which can freely change the display screen by setting of a program of software, i.e.. which can perform display of variable information.

And, a touch panel 4 is set on the display panel 2, in such a structure that a plurality of switch parts 4a comprised in this touch panel 4 are opposed to and superposed on display regions of the display panel 2 respectively.

Such a touch panel 4 used in a conventional touch panel type display device TPD has such a property that stroke feeling cannot be attained as already described. Thus, the operator may feel so uneasy that he repeatedly presses/operates the switch part 4a although the switch part 4a has already been turned on since he has felt no operation of the switch part 4a.

In order to remove such uneasy feeling of the operator, a liquid crystal display displaying variable information is employed as a display panel DP while an operation switch assembly consisting of illuminant push button switches ISW comprising name plates or membrane switches MSW printed/noted on surface parts is separately provided around the liquid crystal display for attaining stroke feeling in pressing/operation as a panel surface of a control panel CP2 shown in FIG. 6. for example. These name plates and printing/noting function as fixed information display means.

In such a device employing a liquid crystal display and an operation switch assembly together, however, the panel surface increases in size since an operation switch group is separately provided in the marginal part of the liquid crystal display although stroke feeling can be attained, while it is necessary to make the number of the operation switches increase in response to the information number in order to display numerous information since the operation switch assembly is limited to display of fixed information, and the device increases in size.

Further, it is necessary to compare and operate the display screen and the operation switches since the operation switch assembly is separately set in the marginal part of the liquid crystal display, and a malfunction easily takes place and operability is extremely inferior.

In addition, it is necessary to remake a panel surface which is responsive to the number of the assembled operation switches when change of the specification of the control panel or the like takes place, leading to increase in cost along, with increase of the operation step number.

As in the above description, numerous display is enabled in an operation display device of a small panel surface in the touch panel type display device shown in the example of FIG. 5 since the same can attain diversification of display information and operation information by program setting of software, while the so-called operability is inferior since the human cannot have an operating sense, and we cannot help saying that consideration is insufficient also in view of human engineering.

On the other hand, a switching device assembly is arranged for fixed information in addition to the variable information display device in the example of the control panel shown in FIG. 6, and hence operability for the human is by far improved by employing these switches, and the human can attain an operating sense. However, it comes to that an extremely large number of switches are arranged in the periphery of the variable information display device, and the control panel increases in size since a large area is necessary, and compaction is made difficult.

As described above, a case of only variable information or only fixed information is rare as information displayed on the control panel, and cases where variable information and fixed information coexist are rather general such that various types of apparatuses are arranged as in the control panel surface shown in the example in FIG. 6 in most cases.

In case of looking at the overall panel surface, therefore, there is a restriction on layout with respect to arrangement of apparatuses for display of variable information and apparatuses for a display operation of fixed information and the like as shown in FIG. 6, while neat feeling is hard to attain and it comes to a complicated impression since designs etc. are absolutely different, and it cannot be said sufficient in human sensitivity engineering.

SUMMARY OF THE INVENTION

<Objects of the Invention>

The present invention aims at providing a switching device of a thin type which can attain stroke feeling while making the best use of such a characteristic that a touch panel is of an extremely thin type.

Another object of the present invention is to provide a displays device with a switch which requires no image guide and can attain stroke feeling by employing the aforementioned switching device of a thin type.

Still another object of the present invention is to provide a display device with a switch which can attain click feeling along with stroke feeling.

A further object of the present invention is to provide a display device with a switch which brings no size increase of an operation display surface.

<Structure and Function of the Invention>

The present invention is directed to a switching device which performs switching of a prescribed signal.

According to the present invention, the switching device comprises a touch panel having a touch switch for switching a signal by being touched with a substantially zero stroke, and an operation part which is provided on this touch switch and has at least one operation means for operating the touch switch.

Each operation means has a support frame which is provided on the touch switch, a push button which is supported in a reference position on the touch switch by this support frame for operating the said touch switch by being pushed from the reference position toward the touch switch, and return means for applying return force to the push button, the return force being directed from the touch switch toward the reference position.

According to the present invention, the push button moves and operates the touch switch when the push button of the operation part is pushed. In the present invention, it is possible to ensure a stroke for pushing the push button, whereby clear stroke feeling can be attained while making the best use of such a property of the touch panel that the same can be extremely thinned.

The switching device according to the present invention can approach the push button and the touch panel to each other since it is not necessary to provide a mechanical switching mechanism between the push button and the touch panel. Thus, display contents of a display panel are displayed in close vicinity to the push button, whereby an image guide is unnecessary.

In a preferred embodiment of the present invention, a combination of magnetic means is utilized as the return means. The combination of the magnetic means may be a combination of permanent magnets, or a combination of a permanent magnet and a magnetic metal.

However, "magnetic means" (or "magnetic body") in the present invention is a generic term of members causing magnetic interaction. A permanent magnet and a magnetic metal, and magnetic resin (resin magnetic body) and the like are included in "magnetic means". On the other hand, "magnetic metal" is a generic term of metal materials having properties of causing magnetic interaction in response to magnetism but wearing no substantial spontaneous magnetization themselves, i.e., metals intermetallic compounds (including metal oxides) and alloys having no residual magnetization.

In the preferred embodiment of the present invention, magnetic resin (resin magnetic body) prepared by mixing magnetic powder into resin can be used as a permanent magnet.

In one mode of the present invention, the push button slides along a frame body. In another mode of the present invention, the push button rotates.

Preferably, a zone where return force reduces is included in the movement range of the push button from the aforementioned reference position to the touch switch. In this case, reaction force by the return force reduces halfway when an operator pushes the push button from the reference position. Click feeling results from this. "Click feeling" in the present invention may not accompany a click sound, but is attained by the aforementioned reduction of the reaction force.

The present invention also provides a display device with a switching using the aforementioned switching device of a thin type. In this case, that having transparency is used as the push button. "Having transparency" is a generic term of "transparent" and "semi-transparent".

Other objects and features of the present invention are clarified in the following description.

BRIEF DESCRIPTION OF THE DRAWINGS

FIG. 49 is a perspective view of an operation unit.

FIG. 50A to FIG. 50D are diagrams showing examples of display.

FIG. 53 to FIG. 59 are assembling explanatory diagrams of the operation unit.

DESCRIPTION OF PREFERRED EMBODIMENTS

The present invention can be structured as various embodiments. Its principal mode is a mode utilizing magnetic coupling of a push button and a frame body guiding the same. When the present invention is classified by systems of pushdown of the push button, the same is classified into a translation type and a rotation type. Further, the present invention can be formed to cause click feeling in a switching device of a thin type.

Preferred embodiments are now described every such classification.

<1. Switch Having Stroke Feeling: Return by Magnetic Coupling>

<1-1. Translation Type>

<1-1A. Switch Accompanied by Click Feeling>

<First Embodiment>

Figure 7:
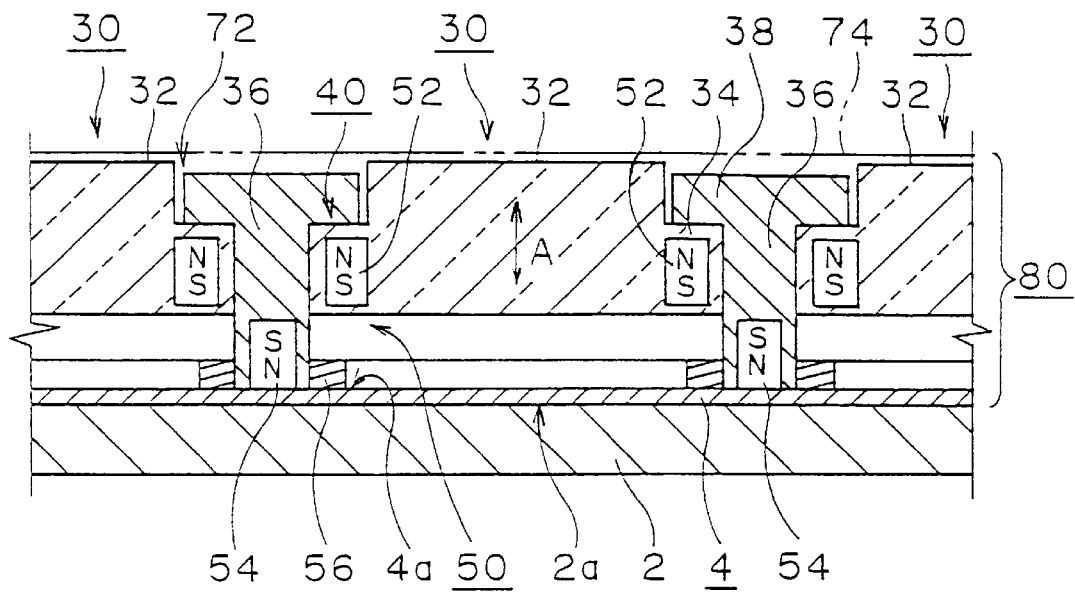
FIG. 7 is a partial sectional view of a preferred embodiment of the present invention.
Figure 8:
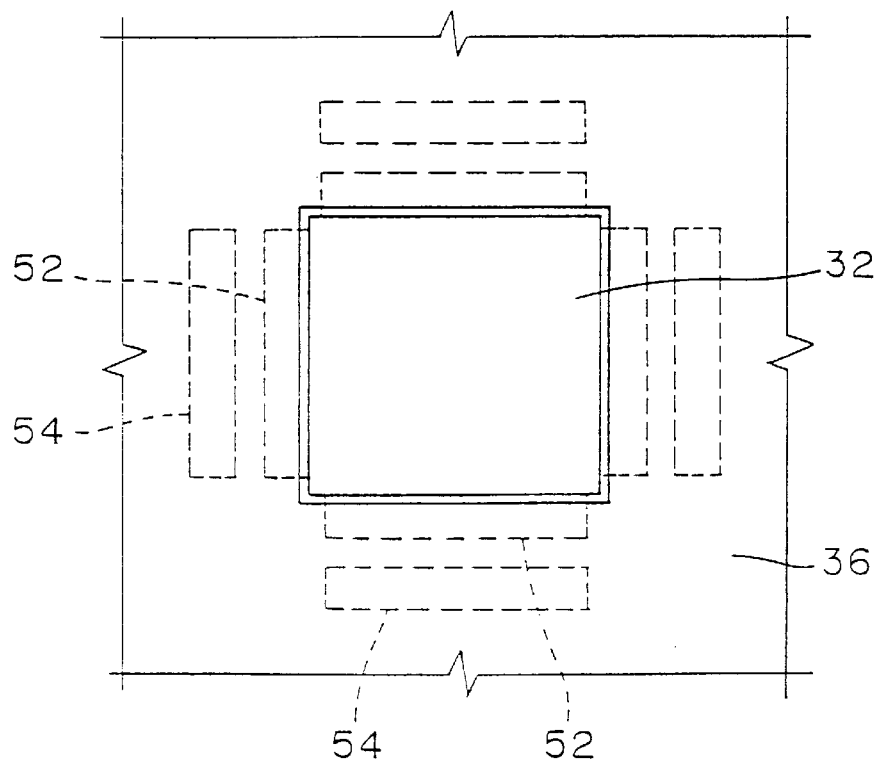
FIG. 8 is a plan view of the preferred embodiment of the present invention.
Figure 9:
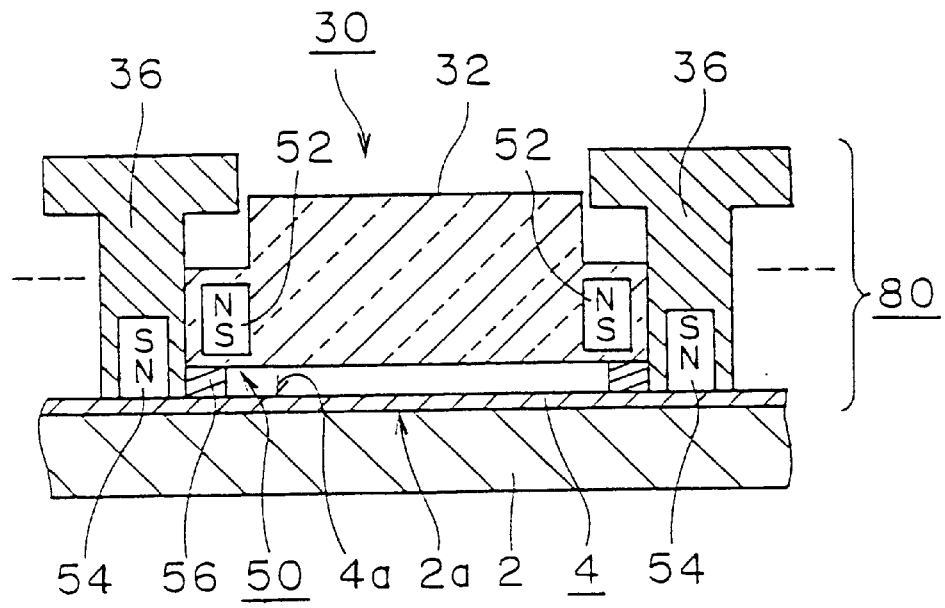
FIG. 9 is a partial sectional view showing movement of a push button in the preferred embodiment of the present invention.

FIG. 7 is a sectional view partially showing an embodiment of a display panel with switches employing a thin type switch 80 having a touch panel of a resistor film type and a push button of a translation type, which can provide stroke feeling and click feeling. FIG. 8 is a plan view of the display panel with switches of FIG. 7. FIG. 9 is a sectional view showing a state of pushing down the push button of the display panel with switches of FIG. 7.

Display panels with switches of this embodiment and embodiments hereinafter described are in structures superposing thin type switches 80 on display panels 2 having information display functions.

While the display panels 2 are typically liquid crystal displays having variable display functions by software programs, the same may be EL (electroluminescent) displays, plasma displays, CRTs, LED arrays, or those combining name plates displaying information or liquid crystal shutters with emitters or reflecting plates illuminating the same, and the point is that the same may have information display functions. In this case, the liquid crystal displays, the EL displays, the plasma displays or the like are preferable when magnets are employed for return means 50 described later although the same are not influenced by magnetic fields thereof, while such consideration is not necessary and there is no problem with CRTs when springs are employed for the return means 50 as in examples shown later.

In the display panel 2, a display region 2a displaying a content which is selected by an operation of a switch part 4a is formed around a lower part of the switch part 4a of a touch panel 4 forming the thin type switch 80 in this embodiment. Therefore, selection and operation of a desired switch part 4a are made easy.

Figure 1:
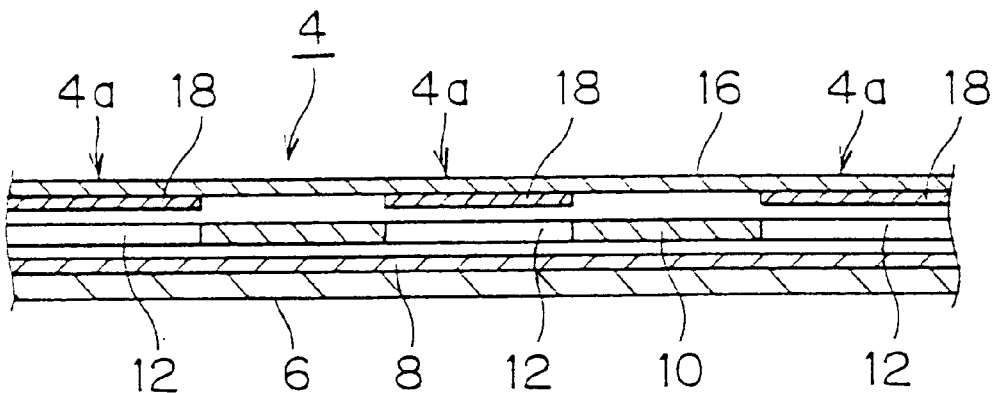
FIG. 1 is a sectional view showing a resistor film type touch panel in an exploded manner.
Figure 2:
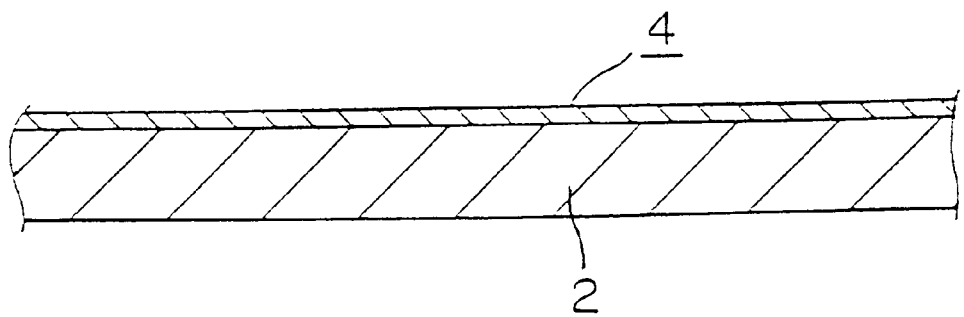
FIG. 2 and FIG. 3 are diagrams showing a combination of display means and touch panels.
Figure 3:
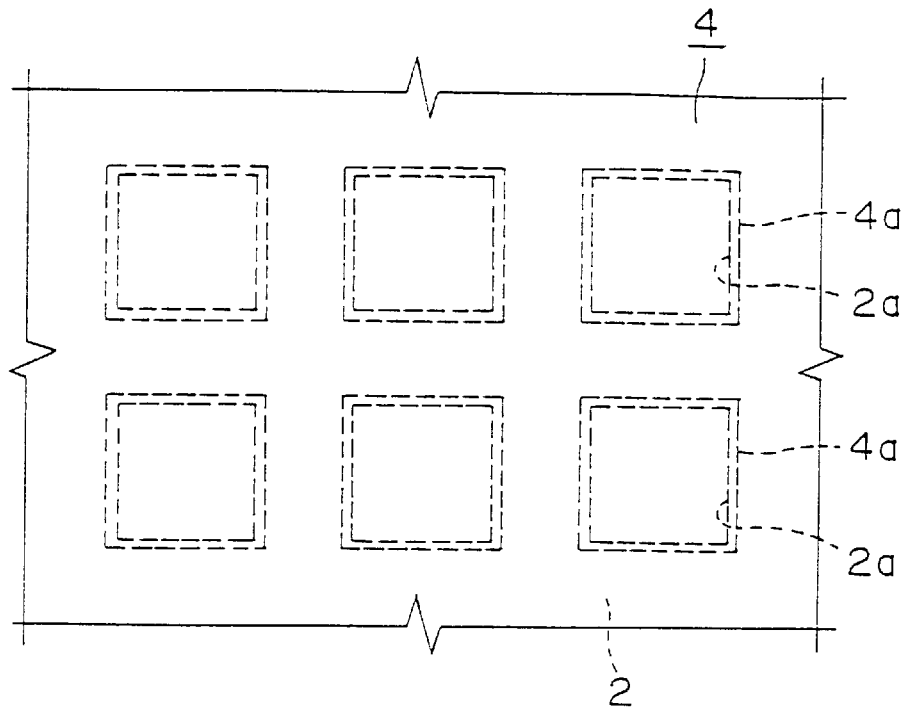

The thin type switch 80 comprises the touch panel 4 of a resistor film type which is superposed on the display panel 2 and formed by providing at least one transparent switch part 4a which is turned on by being lightly pushed from th exterior between transparent thin plates, and at least one operation part 30 provided on the switch part 4a of this touch panel 4. Among these, the touch panel 4 is of a resistor film type, and has a structure similar to that shown in FIG. 1.

Each operation part 30 forms one operation means, and comprises a transparent push button 32. This push button is movable in a press direction with a constant stroke, and when the same is pushed, it touches the corresponding switch part 4a in the touch panel 4, thereby operating the switch part 4a. In more concrete terms, the whole of the push button 32 linearly retreats in the press direction with the constant stroke in this embodiment as shown by arrow A, and pushes and turns on the corresponding switch part 4a of the touch panel 4. Further, each operation part 30 comprises return means 50 which is provided around a marginal part of the aforementioned push button 32 for supplying the push button 32 with return force, a support frame 36 which is provided around the marginal part of the push button 32 for defining the position of the push button 32 while guiding vertical linear movement of the push button 39, and an engaging part 40 for preventing displacement of the push button 32 respectively.

While plane shapes of the display region 2a of the display panel 2, the switch part 4a of the touch panel 4 and the push button 32 are arbitrary, the display region 2a of the display panel 2 has a square shape in this embodiment as an example, and the switch part 4a of the touch panel 4 also has a square shape which is substantially of the same size as the display region 2a in correspondence to this. Further, the push button 32 also has a square shape which is substantially of the same size as the switch part 4a in correspondence to these (see FIG. 8). However, the switch part 4a of the touch panel 4 may not necessarily be on the overall region above the display region 2a of the display panel 2, or on the overall region under the push button 32, but the same may be at least in a position around an upper part of the display region 2a of the display panel 2 to be operated by the push button 32 or a member connected with the same. This also applies to other embodiments.

The engaging part 40 has such a structure that a marginal part 34 of the push button 32 and an extension part 38 of the support frame 36 engage with each other to prevent displacement of the push button 32 in this embodiment.

The return means 50 utilizes a combination of repulsion and attractive force between permanent magnets in this embodiment, and comprises movable side magnetic bodies 52 which are provided in the marginal part 34 of the push button 32 so that magnetic poles thereof are vertically positioned, and fixed side magnetic bodies 54 which are provided in positions opposed to the movable side magnetic bodies 52 in the interior and the exterior and vertically partially opposed when the push button 32 is pushed down so that magnetic poles thereof are in reverse polarity to the movable side magnetic bodies 52 and vertically positioned in a base part of the support frame 36.

Describing the positional relation between both magnetic bodies 52 and 54 in detail, both magnetic bodies 52 and 54 are planarly in substantially completely opposed positions in the interior and the exterior as shown in FIG. 8. In the vertical direction, however, both magnetic bodies 52 and 54 are not completely opposed even if the push button 32 is pushed down but are in such positions that the movable side magnetic bodies 52 are opposed and stopped in upwardly deviating states as shown in FIG. 9. This is adapted to prevent such a situation that both magnetic bodies 52 and 54 attract each other and the push button 32 cannot upwardly return, as described later in detail.

Both magnetic bodies 52 and 54 are permanent magnets. The magnetic poles thereof may be entirely reverse to the illustrated example. Further, both magnetic bodies 52 and 54 may be in plural (two or four in more concrete terms) as shown in FIG. 8, or single annular ones. An annular magnet can be formed by molding a substance obtained by mixing magnetic powder into resin or the like. In addition, parts of both magnetic bodies 52 and 54 may be exposed from the push button 32 and the support frame 36, dissimilarly to the example shown in FIG. 7. These also apply to other embodiments.

There are various means for making both magnetic bodies 52 and 54 partially opposed to each other in the vertical direction when the push button 32 is pushed down, a spacer 56 of FIG. 7 is an example thereof. Other examples are described later.

Namely, the annular space 56 for limiting the indentation of the push button 32 is provided under the marginal part 34 of the push button 32 in the embodiment of FIG. 7. This spacer 56 also serves as a member for pushing the corresponding switch part 4a of the touch panel 4, and is vertically movable. As being vertically movable, however, it may be movable at a degree of being at least capable of turning on and off the switch part 4a of the touch panel 4, while the stroke for operating the switch part 4a of the touch panel 4 is substantially zero as described above and the thickness of the overall touch panel 4 is about 1 mm as described above, and hence it may be sufficiently movable by a distance of this degree.

Describing the operation of the embodiment of FIG. 7, both magnetic bodies 52 and 54 are generally opposed to each other in reverse polarity, whereby the push button 32 is pushed up by the repulsion between both magnetic bodies 52 and 54. However, the push button 32 is not displaced to spring out due to the engaging part 40.

When the push button 32 is pushed down against the repulsion between both magnetic bodies 52 and 54, the overall push button 32 is guided by the support frame 36 and pushed down to come into contact with the spacer 56, so that the corresponding switch part 4a of the touch panel 4 can be pushed and turned on through this spacer 56. This is the state of FIG. 9.

In this case, the distance between both magnetic bodies 52 and 54 reduce at first and hence the repulsion further increases when the push button 32 is pushed, while the reverse polarity magnetic poles of both magnetic bodies 52 and 54 approach and attractive force starts to act when a certain region is passed (when pushed down in excess of a certain decree) as understood when FIG. 9 is referred to, whereby the repulsion between both magnetic bodies 52 and 54 abruptly reduces and pushdown is abruptly lightened or eased.

Thus, such an operation or sense that the pushdown of the push button 32 is abruptly lightened halfway is a snap action or click feeling, and it is possible to more reliably transmit a sense of operating the switch to the operator with this, whereby the operation feeling for the switch is further improved. Since the pushdown of the push button 32 is abruptly lightened, further, it is possible to reliably operate the switch part 4a of the touch panel 4 with the push button 32 to the end. In other words, the pushdown of the push button 32 cannot be stopped in a half-finished position, whereby the operation for the touch panel 4 is made more reliable.

Even if the push down 32 is pushed down to the end, however, both magnetic bodies 52 and 54 are not completely opposed to each other since the spacer 56, is provided, and the repulsion remains between both magnetic bodies 52 and 54. This repulsion may be sufficient at least for returning the push button 32. This repulsion can be readily adjusted by the height of the spacer 56 or the like, for example.

When the pushing of the push button 32 is stopped, therefore, the push button 32 is made to return by the repulsion between both magnetic bodies 52 and 54, and stopped at the engaging part 40. The switch part 4a of the touch panel 4 returns and is turned off by itself. Thus, the device returns to the state of FIG. 7.

Figure 10:
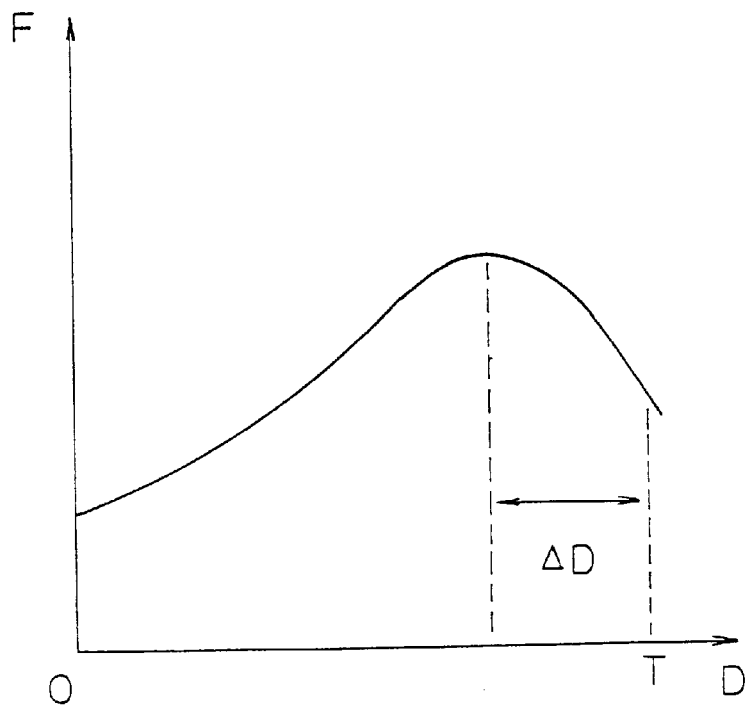
FIG. 10 is a graph showing change of return force in the structure of FIG. 9.

Such change of the return force is shown in FIG. 10 as a graph in further detail. When a movement distance D of the push button 32 from being in a position ("reference position" or "standby position") of FIG. 7 in such a state that the push button 32 is not pushed increases from zero, return force F temporarily increases and thereafter reduces in a zone $\Delta D$. A limit value T of the movement of the push button 32 is defined by the spacer 56 in this embodiment. The click feeling is attained since the change of the return force F includes such a zone $\Delta D$. The return force F has positive values in all zones 0 to T, so that return to the reference position is enabled from any state on whatever position the push button 32 is.

Thus, it is possible to ensure a stroke for indenting the push button 32 in the aforementioned thin type switch 80, whereby clear stroke feeling can be attained while making the best use of such a property of the touch panel that the same can be extremely thinned. Consequently, it is possible to give clear feeling of pushing the switch part to an operating person, thereby supplying a sense of security. As described above, the stroke (the magnitude of the limit distance T in FIG. 10) of this push button 32 is defined by the distance between a lower surface of the push button 32 and an upper surface of the spacer 56 in case of this embodiment, while sufficient stroke feeling can be attained at a degree of 0 several mm to 2 mm, for example.

Further, the click feeling can also be attained in addition to the stroke feeling in case of this embodiment as described above, whereby the operation feeling of the switch becomes more excellent and the switch operation becomes more reliable.

Figure 4:
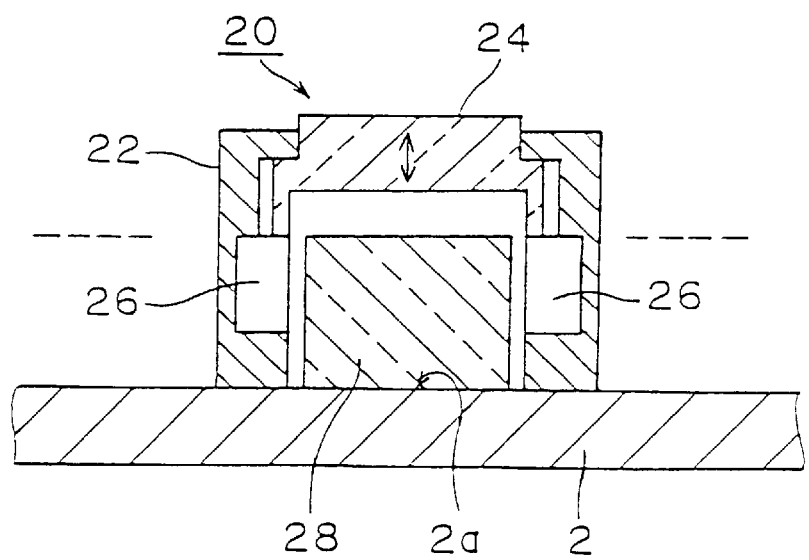
FIG. 4 is a sectional view of a conventional display device with switches.
Figure 5:
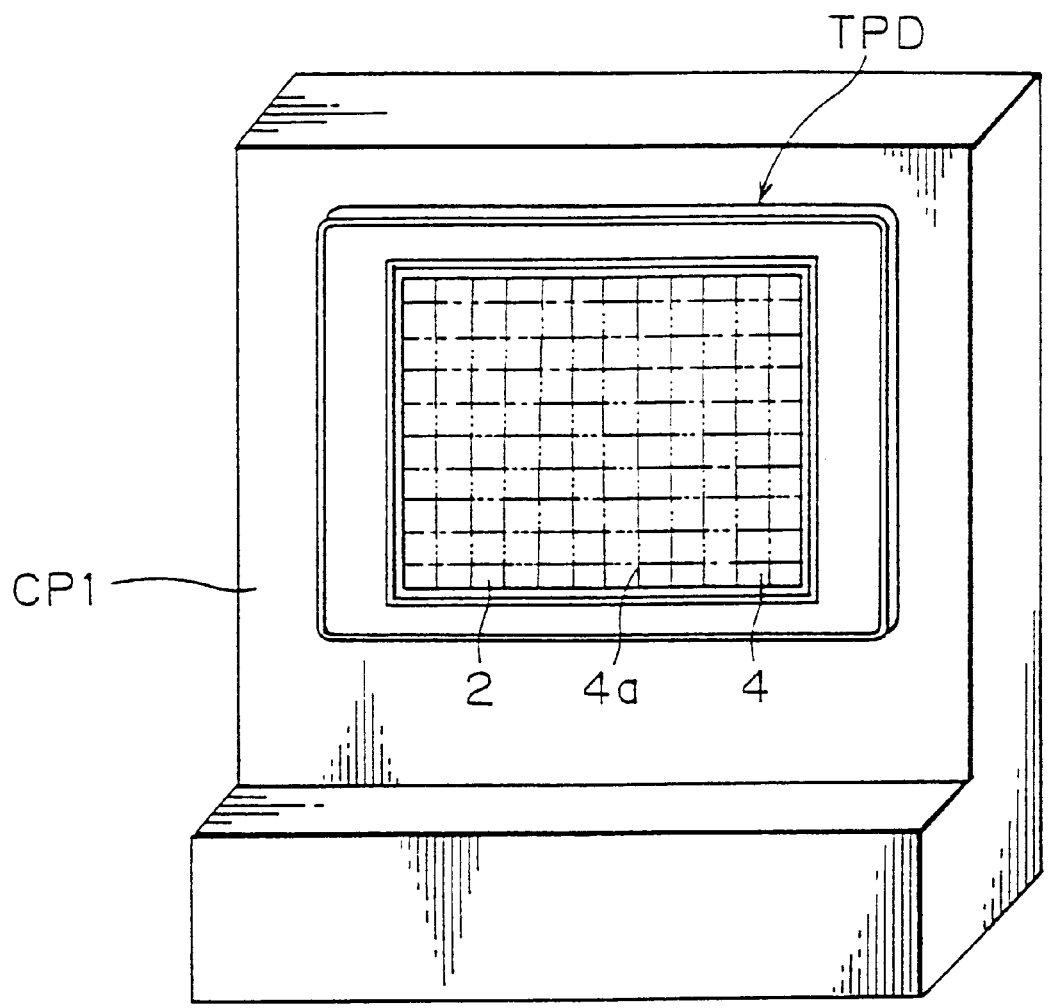
FIG. 5 and FIG. 6 are appearance diagrams of a conventional control panel employing a display device with switches.
Figure 6:
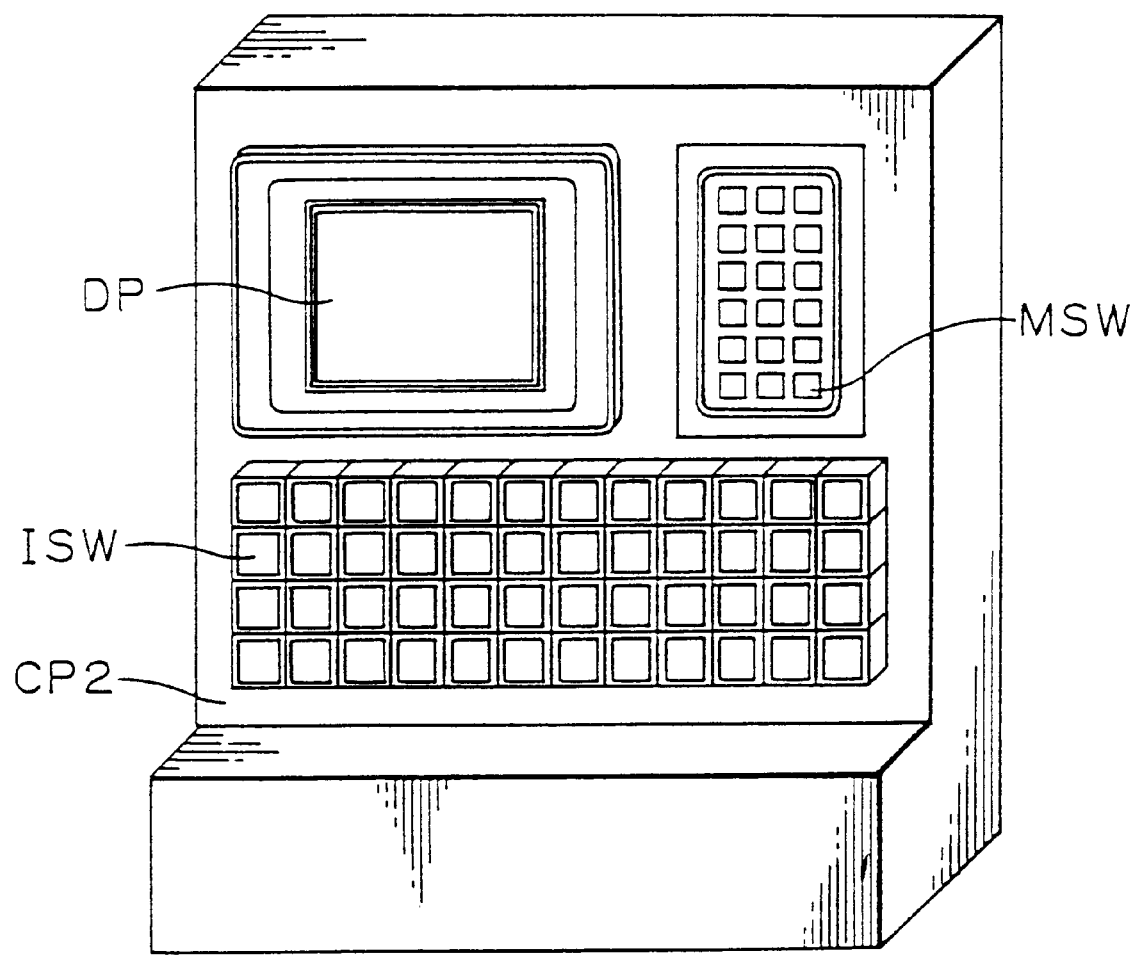

In addition, the aforementioned display panel with switches is formed by superposing the aforementioned thin type switch 80 employing the touch panel 4 on the display panel 2, and it is not necessary to provide a mechanical switching mechanism between the push button 32 and the display panel 2 dissimilarly to the case of the prior art of FIG. 4, whereby the push button 32 and the display panel 2 can be approached to each other. Assuming that the stroke for the push button 32 is about 0.5 mm, for example, the thickness of the touch panel 4 is extremely small at about 1 mm even if the height of the spacer 56 is made about 2 mm, whereby the distance between the lower surface of the push button 32 and an upper surface of the display panel 2 can be made extremely small at about 3.5 mm at the most also when the push button 32 is not pushed down. Therefore, it comes to that the display content of the display panel 2 is displayed in close vicinity to a deep portion of the push button 32, whereby no image guide is necessary dissimilarly to the case of the prior art of FIG. 4. Consequently, it is possible to observe the display content of the display panel 2 in excellent picture quality of the display panel 2 itself without making the same coarse. Further, no image guide limiting a viewing angle is employed, whereby the display content of the display panel 2 can be observed in an excellent state also from an oblique direction. In addition, no high-priced image guide is necessary and no complicated switching mechanism is necessary either, whereby cost reduction of the display panel with switches can be attained. Further, stroke feeling, as well as click feeling in case of this embodiment, can be attained in operation of the push button 32.

While the touch panel 4 and the push button 32 are prepared from transparent ones as described above to be combined with the display panel 2 in the case of this embodiment, the same may not necessarily be transparent but may be semitransparent depending on the display content of the display panel 2, and the point is that the same may transmit light from the lower display panel 2. Namely, the push button 32 is formed to have transparency in this case. This also applies to other embodiments combined with the display panel 2.

It is also possible to use the aforementioned thin type switch 80 without superposing the same on the display panel 2, and it is also possible to use the thin type switch 80 separately from the display panel 2 independently or in combination with other apparatuses or the like, for example, and the touch panel 4 and the push button 32 may not be transparent or semi-transparent but may be opaque since it is not necessary to transmit the light from the lower display panel 2 in this case. In this case, characters, symbols or the like may be entered, stamped or pasted on the surface of the push button 32, for the purpose of identification of the push button 32 etc. This also applies to other embodiments.

While the spacer 56 may be a transparent flat plate, the switch part 4a of the touch panel 4 can be pushed only in an inconspicuous portion of the marginal part of the display region 2a of the display panel 2 when the same is made annular as in this embodiment, and hence a flaw is formed in the inconspicuous portion even if the same is caused on the touch panel 4 by pushing the push button 32 by any chance, whereby it is possible to prevent the display content of the display panel 2 from becoming inconspicuous due to long-term use.

Figure 11:
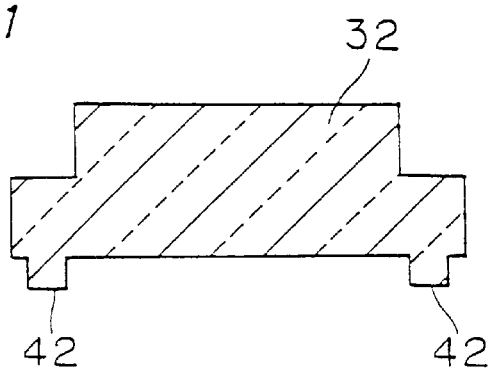
FIG. 11 to FIG. 14 are sectional views showing other examples of the push button.

In place of providing the aforementioned spacer 56, at least one leg portion 42 for pushing the corresponding switch part 4a of the touch panel 4 may be downwardly projected from the marginal part of the push button 32 as in an example shown in FIG. 11, for example. This leg portion 42 may be a single annular leg portion, or a plurality of leg portions which are arranged in a plurality of portions of a lower surface of the push button 32 on four corners, for example. A plurality of leg portions 42 are higher in reliability of switching operation since the same can reliably push only the target switch part 4a of the touch panel 4 with small force.

It is possible to attain function/effect similar to the case of the spacer 56, also by providing such a leg portion 42. Namely, it is possible to prevent the push button 32 from being incapable of returning upward by making the movable side magnetic bodies 52 and the fixed side magnetic bodies 54 partially opposed to each other in the vertical direction when the push button 32 is pushed down. Further, the leg portion 42 can be integrally formed with the push button 32, whereby the number of parts reduces as compared with the case of providing the spacer 56, whereby assembling is also simplified and further cost reduction can be attained following this.

Even if the aforementioned spacer 56 and the leg portion 42 are not provided, it is possible to make the movable side magnetic bodies 52 and the fixed side magnetic bodies 54 partially opposed to each other in the vertical direction also by providing the movable side magnetic bodies 52 not in close vicinity to the lower surface of the push button 32 but in an upper portion in the push button 32

Figure 12:
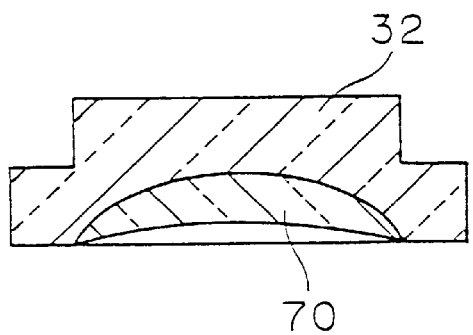

When the device is combined with the display panel 2, further, a convex lens portion 70 may be provided in the interior or the lower surface part of the push button 32, as in an example shown in FIG. 12, for example. In this case, the display region 2a of the display panel 2 is generally made to be positioned in the focal distance of this convex lens portion 70. When such a convex lens portion 70 is provided, it is possible to display the display content of the lower display panel 2 by the convex lens portion 70 in an enlarged manner, i.e., in a floating manner, whereby the display content of the display panel 2 can be made further conspicuous.

Further, no excessive space is taken when the convex lens portion 70 is provided not in a space between the push button 32 and the display panel 2 but in the interior or the lower surface part of the push button 32, whereby it is possible to prevent increase of the thickness of the overall display panel with switches.

Figure 14:
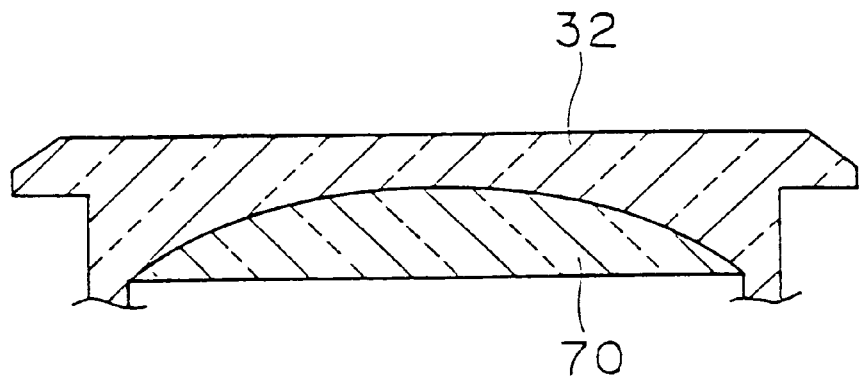

While a lower surface of the convex lens portion 70 may be a flat surface as in an example shown in FIG. 14, for example, the lower touch panel 4 can be pushed only by the marginal part of the push button 32 when the same is slightly depressed as in the example shown in FIG. 12, whereby it is possible to concentrate force to the target switch part 4a of the touch panel 4 for reliably pushing the same, while it is possible to prevent flawing on a conspicuous portion of the touch panel 4.

Figure 13:
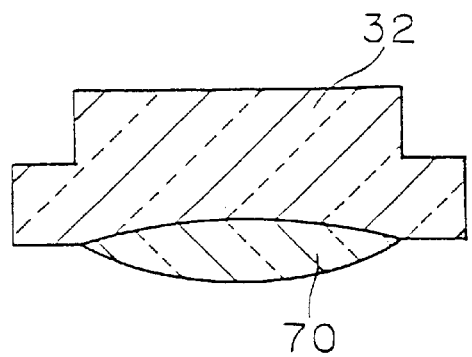

If flawing of the touch panel 4 is not much problematic, however, a part of the convex lens portion 70 may be downwardly projected from the lower surface of the push button 32, as in an example shown in FIG. 13, for example. Thus, it is possible to provide this convex lens portion 70 also with the functions of the aforementioned spacer 56 and the leg portion 42, whereby it is also possible to omit these.

The push button 32 having, the aforementioned convex lens portion 70 can be formed by double-molding or fitting the convex lens portion 70 consisting of transparent resin having a relatively large refractive index into the push button 32 consisting of transparent resin having a relatively small refractive index, for example.

The aforementioned leg portion 42 and the convex lens portion 70 can be also applied in other embodiments described later, and function/effect similar to the aforementioned one can be attained. The convex lens portion 70 may be a Fresnel lens making a convex lens action. Also in the examples of FIG. 11 to FIG. 13, the movable side magnetic bodies 52 may be provided in the push buttons 32, illustration of the movable side magnetic bodies 52 is omitted.

The surface of the push button 32 may be subjected to antireflection working or antibacterial coating. This also applies to the following embodiments.

As shown in FIG. 7 with a two-dot chain line, at least upper surface parts of the push button 32 and a clearance 72 which is present in the periphery of the push button 32, more simply the whole of upper surfaces of a plurality of operation parts 30 provided in parallel, may be covered with a transparent thin sheet 74 having flexibility.

In this case, it is possible to prevent the display of the display panel 2 from becoming inconspicuous due to water drops or dust entering, the interior through the clearance 72 and adhering, to the surface of the touch panel 4 or water drops spreading between the touch panel 4 and the display panel 2. However, the resistor film type touch panel 4 generally has a waterproof function, and hence no malfunction by water drops takes place in general. In case of using the device in dusty environment of a factory or the like, further, cleaning of the surface of the push button 32 is simplified. Thus, it is possible to readily implement a drip-proof and dustproof structure by providing the sheet 74.

The material for the aforementioned sheet 74 is transparent silicone rubber or transparent PET (polyethylene terephthalate), for example. The former has extremely large flexibility, and hence the sheet 74 may be in the form of a simple flat plate. The latter has slightly small flexibility, and hence it is preferable to make the portion of the push button 32 easy to push by performing the so-called embossing of swelling up a portion on the push button 32 by an amount responsive to the stroke for the push button 32.

<Second Embodiment>

Another embodiment is now described. However, redundant description is omitted as to parts which are similar to the precedent embodiment, and description is made mainly with reference to points which are different from the precedent embodiment.

Figure 15:
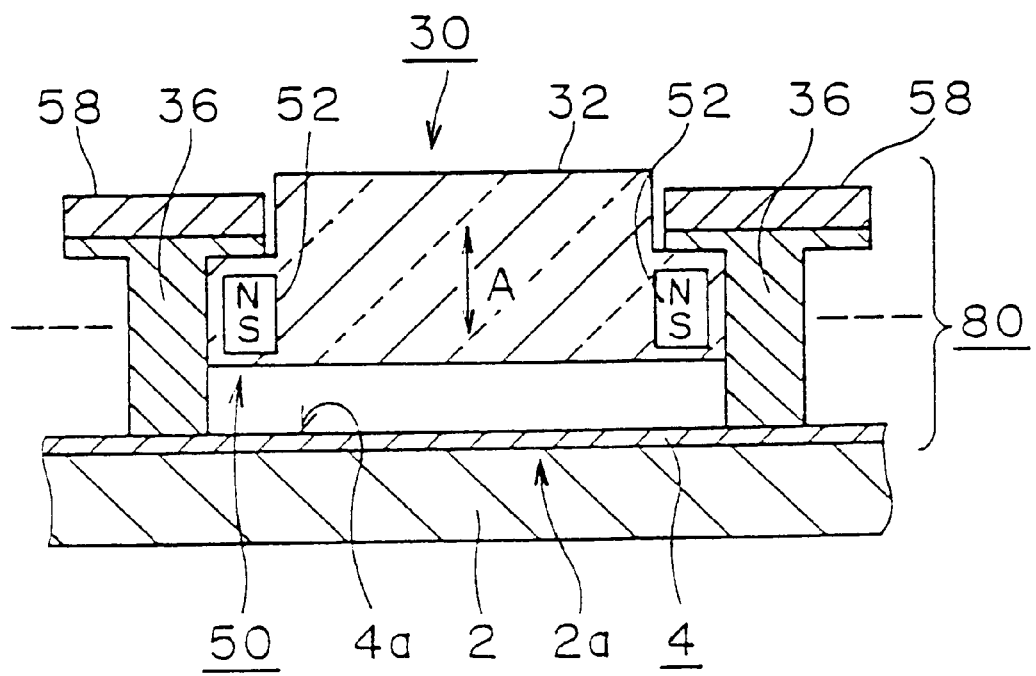
FIG. 15 is a partial sectional view of another preferred embodiment of the present invention.

FIG. 15 is a sectional view partially showing another embodiment of a display panel with switches employing a thin type switch 80 having a touch panel of a resistor film type and a push button of a translation type, which can provide stroke feeling and click feeling.

In this embodiment of FIG. 15, return means 50 utilizes magnetic attractive force of a permanent magnet and a magnetic metal plate, and comprises magnetic metal plates 58 which are provided on an upper part of a support frame 36 as fixed side magnetic bodies 54 and movable side magnetic bodies 52 which are provided in a marginal part of a push button 32 in portions located under the magnetic metal plates 58 for attracting the magnetic metal plates 58. The magnetic metal plates 58 consist of a ferromagnetic metal, and are iron plates, for example. However, the magnetic metal plates 58 are in states wearing no spontaneous magnetization (i.e., states having no residual magnetization). When induction magnetization is caused in the magnetic metal plates 58 by magnetic fields from the movable side magnetic bodies 52, magnetic interaction takes place between the movable side magnetic bodies 52 and the magnetic metal plates 58.

In this embodiment, the movable side magnetic bodies 52 strongly attract the magnetic metal plates 58 in general and the push button 32 does not go down unless the same is strongly pushed down at a certain degree at first in case of pushing down the push down 32, while the force of the movable side magnetic bodies 52 attracting the magnetic metal plates 58 is abruptly weakened when the push button 32 goes down a little, whereby the pushdown is abruptly lightened. Namely, click feeling can also be attained in addition to stroke feeling. When the pushdown is stopped, the push button 32 returns by the force of the movable side magnetic bodies 52 attracting the magnetic metal plates 58.

Further, no substance such as the spacer 56 in the embodiment of FIG. 7 or the leg portion 42 in FIG. 11 described later is necessary in this embodiment, whereby the thickness of the thin type switch 80 can be made small by this while the distance between a lower surface of the push button 32 and an upper surface of a display panel 2 can be made small, whereby the display content of the display panel 2 becomes more conspicuous. Further, magnets may be only the movable side magnetic bodies 52 while the fixed sides may be the magnetic metal plates 58 which are at a lower cost than the magnets, whereby cost reduction can be attained by this.

Figure 16:
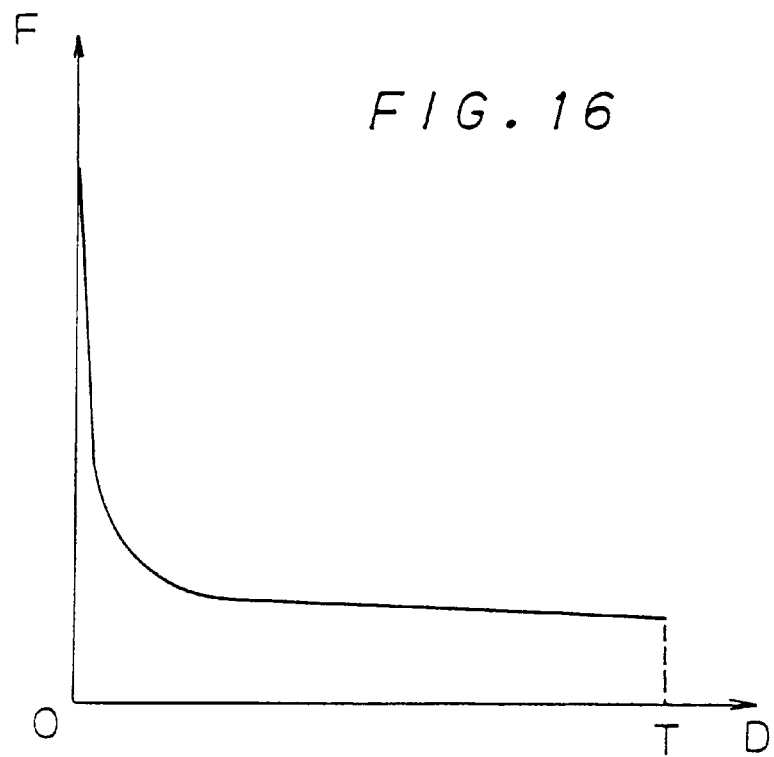
FIG. 16 is a graph showing change of return force in the structure of FIG. 15.

A state of change of return force in this embodiment is shown in a graph of FIG. 16, and return force F by magnetic attraction nonlinearly reduces as a movement distance D of the push button 32 increases. In case of this embodiment, a zone where the return force F reduces is the overall region of 0 to T, and the return force F abruptly reduces particularly in the first part of the movement distance D. However, no spacer 56 as in the embodiment of FIG. 7 is used in this embodiment, and hence a movement limit T is a position where the push button 32 reaches a touch panel 4.

Further, a closed magnetic circuit is formed by the magnetic metal plates 58 in this embodiment, whereby there is also such an advantage that leakage magnetic fields from the movable side magnetic bodies 52 to the exterior are weakened.

<Third Embodiment>

Figure 17:
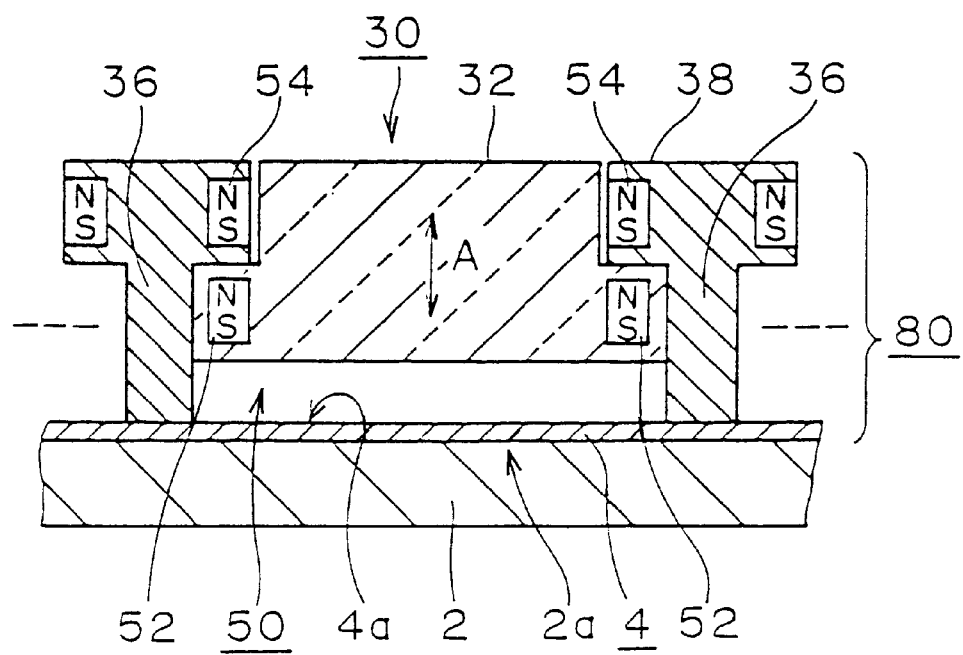
FIG. 17 and FIG. 18 are partial sectional views of still another embodiment of the present invention.

FIG. 17 is a sectional view partially showing an embodiment of a display panel with switches employing a thin type switch 80 having a touch panel of a resistor film type and a push button of a translation type, which can provide stroke feeling and click feeling.

In this embodiment of FIG. 17, return means 50 utilizes attractive force between permanent magnets, and comprises fixed side magnetic bodies 54 which are provided on an upper part in a support frame 36, more concretely in its extension part 38, so that magnetic poles are vertically positioned, and movable side magnetic bodies 52 which are provided in a marginal part of a push button 32 in portions located under the fixed side magnetic bodies 54 and opposed to the fixed side magnetic bodies 54 in reverse polarity for attracting each other. Thus, such arrangement relation is attained that the fixed side magnetic bodies 54 are upward beyond the movable side magnetic bodies 52 when the push button 32 is in a reference position. However, both magnetic bodies 52 and 54 may be so provided that the magnetic poles thereof are not vertically hut horizontally positioned. In this case, both magnetic bodies 52 and 54 may be at the same level, or the fixed side magnetic bodies 54 may be arranged upward beyond the movable side magnetic bodies 52 in case where the push button 32 is present in the reference position.

In this embodiment, the movable side magnetic bodies 52 and the fixed side magnetic bodies 54 strongly attract each other at an ordinary time, and the push button 32 does not go down unless the same is strongly pushed down at a certain degree at first in case of pushing down the push button 32 while pushdown is suddenly lightened when the same goes down a little since the mutual attractive force of both magnetic bodies 52 and 54 is suddenly weakened. Namely, click feeling can also be attained in addition to stroke feeling. When the pushdown is stopped, the push button 32 returns by the attractive force of both magnetic bodies 52 and 54.

Further, magnets are employed in both of the fixed sides and the movable sides in this embodiment, whereby larger click feeling and larger return force than the case of the embodiment of FIG. 15 can be attained.

<1-1B. Switch with no Click Feeling>

Figure 18:
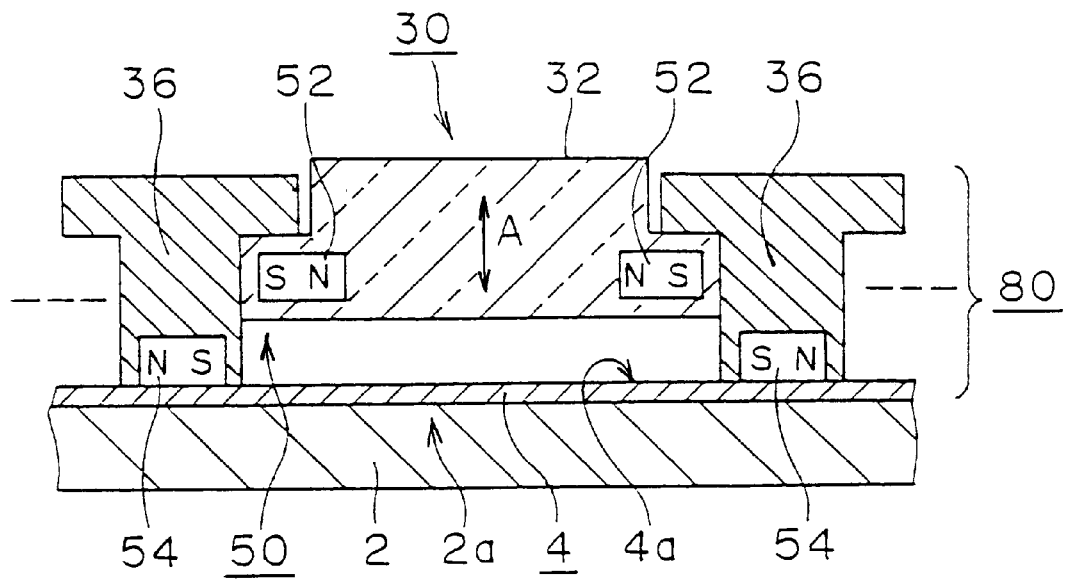

FIG. 18 is a sectional view partially showing an embodiment of a display panel with switches employing a thin type switch 80 having a touch panel of a resistor film type and a push button of a translation type, which can provide stroke feeling.

In this embodiment of FIG. 18, return means 50 comprises movable side magnetic bodies 52 which are provided in a marginal part of a push button 32 so that magnetic poles thereof are horizontally positioned, and fixed side magnetic bodies 54 which are provided in a base portion of a support frame 36 so that magnetic poles thereof are horizontally provided, to be opposed to and repel with the movable side magnetic bodies 52 in the same polarity in the interior and the exterior when the push button 32 is pushed down.

While no click feeling can be attained in this embodiment since repulsion between magnets is merely utilized, a high of touch can be attained in addition to stroke feeling, since the repulsion between both magnetic substances 52 and 54 is strengthened as the push button 32 is pushed down.

Further, the thicknesses of the magnet portions can be made small since the magnetic poles of both magnetic bodies 52 and 54 are transversely positioned, whereby further thinning of the thin type switch 80 as well as the overall display panel with switches is enabled as the result.

Figure 19:
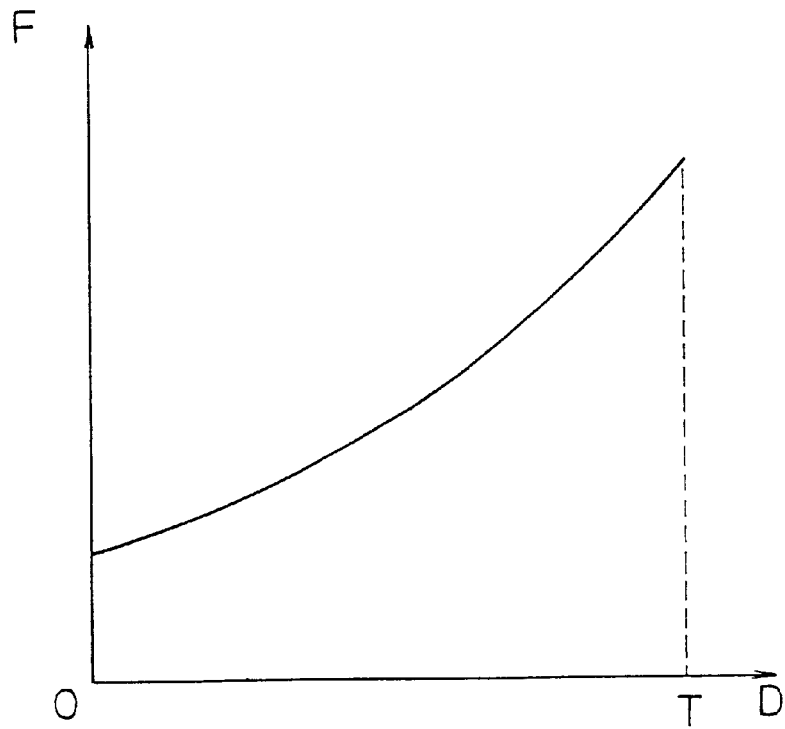
FIG. 19 is a graph showing change of return force in the structure of FIG. 18.

Change of return force F which is responsive to a movement distance D of the push button 32 in case of this embodiment is as shown in a graph of FIG. 19. In this case, the return force F increases when the movement distance D increases, while the return force F has positive values in all sections 0 to T of movement.

<Fourth Embodiment>

Figure 20:
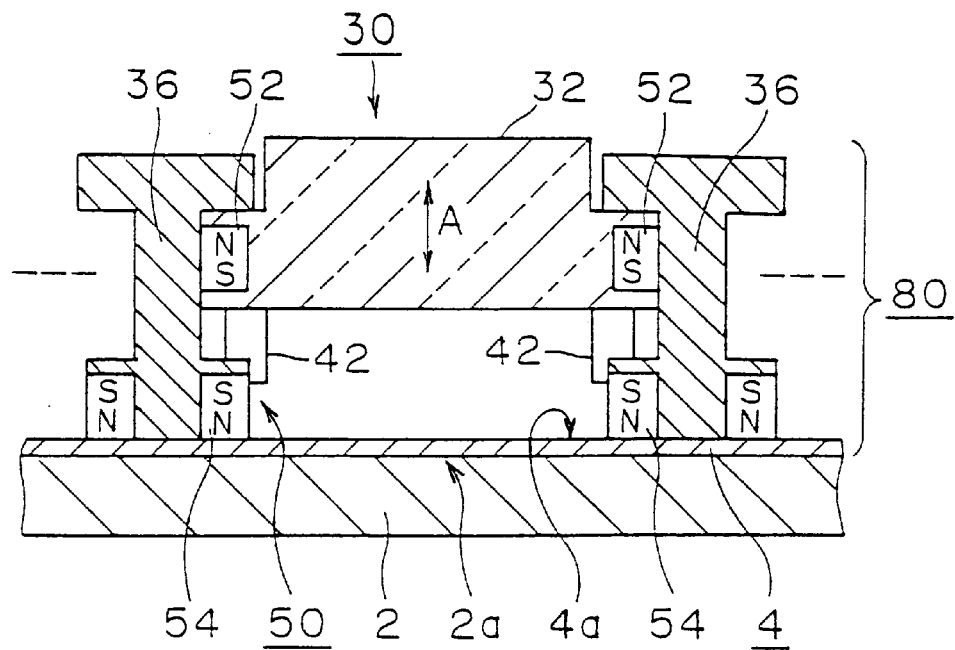
FIG. 20 to FIG. 22 are partial sectional views of further embodiments of the present invention.

FIG. 20 is a sectional view partially showing an embodiment of a display panel with switches employing a thin type switch 80 having a touch panel of a resistor film type and a push button of a translation type, which can provide stroke feeling.

In this embodiment of FIG. 20, return means 50 comprises movable side magnetic bodies 52 which are provided in a marginal part of a push button 32 so that magnetic poles thereof are vertically positioned, and fixed side magnetic bodies 54 which are provided in a base portion of a support frame 36 so that magnetic poles thereof are vertically provided, to be vertically opposed to and repel with the movable side magnetic bodies 52 in the same polarity when the push button 32 is pushed down. Leg portions 42 for pushing a switch part 4a of a touch panel 4 are projected in a lower part of the marginal part of the push button 32.

While no click feeling can be attained in this embodiment either since repulsion between magnets is merely utilized, a high sense of touch can be attained in addition to stroke feeling, since the repulsion between both magnetic substances 52 and 54 is strengthened as the push button 32 is pushed down.

<Fifth Embodiment>

Figure 21:
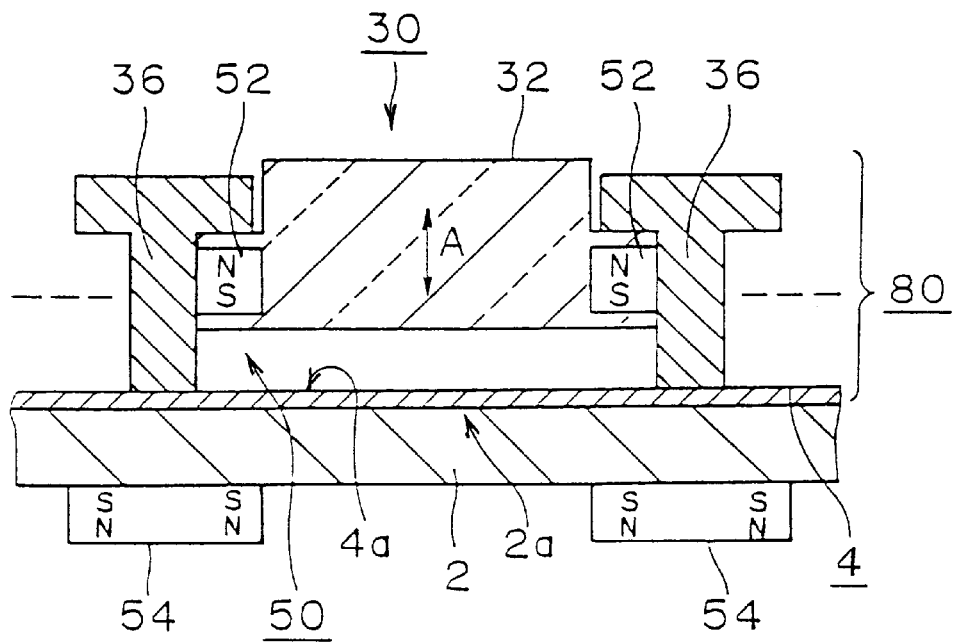

FIG. 21 is a sectional view partially showing an embodiment of a display panel with switches employing a thin type switch 80 having a touch panel of a resistor film type and a push button of a translation type, which can provide stroke feeling.

In this embodiment of FIG. 21, return means 50 comprises movable side magnetic bodies 52 which are provided in a marginal part of a push button 32 so that magnetic poles are vertically positioned, and fixed side magnetic bodies 54 which are provided in a rear surface portion of a display panel 2 to be opposed to and repel with the movable side magnetic bodies 52 in the same polarity when the push button 32 is pushed down.

While the fixed side magnetic bodies 54 are made long sideways so that the same can be used with an adjacent operation part 30 in common, separate fixed side magnetic bodies 54 may alternatively be provided for each operation part 30.

In this embodiment, no click feeling can be attained since repulsion between magnets is merely utilized, while a high sense of touch can be attained in addition to stroke feeling since the repulsion between both magnetic bodies 52 and 54 is strengthened as the push button 32 is pushed down. Since the thickness of the display panel 2 is generally thin, about 3 mm at the most when the same is a liquid crystal display, for example, sufficient repulsion can be attained also when both magnetic bodies 52 and 54 are opposed to each other through the display panel 2.

In this embodiment, further, the fixed side magnetic bodies 54 may be attached to the rear surface of the display panel 2, whereby the structure and assembling are simplified as compared with the case of arranging the same between the push button 32 and the touch panel 4 or in a support frame 36.

In addition, high density arrangement of the operation part 30 is enabled since it is not necessary to provide the fixed side magnetic bodies 54 in the support frame 36 and the width of the support frame 36 can be made small.

<1-1C. Switch Having Click Feeling: Non-Exposure of Support Frame>

Embodiments of FIG. 22 to FIG. 27 are such embodiments that support frames 36 are positioned under marginal parts 34 of push buttons 32 (in other words, hidden behind the marginal parts 34). In these embodiments, upper surfaces of the push buttons 32 are in higher positions than upper surfaces of the support frames 36, and the upper surfaces of the respective push buttons 32 are adjacent to each other and continuously in series with each other.

Figure 23:
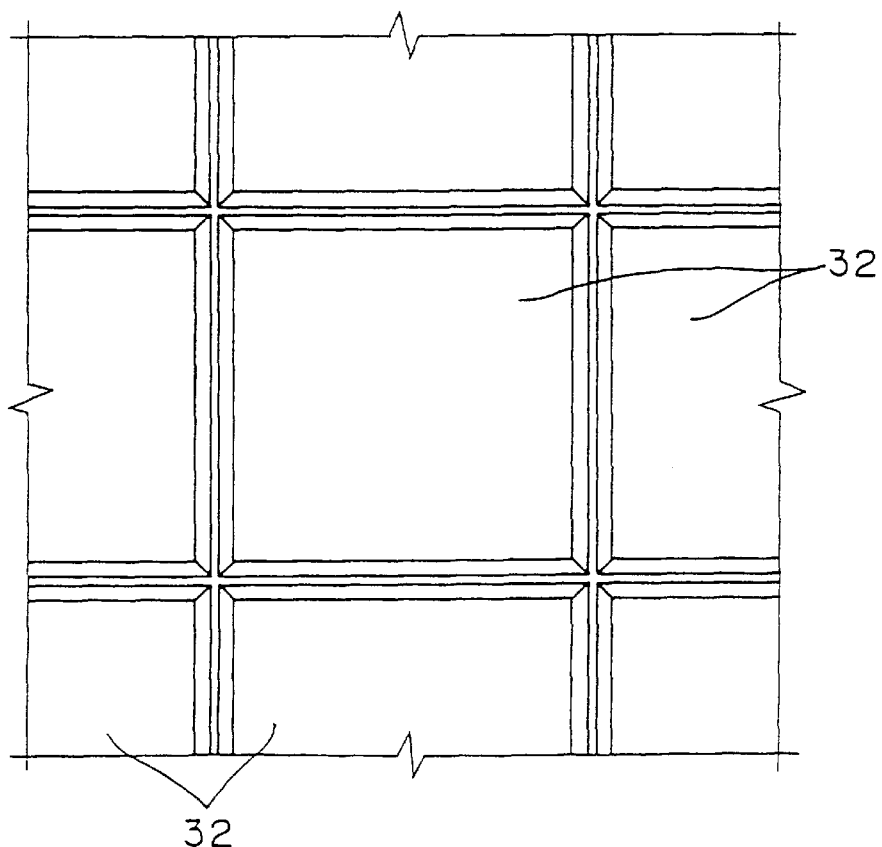
FIG. 23 is a plan view of the structure of FIG. 22.

Thus, the support frames 36 do not appear on surfaces as a plan view is shown in FIG. 23, whereby the surfaces are extremely neat and the appearances are improved.

Further, the push buttons 32 can be made large, whereby target push buttons 32 can be readily pushed with no errors, and operability is improved.

Or, respective operation parts 30 can be arranged to be approached to each other due to no hindrance by the support frames 36, whereby high density arrangement thereof is enabled.

The independent embodiments are now described mainly with reference to differences between the same and the precedent embodiments.

<Sixth Embodiment>

Figure 22:
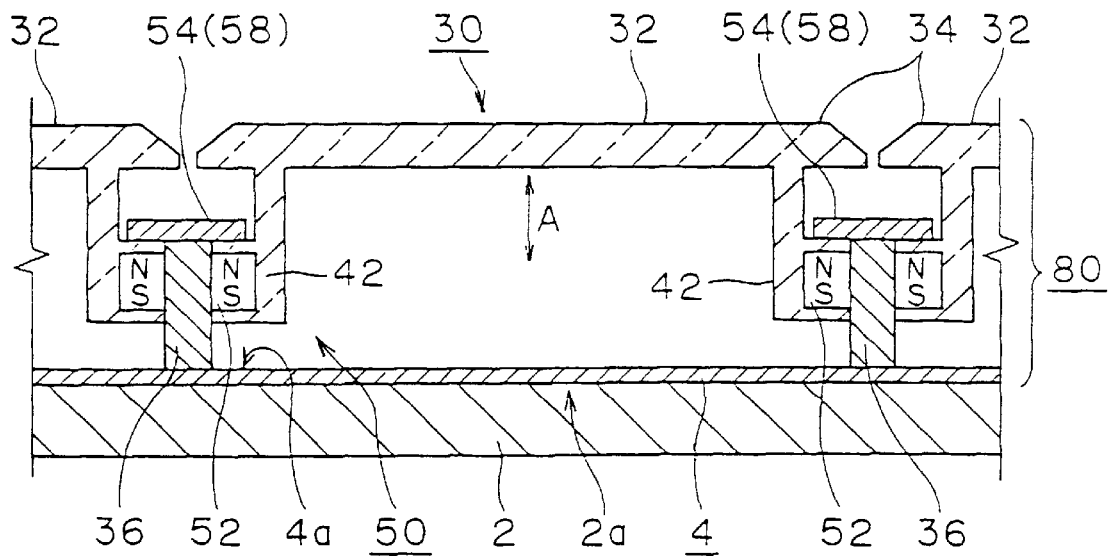

FIG. 22 is a sectional view partially showing an embodiment of a display panel with switches employing a thin type switch 80 having a touch panel of a resistor film type and a push button of a translation type, which can provide stroke feeling and click feeling.

This embodiment of FIG. 22 has return means 50 of the same idea as the embodiment of FIG. 15. However, movable side magnetic bodies 52 forming this return means 50 are provided in lower portions of leg portions 42 downwardly projecting from push buttons 32, while magnetic metal plates 58 are provided on upper parts of support frames 36 which are positioned behind the push buttons 32. It is possible to push a corresponding switch part 4a of a touch panel 4 by the leg portions 42 for turning on the same. Function/effect in this return means 50 is similar to the case of the embodiment of FIG. 15.

Figure 24:
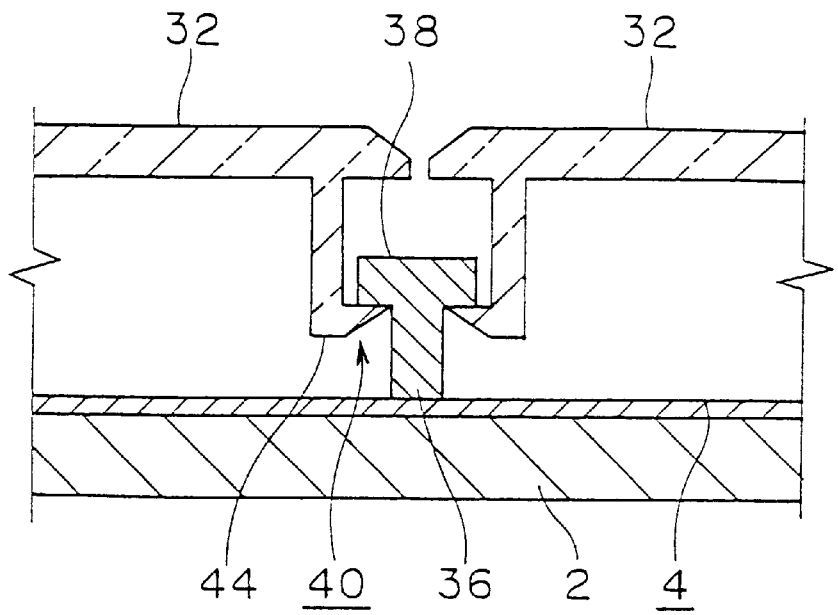
FIG. 24 to FIG. 28 are partial sectional views of further embodiments of the present invention.

In this embodiment, further, hook portions 44 downwardly projecting from the marginal parts of the push buttons 32 and an extension part 38 provided on an upper part of the support frame 36 engage with each other, to form engaging parts 40 for preventing displacement of the push buttons 32, as in the example shown in FIG. 24. In the embodiment of FIG. 22, however, the leg portions 42 of the push buttons 32 and the magnetic metal plates 58 can also serve as engaging parts for preventing displacement of the push buttons 32, and hence the aforementioned engaging parts 40 may not dare be provided. The aforementioned engaging parts 40 are provided in embodiments of FIG. 25 to FIG. 27. These hook portions 44 and the aforementioned leg portions 42, i.e., the engaging parts 40 and the return means 50, are provided in positions not interfering with each other. For example, the engaging parts 40 are provided on four corners of the marginal parts of the push buttons 32 respectively, while the return means 50 are provided in portions around central portions of four sides excluding the four corners of the marginal parts of the push buttons 32.

Figure 25:
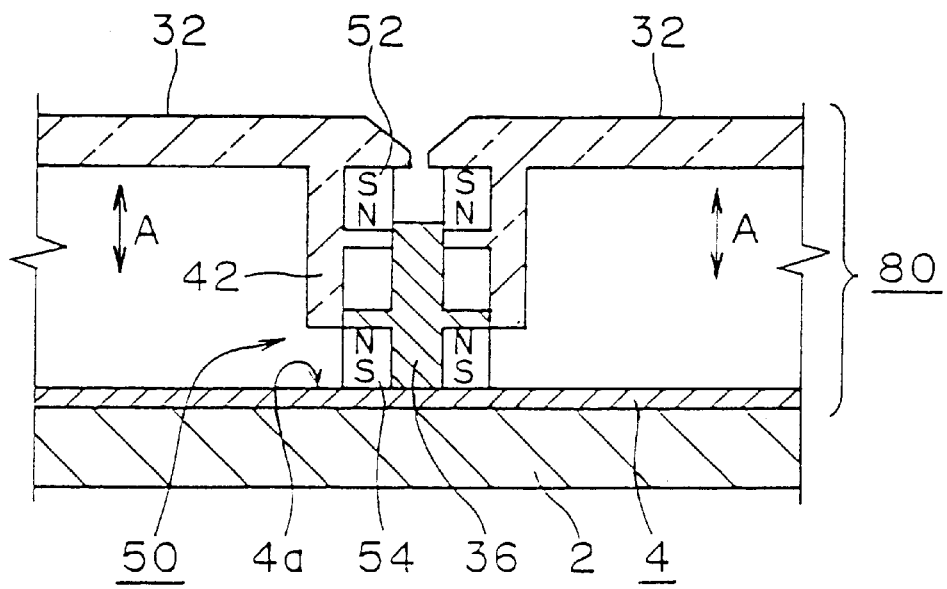

Also in the embodiments of FIG. 22 and FIG. 25 to FIG. 7, convex lens portions may be provided in the interior of the push buttons 32 or on lower surface portions thereof, and the aforementioned effects can be attained in this case FIG. 14 shows an example thereof. However, the convex lens portion 70 may be slightly depressed as shown in FIG. 12, or may project as shown in FIG. 13.

<Seventh Embodiment>

FIG. 25 is a sectional view partially showing an embodiment of a display panel with switches employing a thin type switch 80 having a touch panel of a resistor film type and a push button of a translation type, which can provide stroke feeling.

This embodiment of FIG. 25 has return means 50 of the same idea as the embodiment of FIG. 20. However, movable side magnetic bodies 52 forming this return means 50 are provided in base portions of leg portions 42. It is possible to push a corresponding switch part 4a of a touch panel 4 by the leg portions 42 for turning on the same. Function/effect in this return means 50 is similar to the case of the embodiment of FIG. 20.

<Eighth Embodiment>

Figure 26:
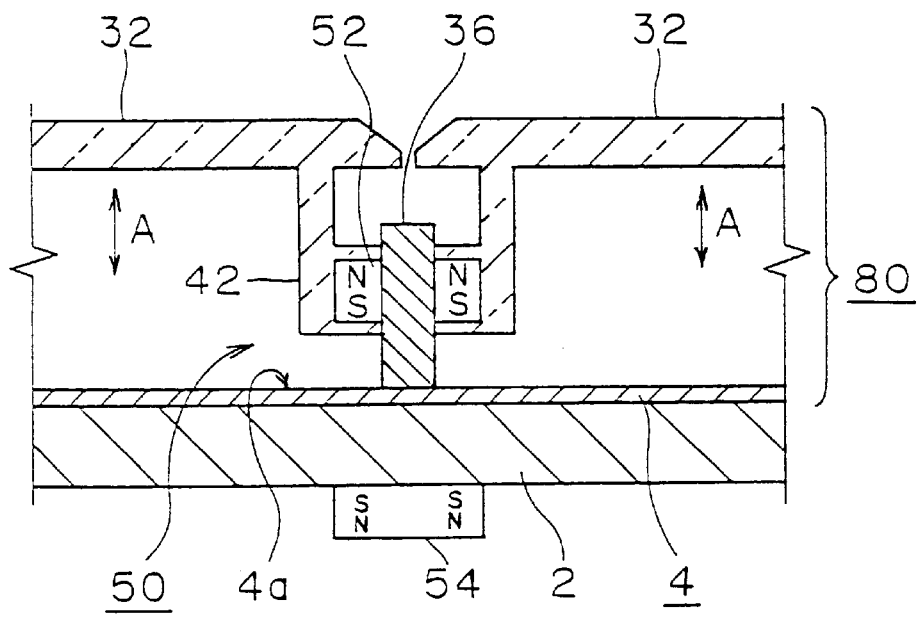

FIG. 26 is a sectional view partially showing an embodiment of a display panel with switches employing a thin type switch 80 having a touch panel of a resistor film type and a push button of a translation type, which can provide stroke feeling.

This embodiment of FIG. 26 has return means 50 of the same idea as the embodiment of FIG. 21. However, movable side magnetic bodies 52 forming this return means 50 are provided in lower portions of leg portions 42. It is possible to push a corresponding switch part 4a of a touch panel 4 by the leg portions 42 for turning on the same. Function/effect in this return means 50 is similar to the case of the embodiment of FIG. 21.

<Ninth Embodiment>

Figure 27:
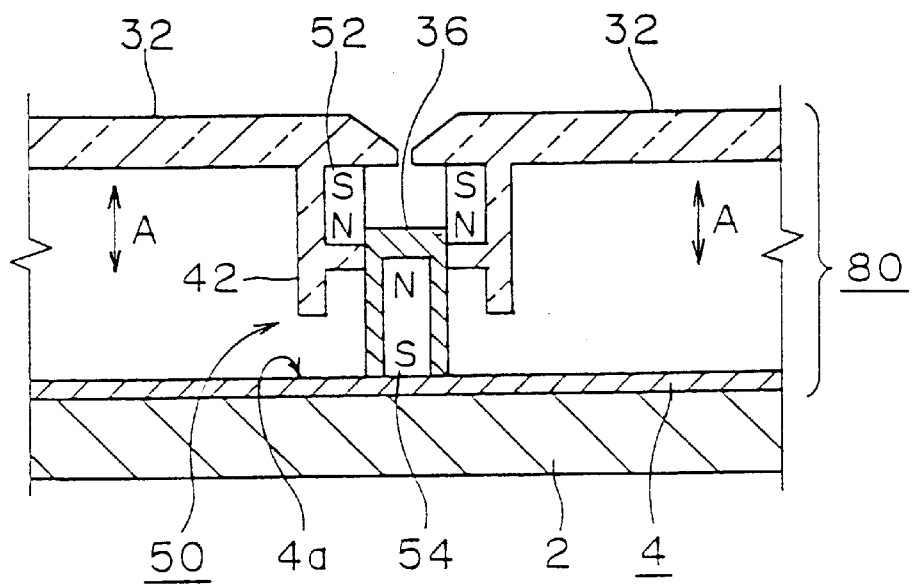

FIG. 27 is a sectional view partially showing an embodiment of a display panel with switches employing a thin type switch 80 having a touch panel of a resistor film type and a push button of a translation type, which can provide stroke feeling and click feeling.

This embodiment of FIG. 27 has return means 50 of the same idea as the embodiment of FIG. 7. However, movable side magnetic bodies 52 forming this return means 50 are provided in base portions of leg portions 42. It is possible to push a corresponding switch part 4a of a touch panel 4 by the leg portions 42 for turning on the same. Function/effect in this return means 50 is similar to the case of the embodiment of FIG. 7. When lower portions of the leg portions 42 are downwardly extended as in this embodiment, no spacer 56 is required dissimilarly to the embodiment of FIG. 7.

<1-2. Stroke Feeling: Rotation System>
<1-2A. Device with Click Feeling>

<Tenth Embodiment>

Figure 28:
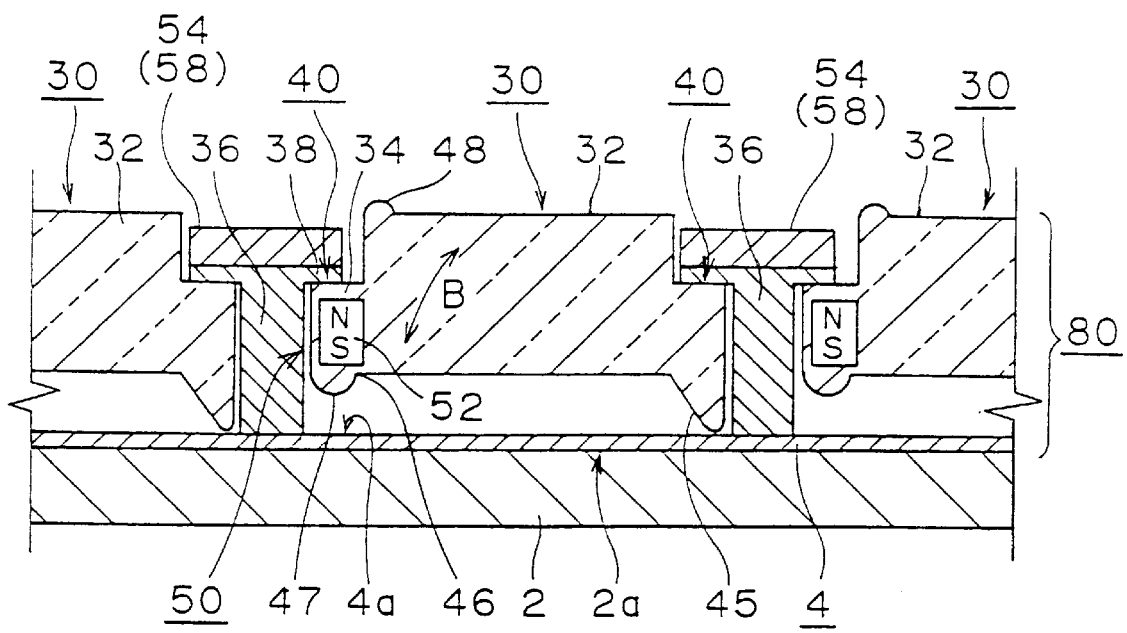
Figure 29:
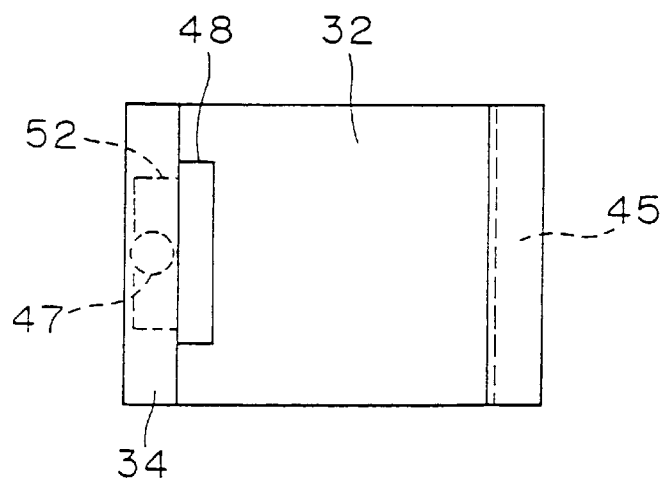
FIG. 29 and FIG. 30 are plan views of push button switches.

FIG. 28 is a sectional view partially showing an embodiment of a display panel with switches employing a thin type switch 80 whose touch panel is of a resistor film type. FIG. 29 is a plan view of a push button in FIG. 28.

The thin type switch 80 in this embodiment comprises a touch panel 4 of the aforementioned resistor film type which is superposed on a display panel 2 and provided between transparent thin plates with at least one transparent switch part 4a which is turned on by being lightly pushed from the exterior, and at least one operation part 30 which is provided on the switch part 4a of this touch panel 4.

Each operation part 30 comprises a transparent push button 32 having a fulcrum projection 45 on its lower surface part and is rotatable about a forward end portion of this fulcrum projection 45 in a press direction with a constant stroke as shown by arrow B for pushing and turning on the corresponding switch part 4a of the touch panel 4 by an operation forward end portion 46 which is positioned on a lower surface part in a portion separated from the fulcrum projection 45, and return means 50 which is provided in a portion around an end portion separated from the fulcrum projection 45 of this push button 32 for supplying return force to the push button 32 while providing click feeling. Further, each operation part 30 comprises a support frame 36 which is provided around the exterior of an end portion of the push button 32, and an engaging part 40 in which this support frame 36 and a member connected thereto and the end portion of the push button 32 or a member connected thereto engage with each other to prevent displacement of the push button 32 respectively in this embodiment.

A display region 2a for displaying a content selected by operation of the push button 32 is formed on the display panel 2 around a lower portion of the push button 32 in this embodiment. Therefore, selection operation of a desired push button 32 is made easy.

While plane shapes of the display region 2a of the display panel 2 and the push button 32 are arbitrary, the display region 2a of the display panel 2 has a square shape in this embodiment as an example, and the push button 32 also has a square shape which is substantially identical in size to the display region 2a in correspondence thereto (see FIG. 29).

The fulcrum projection 45 is provided around an end of the push button 32 in this embodiment also with reference to FIG. 28, on a lower surface portion of one side of the push button 32 along the side in the form of an elongated stripe in more concrete terms, while the said operation forward end portion 46 is present around an end portion on a side opposite thereto, on a lower surface portion of a side opposite to the fulcrum projection 45 in more concrete terms. Namely, the lower surface portion of the push button 32 on the side opposite to the fulcrum projection 45 becomes the operation forward end portion 46 for pushing and turning on the switch part 4a of the touch panel 4.

Further in this embodiment, an operation projection 47 for pressing/operating the switch part 4a of the touch panel 4 is provided on this operation forward end portion 46, to downwardly project. As to this operation projection 47, a single semispherical one is provided in this embodiment, while the shape, the number etc. of this operation projection 47 are not restricted to these. For example, a plurality of operation projections 47 may be aligned with each other along the aforementioned side of the push button 32, or a plurality of ones may be integrated in the form of a triangle, a square or a circle. Further, the shape of the operation projection 47 may be columnar, or in the form of a stripe having a larger width than the columnar form. Such operation projections 47 can also be provided in the already described embodiments of the translation type switches.

The switch part 4a of the touch panel 4 may be provided under such an operation projection 47, or under the aforementioned operation forward end portion 46 when no operation projection 47 is provided. This also applies to other embodiments hereinafter described.

While the fulcrum projection 45 of the push button 32 is generally positioned on a non-switch part of the touch panel 4, the same may be positioned on a switch part if this switch part is not used. This nonused switch part is independent of the aforementioned switch part 4a which is an operation target by the push button 32, as a matter of course.

While it is not indispensable to provide the aforementioned operation projection 47 on the operation forward end portion 46 of the push button 32, the target switch part 4a of the touch panel 4 can be reliably pressed/operated with small force by this operation projection 47 when the same is provided, whereby reliability of the switching operation is improved.

A stripe mark projection 48 serving as a mark of a press operation is provided in this embodiment on an upper surface of the push button 32 around an upper part of the operation forward end portion 46. While this mark projection 48 is not indispensable, an operable part of the push button 32 is easy to find if the same is provided, whereby the press operation of the push button 32 is simplified.

The aforementioned operation projection 47 and the mark projection 48 may be provided also in the embodiments other than FIG. 28, as a matter of course. While the operation forward end portions 46 of the push buttons 32 are illustrated as coming to left sides in all embodiments for convenience of illustration, operability is rather improved when the thin type switch 80 is so arranged that the operation forward end portion 46 comes to a lower side or an operator side in actual use.

The return means 50 is provided around an end portion which is opposite to the fulcrum projection 45 of the push button 32, i.e., around a side on the same side as the aforementioned operation forward end portion 46 in this embodiment. This return means 50 utilizes attractive force between a permanent magnet and a magnetic body in this embodiment, and comprises a magnetic metal plate 58 serving as a fixed side magnetic body 54 which is provided on an upper portion of the support frame 36, and a fixed side magnetic body 52 which is provided in a portion under this magnetic metal plate 58 on an end portion opposite to the fulcrum projection 45 of the push button 32 for attracting the magnetic metal plate 58. The magnetic metal plate 58 consists of a ferromagnetic metal, and is an iron plate, for example.

The movable side magnetic body 52 is a permanent magnet, for example. A part of this movable side magnetic body 52 may be exposed from the push button 32, dissimilarly to the example shown in FIG. 28. A part of the fixed side magnetic body 54 described later may also be exposed from the support frame 36. These also apply to other embodiments.

An exemplary plane arrangement of the movable side magnetic body 52 is shown in FIG. 29. This movable side magnetic body 52 may be provided on the overall opposite side of the fulcrum projection 45, may be provided on a part around the central portion of this side as in this example, or may be provided around both side end portions of this side. Which is selected may be decided in response to necessary absorption force etc. between this movable side magnetic body 52 and the magnetic metal plate 58. In any case, the counter magnetic metal plate 58 is provided above this movable side magnetic body 52.

The engaging part 40 has such a structure that the end portion 34 of the push button 32 and the extension part 38 of the support frame 36 engage with each other to prevent displacement of the push button 32 in this embodiment. However, the magnetic metal plate 58 may be directly provided on the upper end portion of the support frame 36 without providing the extension part 38, for forming the engaging part 40 by this magnetic metal plate 58 and the end portion 34 of the push button 32.

The support frame 36 is adapted to perform supporting of the aforementioned magnetic metal plate 58 or the fixed side magnetic body 54 as described later or formation of the engaging part 40, and may be provided to enclose the periphery of the push button 32, or may be provided only on opposite two sides of the push button 32, outside a side on the fulcrum projection 45 side and all opposite side, in more concrete terms.

Describing operations of the embodiment of FIG. 28, the movable side magnetic body 52 strongly attracts the magnetic metal plate 58 at an ordinary time, whereby the operation forward end portion 46 side of the push button 32 is raised up by the force. However, the push button 32 will not get out (jump out), due to the presence of the engaging part 40.

When the push button 32 is pushed against absorption force of the movable side magnetic body 52, this push button 32 rotates about its fulcrum projection 45 in the direction of arrow B (anticlockwise direction in more concrete terms) with a constant stroke, and the switch part 4a of the touch panel 4 can be pushed and turned on with its operation projection 47.

In this case, the push button 32 does not rotate unless the push button 32 is strongly pushed to some extent at first since the movable side magnetic body 52 strongly attracts the magnetic metal plate 58, while the force of the movable side magnetic body 52 attracting the magnetic metal plate 58 is suddenly weakened when the push button 32 rotates a little, whereby click feeling can be attained.

When pushing of the push button 32 is stopped, the push button 32 returns by the force of the movable side magnetic body 52 attracting the magnetic metal plate 58. On the other hand, the switch part 4a of the touch panel 4 returns on its own and is turned off. An effect by the fact that stroke feeling and click feeling are attained is similar to the translation type switching device of FIG. 7 or the like. Change of return force following movement of the push button 32 is similar to the graph of FIG. 16.

In this embodiment, the magnet may be only the movable side magnetic body 52 while the fixed side may be the magnetic metal plate 58 which is at a lower cost than the magnet, whereby cost reduction can be attained as compared with the embodiments providing magnets also on the fixed sides. Further, a closed magnetic circuit is formed by the magnetic metal plate 58, whereby there is also such an advantage that a leakage magnetic field from the movable side magnetic body 52 the exterior is weakened.

The fulcrum projection 45 may be that other than the one stripe type one shown in FIG. 29. For example, a plurality of dot-shaped or short stripe-shaped fulcrum projections 45 may be linearly arranged.

Figure 30:
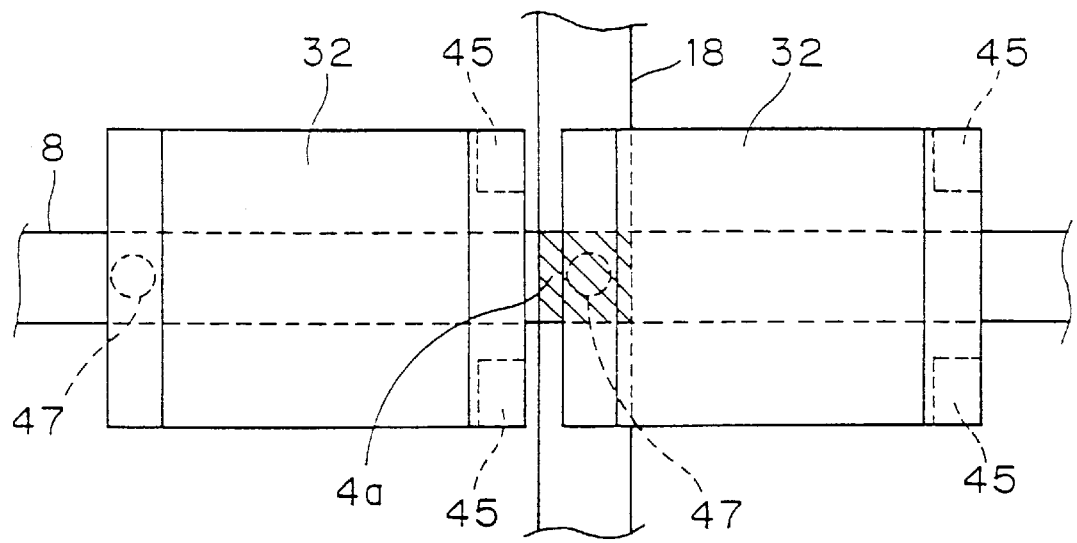

As in an example shown in FIG. 30, two short stripe-shaped fulcrum projections 45 and 45 may be provided in a line with a space around an end portion of a push button 32, around both side portions of this end portion in more concrete terms, so that the said operation projection 47 is provided around an end of an opposite in a portion located between the two fulcrum projections 45 and 45, i.e., around a central portion of the opposite side.

A switch part 4a of a touch panel 4 is generally formed on an intersection of transparent electrodes 8 and 18 (see FIG. 1) which are orthogonal to each other as shown in a hatched manner in FIG. 30, and a space between fulcrum projections 45 of one push button 32 and the switch part 4a operated by the adjacent push button 32 can be more largely taken than the case of one strip fulcrum projection 45 when the structures arrangement of the fulcrum projections and the operation projection 47 are set in the aforementioned manner also when a plurality of operation parts 30 of the same structures are arranged, whereby a possibility of such a malfunction that the adjacent switch part 4a is erroneously turned on can be made further small even if integration density of the operation part 30 is improved.

The aforementioned fulcrum projection 45 may not necessarily be provided on an end portion of the push button 32, but may be provided on both side portions around the central portion of the push button 32. Both side portions are employed in order to prevent the fulcrum projection 45 from making display on a display panel 2 inconspicuous, by avoiding the central portion. Also in this case, the aforementioned operation forward end portion 46 for pushing and turning on the switch part 4a of the touch panel 4 is present around an end portion of the push button 32 separated from the fulcrum projection 45. It is general to provide the return means 50 around an end on the same side as this operation forward end portion 46, while the same may be provided around an end portion on an opposite side to this operation forward end portion 46.

Figure 31:
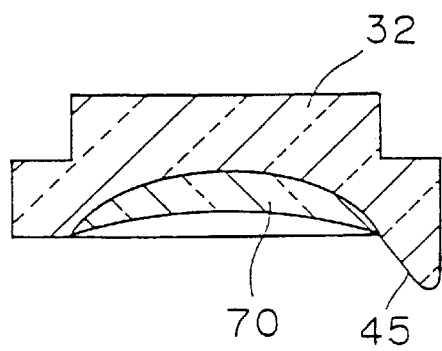
FIG. 31 is a sectional view showing another example of the push button.

In case of combination with the display panel 2, a convex lens portion 70 may be provided in the interior or on a lower surface of the push button 32, as in an example shown in FIG. 31, for example. In this case, the display region 2a of the display panel 2 is generally positioned in the focal distance of this convex lens portion 70. When such a convex lens portion 70 is provided, it is possible to display the display content of the display panel 2 under the same in an enlarged manner, in a floating manner in other words, whereby the display content of the display panel 2 can be made further conspicuous.

When the convex lens portion 70 is provided not in a space between the push button 32 and the display panel 2 but in the interior or on the lower surface of the push button 32, further, no excessive space is taken and hence it is possible to prevent the overall thickness of the display panel with switches from increasing even if the convex lens portion 70 is provided.

The lower surface of the convex lens portion 70 may be slightly depressed as in the example shown in FIG. 31, may be a flat surface, or may be downwardly projected from the lower surface of the push button 32.

It is possible to form the push button 32 having the aforementioned convex lens portion 70 by double-molding or fitting the convex lens portion 70 consisting of transparent resin having a relatively large refractive index in the push button 32 consisting of transparent resin having a relatively small refractive index, for example.

The aforementioned convex lens portion 70 can be applied to other embodiments described later as a matter of course, and function/effect similar to the aforementioned one can be attained. The convex lens portion 70 may be a Fresnel lens making a convex lens function.

<Eleventh Embodiment>

Figure 32:
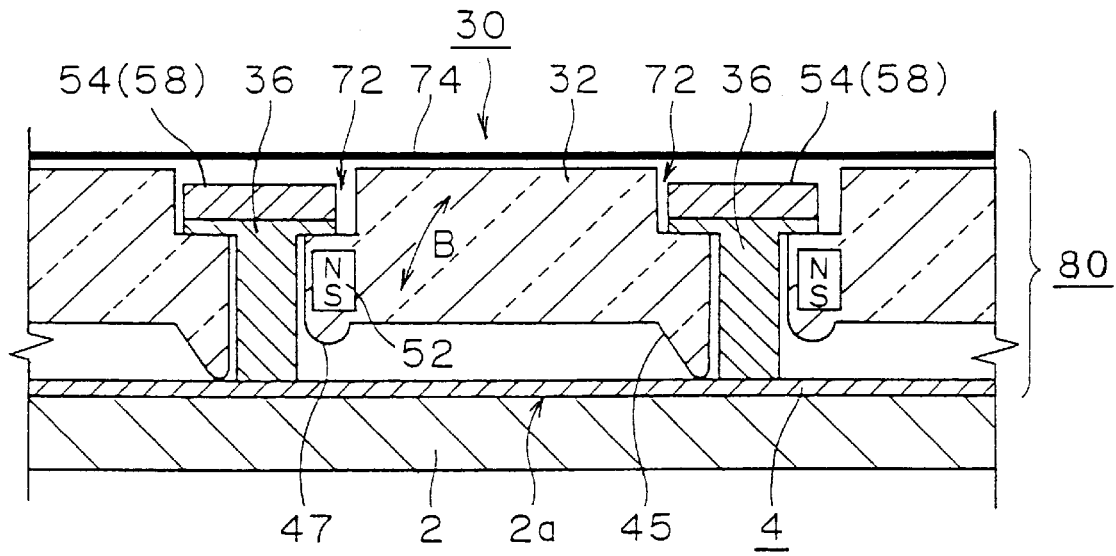
FIG. 32 to FIG. 46 are partial sectional views of a further embodiment of the present invention.

As in an embodiment shown in FIG. 32, at least upper surface portions of push buttons 32 and clearances 72 which are present around the push buttons 32, more briefly the whole of upper surfaces of a plurality of lined up operation parts 30, may be covered with a transparent thin sheet 74 having flexibility. Function/effect of this sheet 74 is similar to that described in FIG. 7.

<Twelfth Embodiment>

In an embodiment of FIG. 32, return means 50 utilizes a combination of repulsion and attractive force between permanent magnets, and comprises a movable side magnetic body 52 which is provided in an end portion opposite to a fulcrum projection 45 of a push button 32 so that its magnetic pole is vertically positioned, and fixed side magnetic bodies 54 which are provided in base portions of support frames 36 in positions opposed to the movable side magnetic body 52 in the interior and the exterior so that magnetic poles thereof are partially vertically opposed to the movable side magnetic body 52 in reverse polarity when the push button 32 is pushed down. The fixed side magnetic bodies 54 are permanent magnets, for example. The polarity states of the movable side magnetic body 52 and the fixed side magnetic bodies 54 may be entirely reverse to the illustrated examples. These facts are similar also in other embodiments.

In this embodiment, both magnetic bodies 52 and 54 are opposed to each other in reverse polarity at an ordinary time, whereby the push button 32 is pushed up by repulsion between both magnetic bodies 52 and 54. When the push button 32 is pushed down, the repulsion further increases at first since the distance between both magnetic bodies 52 and 54 reduces, while the magnetic poles of opposite polarity states of both magnetic bodies 52 and 54 approach to each other and attractive force starts to act when a certain region is passed (when pushed down in excess of a certain degree), whereby the repulsion between both magnetic bodies 52 and 54 suddenly reduces and the pushdown is abruptly lightened (made easy). Therefore, click feeling can also be attained in addition to stroke feeling. Change of return force in this embodiment is identical to that described in FIG. 10.

Even if the push button 32 is pushed down to the end, however, both magnetic bodies 52 and 54 are not completely opposed but the repulsion remains between both magnetic bodies 52 and 54 since the operation projection 47 is present. This repulsion may be present for at least making the push button 32 return. This repulsion can be readily adjusted by adjusting the height of the operation projection 47 or providing a spacer, for example. When pushdown of the push button 32 is stopped, therefore, the push button 32 returns due to the repulsion between both magnetic bodies 52 and 54.

<Thirteenth Embodiment>

Figure 34:
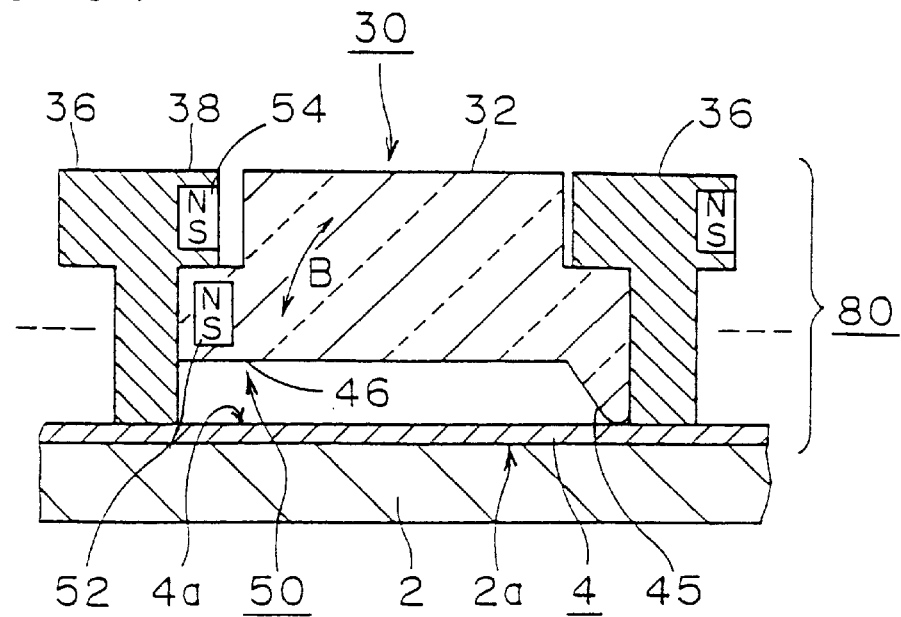

In an embodiment of FIG. 34, return means 50 utilizes attractive force between permanent magnets, and comprises a fixed side magnetic body 54 which is provided on an upper part in a support frame 36, in its extension part 38 in more concrete terms, so that its magnetic pole is vertically positioned, and a movable side magnetic body 52 which is provided in an end portion opposite to a fulcrum projection 45 of a push button 32 in a portion located under this fixed side magnetic body 54 for attracting the fixed side magnetic body 54 while being opposed thereto in reverse polarity. However, both magnetic bodies 52 and 54 may be so provided that the magnetic poles thereof are not vertically but horizontally positioned.

In this embodiment, both magnetic bodies 52 and 54 strongly attract each other at an ordinary time, and when the push button 32 is pushed down, the push button 32 does not go down unless the same is strongly pushed down to some extent at first, while the force of both magnetic bodies 52 and 54 attracting each other is suddenly weakened when the button 32 goes down a little, whereby the pushdown is abruptly lightened. Namely, click feeling can also be attained in addition to stroke feeling. When the pushdown is stopped, the push button 32 returns by the force of both magnetic bodies 52 and 54 attracting each other.

Further, magnetic bodies are employed in both of the fixed side and the movable side in this embodiment, whereby larger click feeling and higher return force than the case of the embodiment of FIG. 28 can be attained.

<Fourteenth Embodiment>

Then, another example of a fulcrum of rotation of a push button 32 is described.

Figure 35:
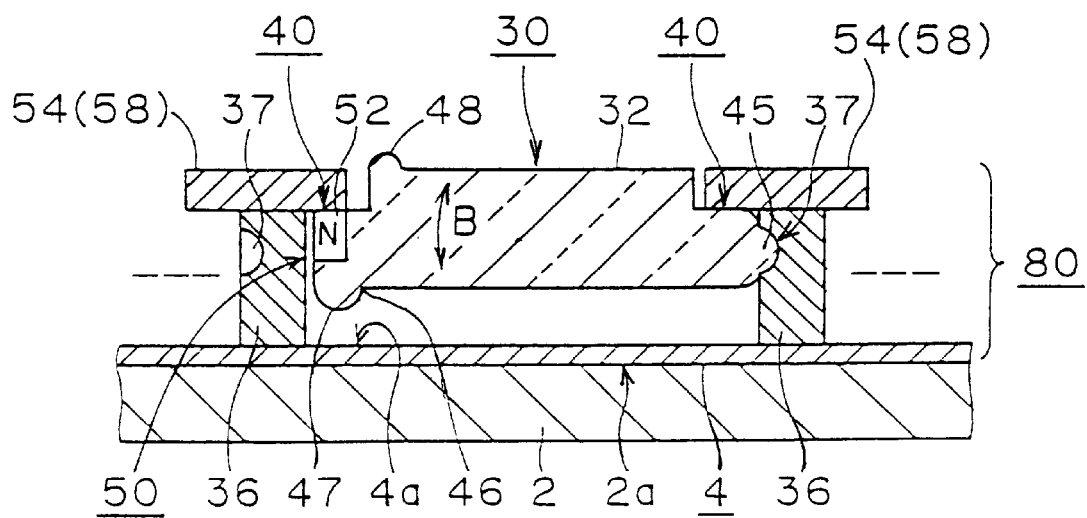

In an embodiment of FIG. 35, a fulcrum projection 45 is provided on one end surface portion of a push button 32 in place of providing the fulcrum projection 45 on the lower surface portion of the push button 32 dissimilarly to the aforementioned each embodiment, and this fulcrum projection 45 is rotatably fitted in a concave portion 37 which is provided in a support frame 36 opposed thereto. This fulcrum projection 45 and the concave portion 37 may be semicylindrical ones, or semicircular ones may be provided in plural. Return means 50 is of the same idea as the embodiment of FIG. 28. Also in case of this embodiment, it is possible to press/operate a switch part 4a of a touch panel 4 by rotating the push button 32 about the center of the fulcrum projection 45 as shown by arrow B in a press direction with a constant stroke. Function/effect in the return means 50 is similar to the case of the embodiment of FIG. 28.

<Fifteenth Embodiment>

Figure 36:
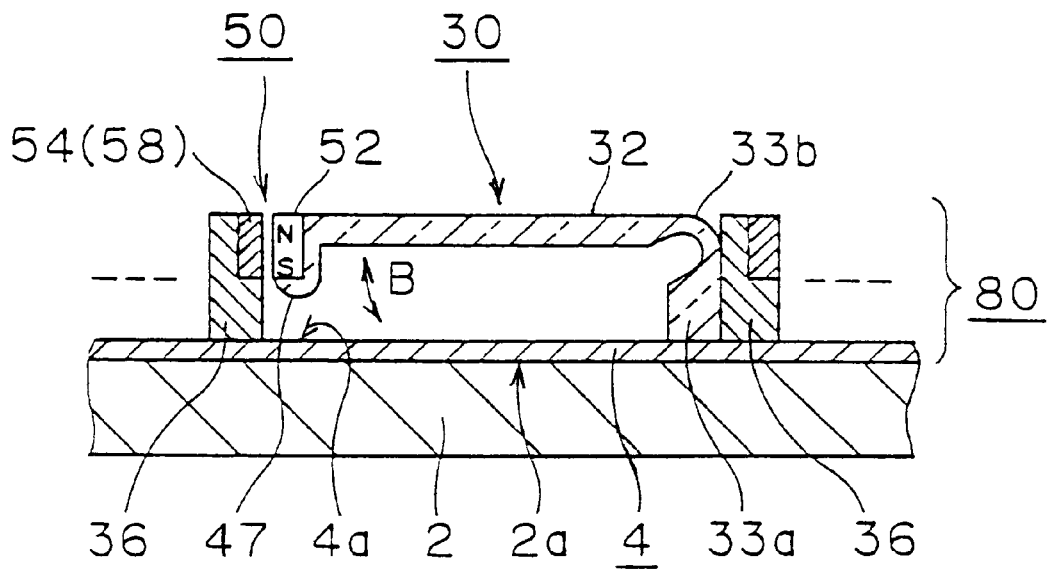

In an embodiment of FIG. 36, a push button 32 is integrated with a support part 33a through a hinge portion 33b having flexibility with a smaller thickness as compared with other portions so that its overall sectional shape is substantially L-shaped. The support part 33a is fixed to a support frame 36 by means such as adhesion. In this embodiment, therefore, the aforementioned engaging part 40 for preventing displacement of the push button 32 is unnecessary. Return means 50 is of the same idea as the embodiment of FIG. 28. In this embodiment, however a magnetic metal plate 58 is stood and provided in a side surface portion of the support frame 36 to be opposed to a fixed side magnetic body 52, so that the surface of the push button 32 and an upper surface of the support frame 36 are flush with each other.

When the push button 32 is pushed, the hinge part 33b is bent and the push button 32 rotates as shown by arrow B in a press direction with a constant stroke, whereby it is possible to press/operate a switch part 4a of a touch panel 4 by an operation projection 47. At this time, click feeling can also be attained in addition to stroke feeling by attractive force between a movable side magnetic body 52 and the magnetic metal plate 58, similarly to the case of the embodiment of FIG. 28. When pushdown of the push button 32 is stopped, the push button 32 returns to its original state due to attractive force between the movable side magnetic body 52 and the magnetic metal plate 58 and restoring force of the hinge part 33b.

In this embodiment of FIG. 36, the aforementioned fulcrum projection 45 and the engaging part 40 are unnecessary, whereby the structure of the operation part 30 can be further simplified while assembling is made easy.

<1-2B. Device with no Click Feeling>

<Sixteenth Embodiment>

Figure 37:
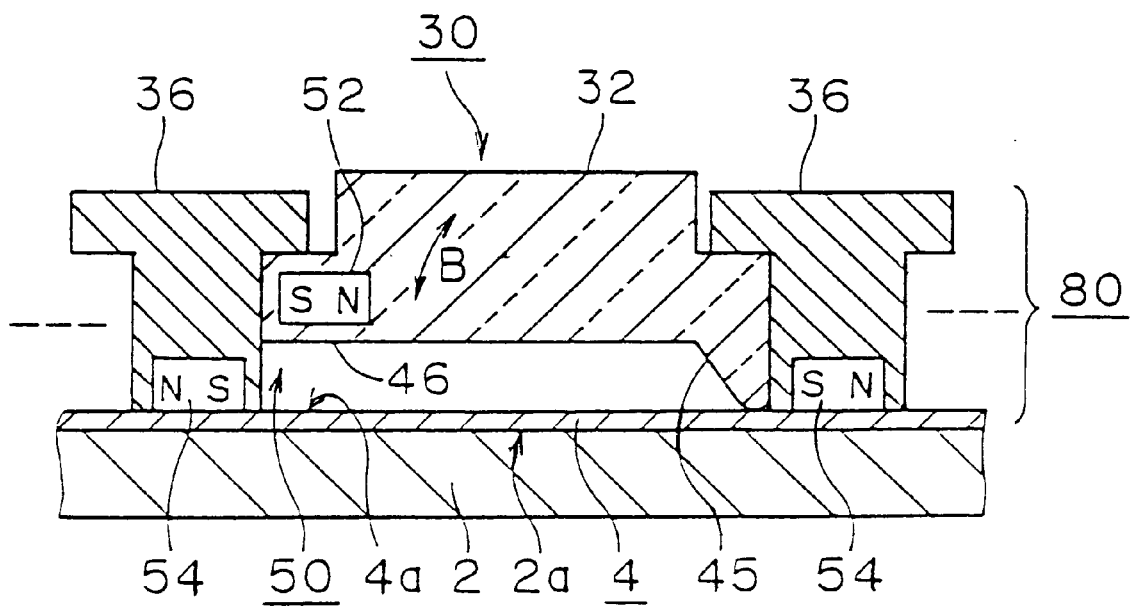

In an embodiment of FIG. 37, return means 50 comprises a movable side magnetic body 52 which is provided in an end portion opposite to a fulcrum projection 45 of a push button 32 so that its magnetic pole is horizontally positioned, and fixed side magnetic bodies 54 which are provided in base portions of support frames 36 so that magnetic poles thereof are horizontally positioned and opposed to and repel with the movable side magnetic body 52 in the same polarity when the push button 32 is pushed down.

Also in the case of this embodiment, repulsion between both magnetic bodies 52 and 54 is strengthened as the push button 32 is pushed down, whereby a high sense of touch can be attained in addition to stroke feeling.

Since the magnetic poles of both magnetic bodies 52 and 54 are transversely positioned, the thicknesses of the magnetic body portions can be made small. whereby further thinning of a thin type switch 80 as well as the overall display panel with switches is enabled.

<Seventeenth Embodiment>

Figure 38:
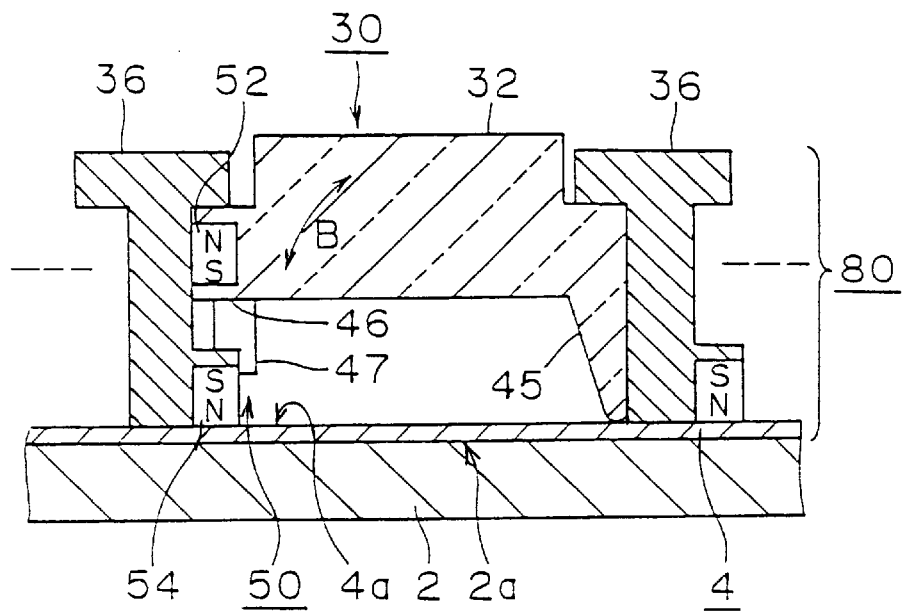

In an embodiment of FIG. 38, return means 50 utilizes repulsion between permanent magnets, and comprises a movable side magnetic body 52 which is provided in an end portion on an opposite side to a fulcrum projection 45 of a push button 32 so that its magnetic pole is vertically positioned, and fixed side magnetic bodies 54 which are provided in base portions of support frames 36 so that magnetic poles thereof are vertically positioned to be vertically opposed to and repel with the movable side magnetic body 52 in the same polarity when the push button 32 is pushed down. A columnar operation projection 47 for pushing a switch part 4a of a touch panel 4 is projected in an operation forward end portion 46 on the opposite side to the fulcrum projection 45 of the push button 32.

Also in the case of this embodiment, repulsion between both magnetic bodies 52 and 54 is strengthened as the push button 32 is pushed down, whereby a high sense of touch can be attained in addition to stroke feeling.

Further, the movable side magnetic body 52 may not be provided in the support frame 36, whereby the width of the support frame 36 can be made small and high density arrangement of an operation part 30 is enabled by this.

<Eighteenth Embodiment>

Figure 39:
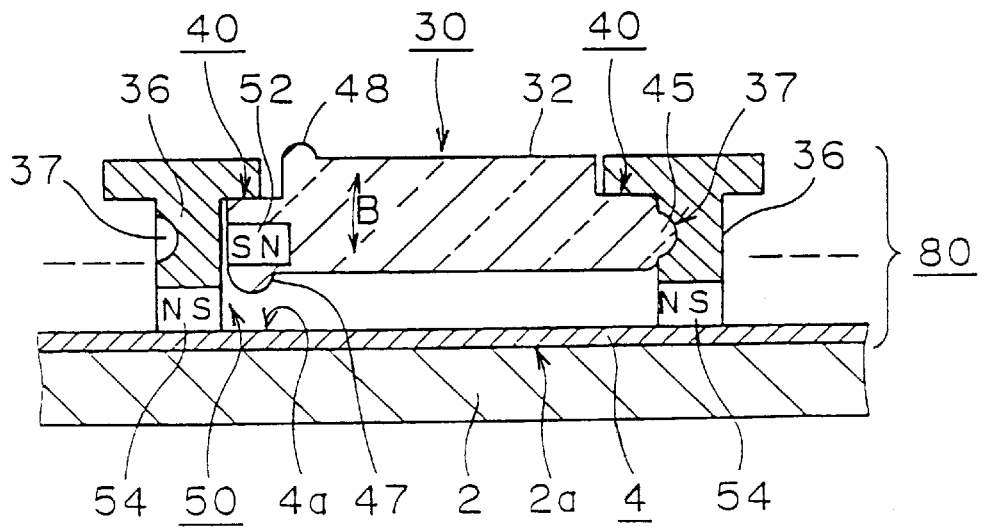

In an embodiment shown in FIG. 39, a fulcrum projection 45 is provided on one end surface portion of a push button 32 in place of providing the fulcrum projection 45 on the lower surface portion of the push button 32 dissimilarly to the aforementioned each embodiment, and this fulcrum projection 45 is rotatably fitted in a concave portion 37 which is provided in a support frame 36 opposed thereto. This fulcrum projection 45 and the concave portion 37 may be semicylindrical ones, or semicircular ones may be provided in plural. Return means 50 is of the same idea as the embodiment of FIG. 37. Also in case of this embodiment, it is possible to press/operate a switch part 4a of a touch panel 4 by rotating the push button 32 about the center of the fulcrum projection 45 as shown by arrow B in the press direction with a constant stroke. Function/effect in the return means 50 is similar to the case of the embodiment of FIG. 37.

<Nineteenth Embodiment>

Figure 40:
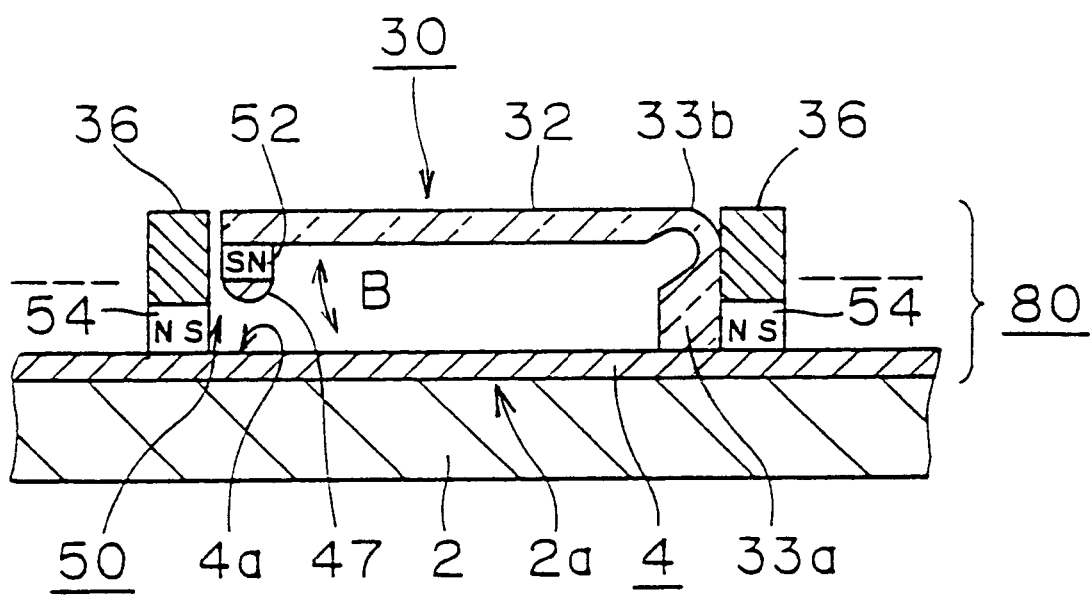

In an embodiment of FIG. 40, a push button 32 is integrated with a support part 33a through a hinge part 33b which is smaller in thickness as compared with other parts and having flexibility so that the overall sectional shape is substantially L-shaped. The support part 33a is fixed to the support frame 36 by means such as adhesion. In this embodiment, therefore, the aforementioned engaging part 40 for preventing displacement of the push button 32 is unnecessary. Return means 50 is of the same idea as the embodiment of FIG. 37. However, the hinge part 33b has restoring force by its elasticity and the push button 32 can be thus made to return to the original state (i.e., to a horizontal state), and hence both magnetic bodies 52 and 54 may not be provided in this embodiment. In this case, it comes to that the hinge part 33b serves both as a fulcrum of rotation and return means.

When the push button 32 is pushed, the hinge part 33b is bent and the push button 32 rotates as shown by arrow B in the press direction with a constant stroke, so that a switch part 4a of a touch panel 4 can be pressed/operated by an operation projection 47. When pushdown of the push button 32 is stopped, the push button 32 returns to the original state due to repulsion between a movable side magnetic body 52 and a fixed side magnetic body 54 and restoring force of the hinge part 33b.

In this embodiment of FIG. 40, the aforementioned fulcrum projection 45 and the engaging part 40 are unnecessary, whereby the structure of an operation part 30 can be further simplified, while assembling is made easy.

<1-2C. Support Frame Non-Exposure Type>

Figure 41:
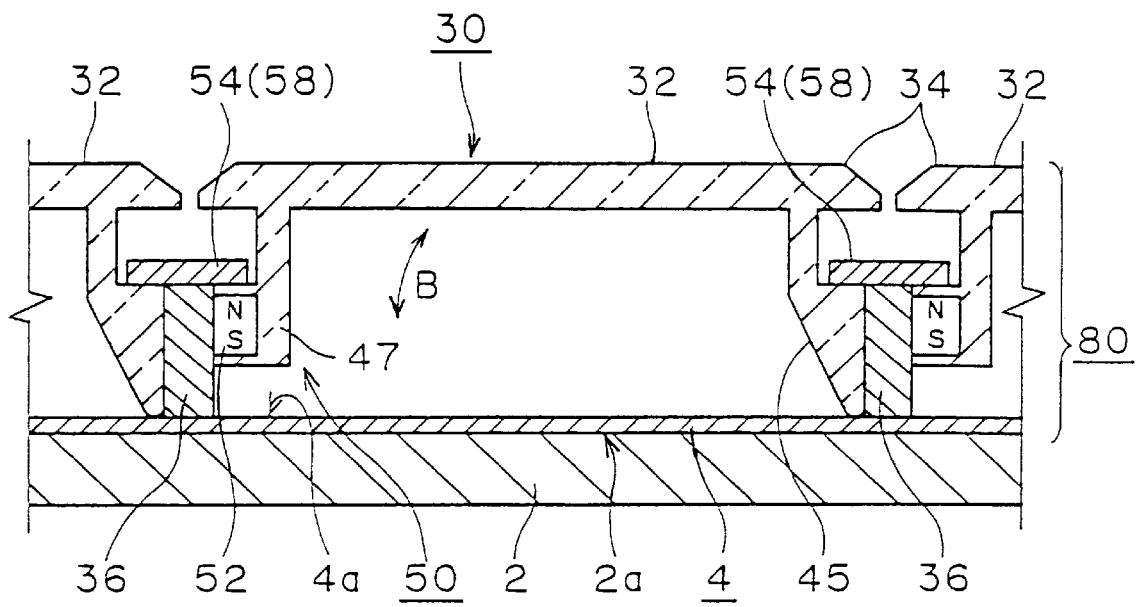
Figure 42:
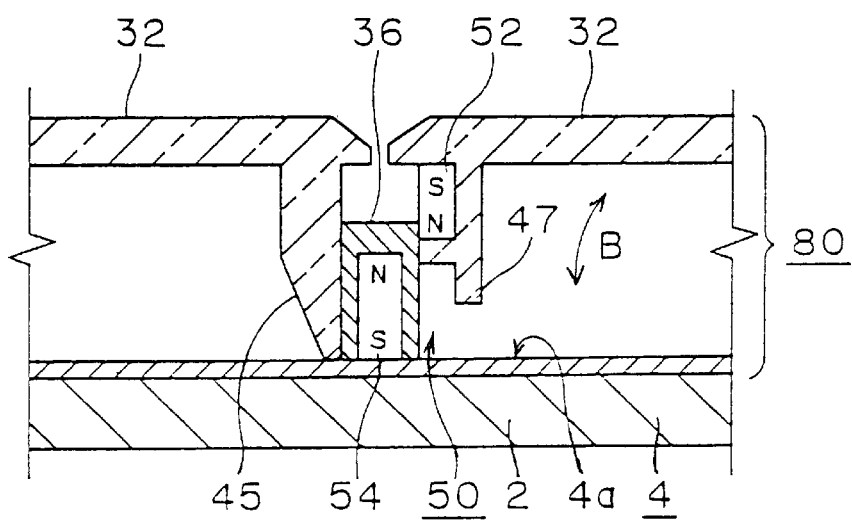
Figure 43:
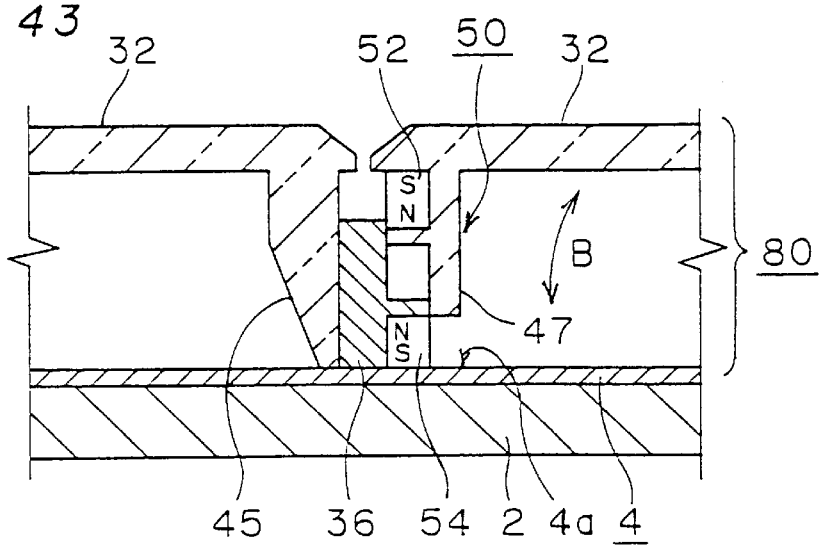

Embodiments of FIG. 41 to FIG. 43 are such embodiments that support frames 36 are positioned under marginal parts 34 of push buttons 32 (in other words, hidden behind). Plan views of these embodiments are identical to FIG. 23, and the support frames 36 do not appear on surfaces, whereby the surfaces are extremely neat and the appearances are improved.

Further, the push buttons 32 can be made large, whereby the target push buttons 32 can be readily pushed with no errors, and operability is improved.

Or, respective operation parts 30 can be arranged to be approached to each other since the support frames 36 are not obstructive, whereby high density arrangement thereof is enabled.

Independent embodiments are now described mainly with reference to differences between the same and the precedent embodiments.

<Twentieth Embodiment>

The embodiment of FIG. 41 has return means 50 of the same idea as the embodiment of FIG. 28. However, a movable side magnetic body 52 forming this return means 50 is provided in a lower portion of an operation projection 47 downwardly projecting from an end portion which is opposite to a fulcrum projection 45 of the push button 32, and a magnetic metal plate 58 is provided on an upper part of the support frame 36 which is positioned behind the push button 32. It is possible to push and turn on a corresponding switch part 4a of a touch panel 4 by the operation projection 47. Function/effect in this return means 50 is similar to the case of the embodiment of FIG. 28.

In this embodiment, further, a hook portion 44 downwardly projecting from the marginal part of the push button 32 and an extension part 38 which is provided on the upper part of the support frame 36 engage with each other, to form an engaging part 40 for preventing displacement of the push button 32, similarly to the partial sectional view shown in FIG. 24 as to the translation type switch. In the embodiment of FIG. 41, however, an engaging part for preventing displacement of the push button 32 can be defined by the operation projection 47 of the push button 32 and the magnetic metal plate 58, and hence the aforementioned engaging part 40 may not dare be provided.

<Twenty-First Embodiment>

The aforementioned engaging part 40 is provided in the embodiment of FIG. 42. This hook portion 44 and the aforementioned operation projection 47, i.e., the engaging part 40 and return means 50, are provided in positions not interfering with each other. Further, this embodiment of FIG. 42 has the return means 50 of the same idea as the embodiment of FIG. 33. However, a movable side magnetic body 52 forming this return means 50 is provided in a base portion of the operation projection 47. It is possible to push and turn on a corresponding switch part 4a of a touch panel 4 by the operation projection 47. Function/effect in this return means 50 is similar to the case of the embodiment of FIG. 33.

<Twenty-Second Embodiment>

The embodiment of FIG. 43 has return means 50 of the same idea as the embodiment of FIG. 38. However, a movable side magnetic body 52 forming this return means 50 is provided in a base portion of an operation projection 47. It is possible to push and turn on a corresponding switch part of a touch panel 4. Function/effect in this return means 50 is similar to the case of the embodiment of FIG. 38.

<2. Comparison of Translation Type with Rotation Type>

While the embodiments of the translation type and the rotation type have been described in the description heretofore made, the respective systems have the following characteristics:

When the push button 32 is rendered the translation type, there is such an advantage that, even if a portion deviating from the center of the push button 32 is pushed down, a touch switch operation can be performed at the same degree of reliability regardless of whichever direction the deviation is. Namely, the overall upper surface of the push button 32 can be widely utilized as a homogeneous operation region in the translation type. Further, the translation type has a shape symmetrical to its center, whereby manufacturing thereof is also easy.

On the other hand, the push button 32 of the rotation type is in a structure of rotating about the fulcrum projection 45 or the like, whereby the position of the operation forward end portion 46 pushing the switch part 4*a* of the touch panel 4 or the operation projection 47 in case of providing the operation projection 47 there is specified. Thus, there is such an advantage that the switch part 4*a* of the touch panel 4 may be present at least under the operation forward end portion 46 or the operation projection 47, and its area may not be much widened. Also when a plurality of operation parts 30 are lined up, therefore, spaces between adjacent switch parts 4*a* can be largely taken, whereby there is no apprehension that the adjacent switch part 4*a* is erroneously turned on, and a particularly correct switching operation is possible.

Further, there is such a situation that it is preferable that a switch operation can be performed in a single-stage operation when a push button is pushed down in general. Namely, operation feeling is higher in case of a single-stage operation than a switch operation performed through multistage operations when the push button is pushed down, and such reliability that the switch is reliably operated is improved. The aforementioned each embodiment employing the rotation type push button 32 responds to this requirement. Namely, the rotation type push button 32 rotates about the fulcrum projection 45 or the like, whereby the rotation operation becomes a single-stage operation, and reliability feeling of operation feeling, is particularly high.

Further, the push button 32 rotates about its fulcrum projection 45 or the like in the rotation type, whereby the return means 50 may be provided at least in one portion around an end portion which is separated from the rotation fulcrum of the push button 32. Therefore, the number of the return means 50 in one operation part 30 may be small, whereby the structure can be further simplified, while the number of parts such as the movable side magnetic body 52 and the number of assembling steps reduce, whereby further cost reduction of the thin type switch 80 and the display panel with switches can be attained.

In addition, it is not necessary to provide the return means 50 etc. on sides along the rotation direction of each push button 32 (e.g., upper and lower sides in FIG. 29), the support frame 36 may not necessarily be provided on a side along the rotation direction of each push button 32 which is adjacent to the adjacent push button 32, and hence higher density arrangement of the operation part 30 is enabled.

<3. Return by Spring>

<Twenty-Third Embodiment>

Figure 44:
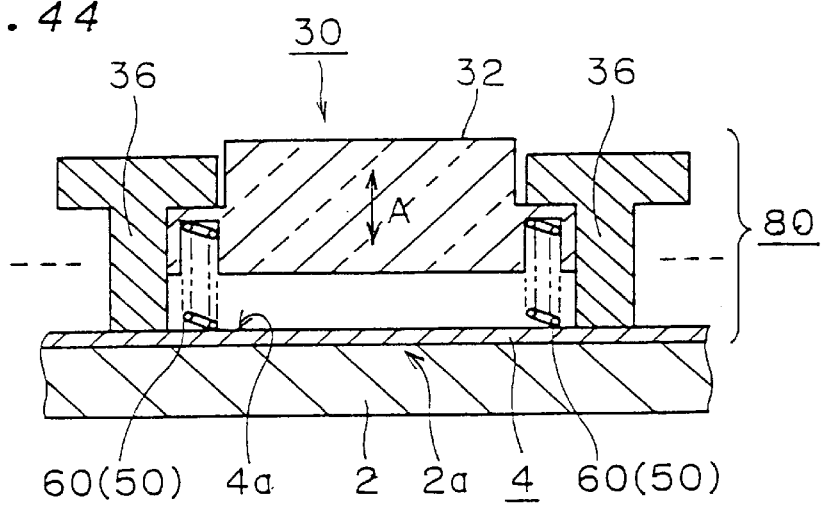

FIG. 44 is a sectional view partially showing an embodiment of a display panel with switches employing a thin type switch 80 having a touch panel of a resistor film type and a push button of a translation type, which can provide stroke feeling.

In this embodiment of FIG. 44, return means 50 are a plurality of compression coil springs 60 which are provided between a marginal part of a push button 32 and a touch panel 4. These compression coil springs 60 may be provided on four corners of the marginal part of the push button 32, for example.

In case of this embodiment, a switch part 4*a* of the touch panel 4 may be pressed by lower portions of the compression coil springs 60, or another means such as the aforementioned leg portion 42 or the like, for example, may be provided for pushing the switch part 4*a* by the same.

In this embodiment, no click feeling can be attained since only elasticity of springs is utilized, while stroke feeling can be attained since it is possible to push down the push button 32.

In this embodiment, further, there is absolutely no apprehension of exerting an influence of a magnetic field to others since no magnet is employed.

<Twenty-Fourth Embodiment>

Figure 45:
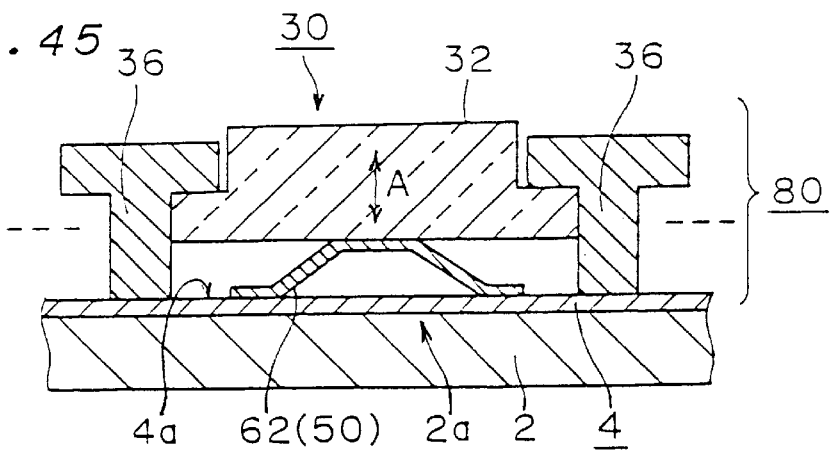

FIG. 45 is a sectional view partially showing an embodiment of a display panel with switches employing a thin type switch 80 having a touch panel of a resistor film type and a push button of a translation type, which can provide stroke feeling.

In this embodiment of FIG. 45, return means 50 are a plurality of plate springs 62 which are provided between a marginal part of a push button 32 and a touch panel 4 in angle shapes. These plate springs 62 may be provided on two opposite sides of the marginal part of the push button 32, or four opposite sides respectively, for example.

In case of this embodiment, a switch part 4*a* of the touch panel 4 may be pushed by lower portions of the plate springs 62, or another means such as the aforementioned leg portion 42 or the like, for example, may be provided for pushing the switch part 4*a* by the same.

In this embodiment, no click feeling can be attained since only elasticity of springs is utilized, while stroke feeling can be attained since it is possible to push down the push button 32.

In this embodiment, further, there is absolutely no apprehension of exerting an influence of a magnetic field to others since no magnet is employed.

<Twenty-Fifth Embodiment>

Figure 46:
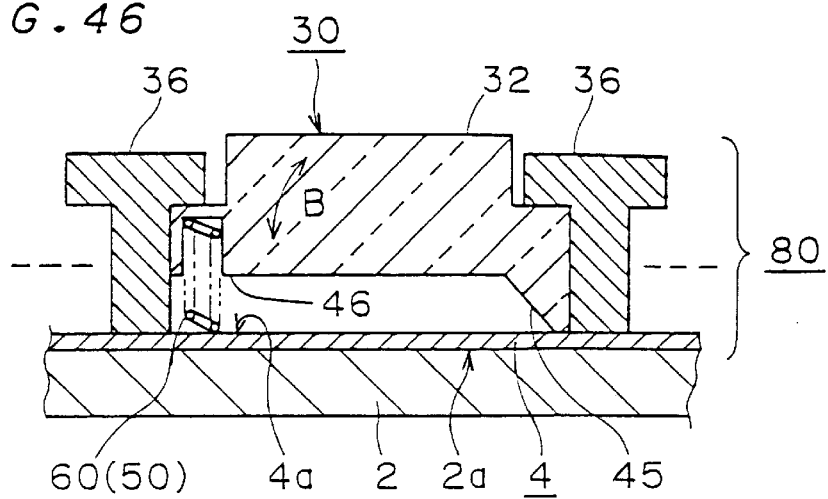

In an embodiment of FIG. 46, return means 50 utilizes elasticity (repulsion) of a spring, and consists of at least one compression coil spring 60 provided between an end on an opposite side to a fulcrum projection 45 of a push button 32 and a touch panel 4. This compression coil spring 60 may be one, or a plurality of springs may be lined up.

In case of this embodiment, a switch part 4*a* of the touch panel 4 may be pressed by a lower portion of the compression coil spring 60, or another means such as the aforementioned operation projection 47 or the like, for example, may be provided for pushing the switch part 4*a* by the same.

Also in case of this embodiment, stroke feeling can be attained since it is possible to push down the push button 32.

In this embodiment, further, there is absolutely no apprehension of exerting an influence of a magnetic field to others since no magnet is employed.

In place of this compression coil spring 60, an angle plate spring may be provided to be along the fulcrum projection 45 (i.e., in a direction perpendicular to the figure in FIG. 46). Thus, only a single plate spring will do.

<4. Operation Unit for Switching Device Assembly>

<4-1. Application to Control Panel>

Then, an example where the present invention is applied to an operation unit for a switching device assembly and an example where the operation unit is employed for a control panel are described.

While the switch of a thin type in each embodiment of the present invention can be formed as an operation unit for a switching device assembly and employed for a control panel, reference is made here to the case of employing the switch of a thin type shown in FIG. 28.

Figure 47:
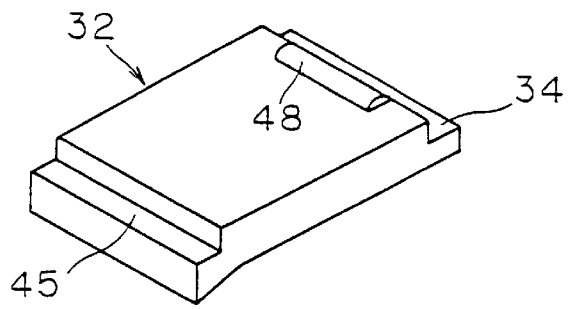
FIG. 47 is a perspective view of a push button.
Figure 48:
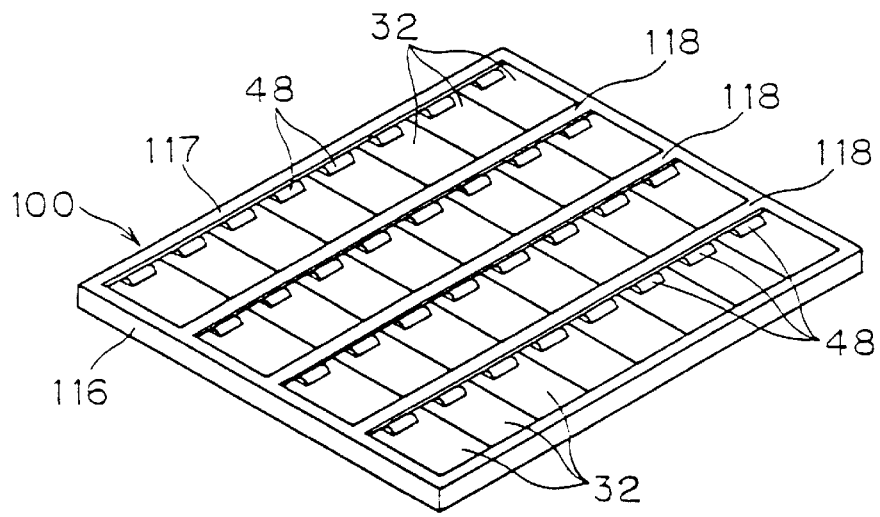
FIG. 48 is a diagram showing arrangement of a number of push buttons.

FIG. 48 is a perspective view showing a thin type operation panel 100 which is formed by employing the thin type switch of FIG. 28. This operation panel 100 comprises a frame body 116 defining a plurality of parallel windows, and a number of push buttons 32 which are arranged in the windows. While a perspective of each of the push buttons 32 is shown in FIG. 47 among the same, the detail thereof has already been described in relation to FIG. 28, and is not described in detail here.

The frame body 116 is formed in a shape having a plurality of strip-shaped holding bridges 118 which are integrally formed to be arranged and extended in parallel between two opposite sides of a rectangular outer frame portion 117 by a magnetic material (e.g., iron, magnetic resin), and corresponds to the magnetic metal plate 58 in the embodiment of FIG. 28. While not shown in this FIG. 47, support frames 36 of FIG. 28 consisting of synthetic resin or the like are perpendicularly fixed to lower surfaces of the respective holding bridges 118.

A plurality of push buttons 32 are arranged between adjacent two holding bridges 118, and the respective push buttons 32 are prevented from displacement with respect to a surface side (upper side in FIG. 48) and held by the holding bridges 118. As to the fact that thin type return means utilizing permanent magnets or the like are provided on rear sides of the respective push buttons 32 has been described in detail in FIG. 28 or the like.

As obvious from FIG. 48, the push buttons 32 are held in states being arranged approximately to each other while interposing no parting members between the outer frame portions 117 and the holding bridges 118 and between adjacent two holding bridges 118, whereby a series of display contents can be displayed with no interruption also when the series of display contents of a display panel 2 are displayed while employing the plurality of adjacent push buttons 32 as a single display assembly. This point is described with reference to FIG. 49 and FIG. 50A to FIG. 50D.

FIG. 49 shows a display device 150 with switches in case of applying the structure of the aforementioned embodiment to a ticket vending machine for tickets of a railway, and an assembly display region D1, a message display region D2 and an individual display region D3 are respectively provided successively from above in respective portions divided by the outer frame portions 117 of the operation panel 100 and the aforementioned holding bridges 118, while the assembly display region D1 and the individual display region D3 can display information for purchasing tickets by arranging plural (the figure shows the case of eight) push buttons 32 respectively. Among these, the message display region D2 is provided with no push buttons 32 but a transparent display plate 122 is fixedly fitted to be flush with the other push buttons 32, for externally displaying various message information variably displayed on the display panel 100 through the display plate 122. The respective push buttons 32 forming the assembly display region D1 are formed in larger surface areas than the push buttons 32 of the individual operation region D3.

FIG. 50A to FIG. 50D illustrate examples of display of the display device 150 with switches for the ticket vending machine of FIG. 49.

In the display of FIG. 50A, one display block is formed by two push buttons 32 in the assembly display region D1 respectively, while the push buttons 32 forming the respective display blocks are approximately arranged without interposing members dividing these. Therefore, a series of display contents of "short distance (Local)", "intermediate distance (Middle-Distance)", "book of tickets (Coupon Ticket)" and "ticket for a limited express (Ltd. Express Ticket)" are displayed not bit by bit but integrally. Whatever push button 32 in these display blocks is pressed/operated, the content described in the display block is to be selected.

When either operation member 15 of the "intermediate distance" formed by two push buttons 32 in the assembly display region D1 is pressed/operated in accordance with an instruction of the message display region D2, the display is converted to that of FIG. 50B. In this display of FIG. 50B, one display block is formed by two push buttons 32 in a part of the individual display region D3 respectively, while a series of display contents of "north region (North)", "south region (South)", "east region (East)" and "west region (West)" are non-interruptedly displayed not bit by bit.

When either one push button 32 of the display block of the "west region" which is formed by two push buttons 32 in the individual display region D3 is pressed/operated in accordance with an instruction of the message display region D2 in the display of FIG. 50B, the display is converted to that of FIG. 50C. When the station name of "D" in the individual display region D3 is pressed/operated in accordance with an instruction of the message display region D2 in this display of FIG. 50C, it comes to the display of FIG. 50D. When a prescribed sum of money, is thrown into the ticket vending machine in accordance with an instruction of the message display region D2 in this display of FIG. 50D, the ticket is issued while a content of "Your ticket is now issued. Thank you. (Your ticket is now issued. Thank you.)" is displayed on the message display region D2, and thereafter the display returns to the initial display of FIG. 50A.

These displays can be readily changed by setting of a program of software of the display panel 2 consisting of a liquid crystal display. On the other hand, the operation panel 100 is not parted by members dividing the respective push buttons 32 in both display regions D1 and D3, whereby it comes to that the same can cope with any possible change as such. It is possible to operate the touch panel 4 (FIG. 28) with excellent operability by employing the operation panel 30 in this manner, while variable information displayed on the display panel 2 can be externally displayed with no hindrance through the push buttons 32.

Further, the operation panel 100 has such an advantage that the display content is easy to recognize (excellent in visibility) from what direction an operator sees the same when be operates this display device with switches. Namely, the fact that the operation panel 100 is arranged has such a merit that the same is not visually obstructive for the operator while operability can also be improved.

Figure 51:
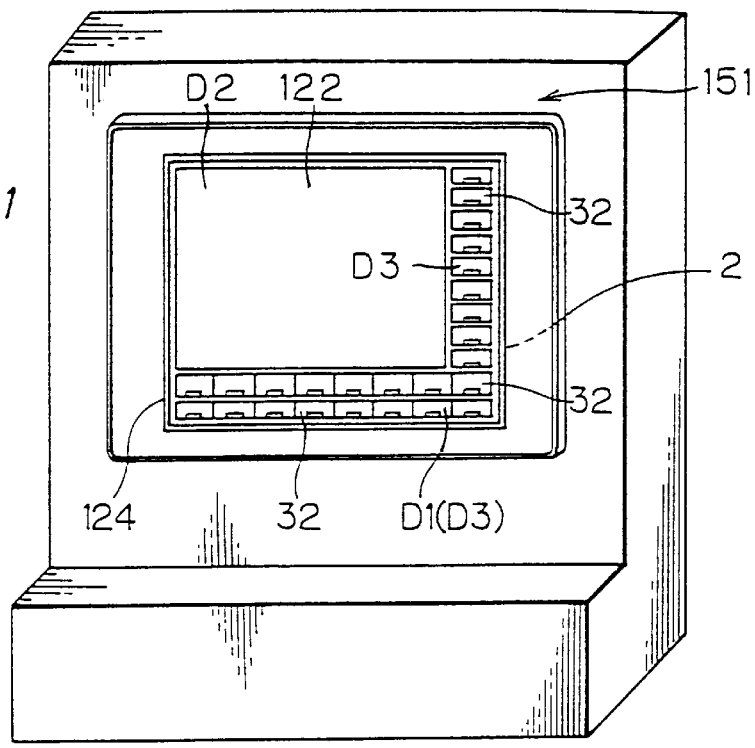
FIG. 51 and FIG. 52 are appearance diagrams of control panels utilizing the preferred embodiment of the present invention.

FIG. 51 shows another display device 151 with switches to which the structure of FIG. 28 is applied, and in particular, an operation panel 124 of a layout structure largely taking a message display region D2 is attached to a front surface of a display panel 2. A transparent display plate 122 is fixedly attached to the message display region D2 without providing push buttons 32 as described in FIG. 49, so that display contents of the display panel 2 can be seen through. An assembly display region D1 or an individual display region D3 is provided on a lower side of the display panel 2. Further, the individual display region D3 is provided on a right side of the display panel 2.

Push buttons 32 are provided in each display region in correspondence respectively, so that a switch part 4a (FIG. 28) of a touch panel 4 on the display panel 151 is turned on by a press operation of these push buttons 32 having stroke feeling. The display contents of the respective display regions may be display contents which are rendered to correspond to the switch part 4a or other display contents, as a matter of course, Thus, variable information displayed on the display panel 2 can be externally displayed with no hindrance through the push buttons 32 by employing the operation panel 124 also in this application example, while the touch panel 4 can be operated in excellent operability with stroke feeling and a switching device assembly can be formed in the same display screen, whereby operability is improved and a malfunction can also be prevented.

Figure 52:
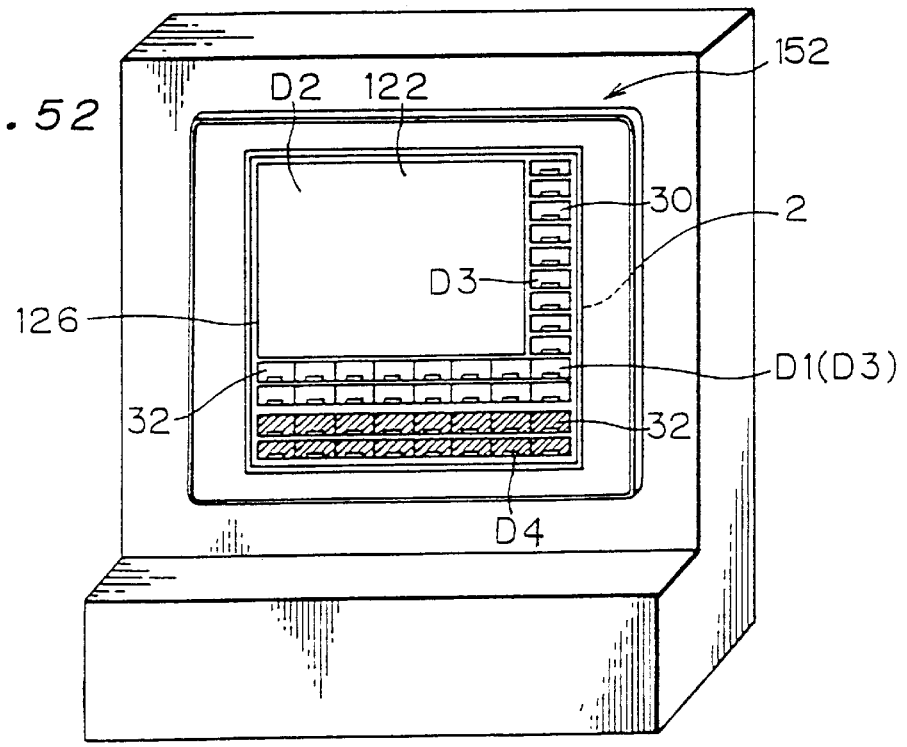

FIG. 52 shows a display device 152 with switches obtained by adding an individual display region D4 (slant portion in the figure) of fixed information consisting of light emitting diodes and name plates, for example, to the display device 151 with switches shown in FIG. 51 and layout-structuring the same, and an operation panel 126 formed by arranging push buttons 32 in positions corresponding to the region D4 is attached to a front surface of the display panel 152. Respective switch parts of a single transparent touch panel correspond to this region D4 and display regions D1 and D3 which are variable information display regions. Namely, it is structured by properly allotting respective parts of the single touch panel to these variable information display regions D1 to D3 and the fixed information display region D4, and variation of various information displays employing one touch panel is enabled by properly changing such an allotting situation.

This application example shows such an example that the display panel 2 is formed by a combination of variable information display regions by liquid crystal displays or the like and a fixed information display region by name plates or the like, and indicates that the push buttons 32*s* etc. of the operation panel 126 can be freely laid out in correspondence to the respective regions.

Also in this application example, the touch panel can be operated in excellent operability as a matter of course, while the same can also be provided for a fixed information display device (region D4 portion) utilizing light emitting diodes etc. in addition to variable information display devices such as liquid crystal displays, whereby a display screen can be formed in well-unified design while operability is also improved, and its utilization range is widened.

<4-2. Assembling of Frame Body>

An example of an assembling structure of the frame body 116 included in the operation panel 100 of FIG. 48 is now described with reference to FIG. 53.

Figure 53:
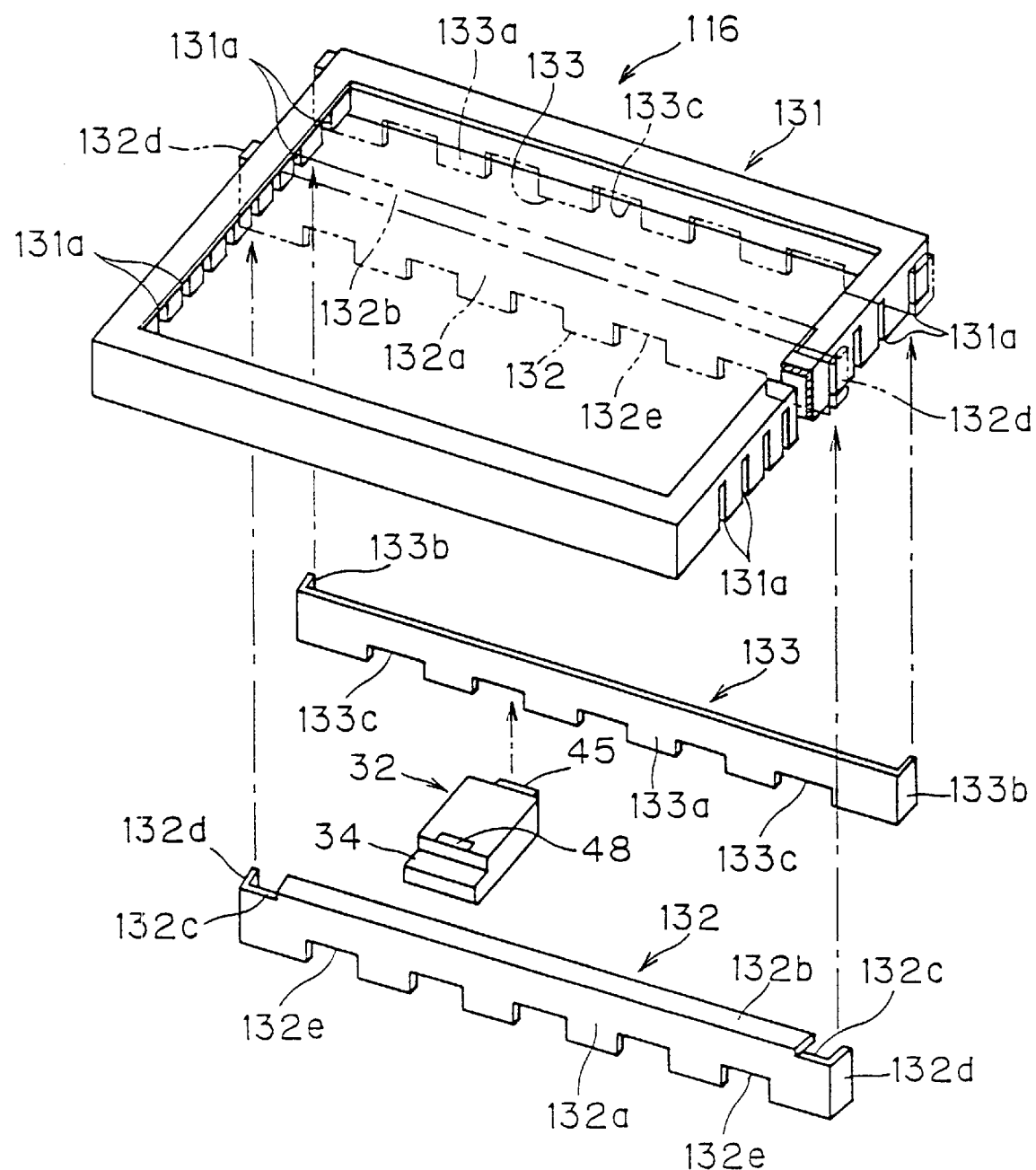

Referring to FIG. 53, a plurality of slit-type notches 131a are arranged on opposite two side surfaces of an outer frame portion 131 at regular intervals. On the other hand, a holding bridge 132 to be extended between opposite two sides of the outer frame portion 131 comprises a body portion where an engage piece part 132b projects from an upper end of a guide portion 132a in a perpendicular direction, to be in such a shape that the engaging piece part 132b is removed on both end portions to form engaging parts 132c which can be inserted in the aforementioned notches 131a, while holding pieces 132d perpendicularly extending from outer sides of the engaging parts 132a are formed.

Further, an end portion holding bridge 133 which is mounted in approximation to a side of the outer frame portion 131 provided with no recesses 131a is brought into such a shape that holding pieces 133b are perpendicularly extended on both end portions of a guide portion 133a. Engaging notches 132e and 133e for receiving a stop piece 45 of a push button 32 and engaging with the same are formed in the respective guide portions 132a and 133a of the holding bridge 132 and the end portion holding bridge 133.

Due to provision of the aforementioned structure, the holding bridge 132 selects notches 131a which can be arranged in spaces responsive to the dimensions of the push button 32 to be mounted and inserts the engaging parts 132c in the notches 131a, thereby stopping both side holding pieces 132d for holding the outer frame portion 131. Here, the same may be formed in such a shape that the engaging parts 132c can be press-fitted in the notches 131a. The end portion holding bridge 133 is also mounted by means similar to the holding bridge 132. As to the push button 32, that of arbitrary arrangement or having a different size can be arbitrarily mounted by selecting arbitrary engaging notches 132e and 133c in the holding bridge 132 and the end portion holding bridge 133 and making the stop piece 45 insert/stop.

Namely, various ones having different dimensions in both of the arrangement direction and a direction perpendicular to the arrangement direction are prepared as the push button 32, so that an arbitrary one can be exchanged and mounted at need.

Thus, various frame bodies 161 can be formed by the combination of the outer frame portion 131 and the holding bridge 132 and the end portion holding bridge 133, and operation panels can be formed in various layouts by mounting push buttons 32 of different sizes to this frame body 161.

<4-3. Method of Assembling Display Device with Switch>

Examples of a method of assembling the display device with switches according to the present invention are now described with reference to FIG. 54 to FIG. 58.

Figure 54:
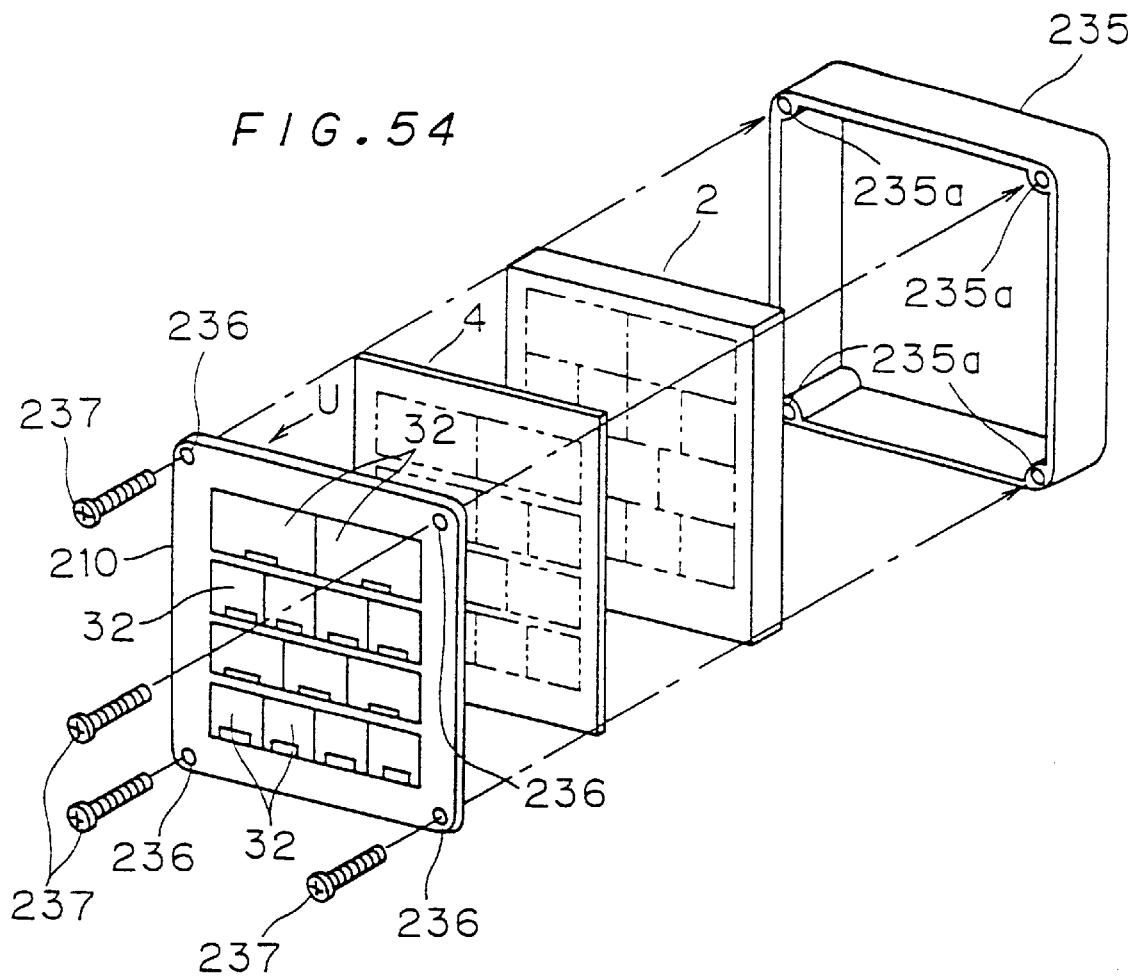

Referring to FIG. 54, a touch panel 4 of a resistor film type and a display panel 2 consisting of a liquid crystal display are superposed with each other and inserted in a case 235. Then, fixed screws 237 are inserted in mounting holes 236 which are perforated in four corners of a frame body 210, and screwed into screw holes 235a of the case 235. Thus, an operation unit U which is an embodiment of the present invention is obtained.

Figure 55:
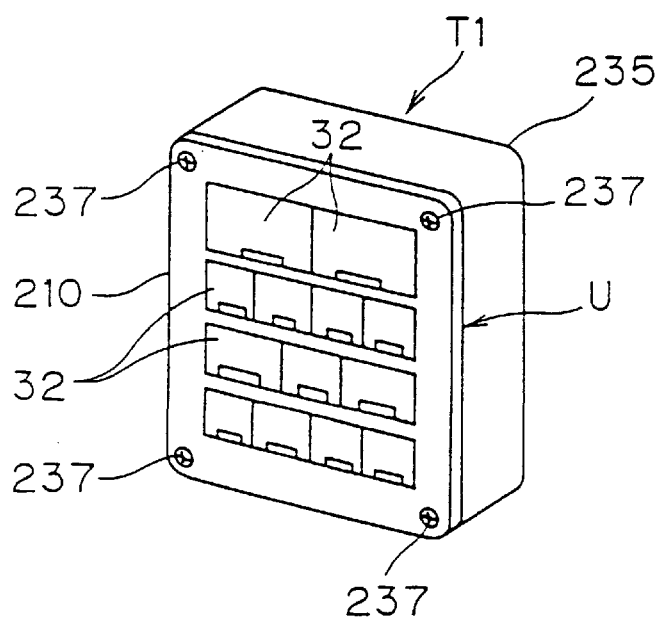

Due to such a simple assembling step, a variable information display operation terminal T1 shown in FIG. 55 can be simply formed. This variable information display operation terminal T1 can readily chance the display contents of the display, panel 2 by setting of a program of software. Respective push buttons 32 serving as external display surfaces are approximately arranged in the operation unit U without providing partitions in the transverse direction of the figure, whereby it is possible to cope with display change as such. When a plurality of push buttons 32 are opposed with respect to a series of display contents of the display panel 2 at this time, it comes to that a corresponding content of the same display is selected whatever push button 32 thereof is operated.

Figure 56:
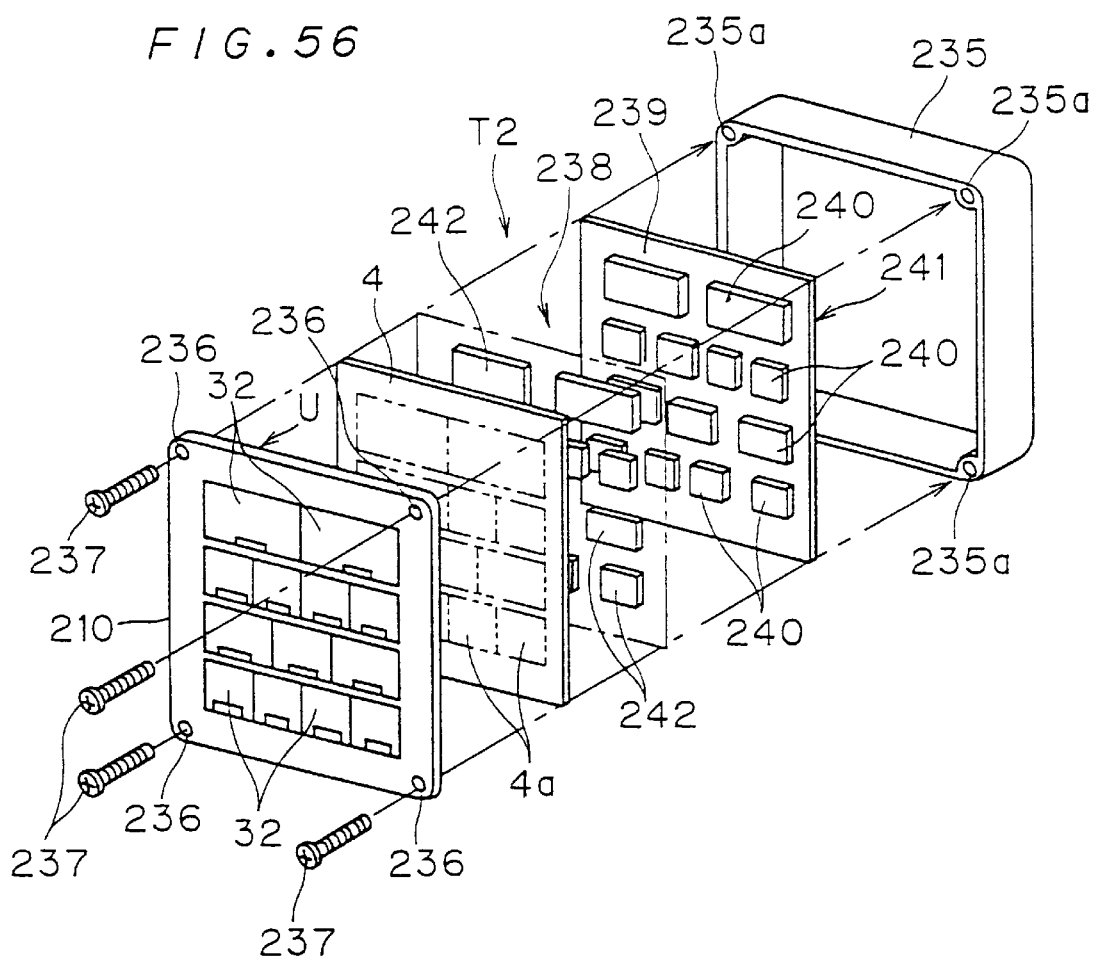

FIG. 56 shows an exploded perspective view of a light illumination type fixed information display operation terminal T2 formed by the operation unit U which is the embodiment of the present invention. A display device 238 is formed by a light emitting board 241 prepared by arranging light emitting parts 240 which are formed by arranging a plurality of light emitting diodes on a substrate 239, and name plates 242 opposed to the respective light emitting parts 240. In the name plates 242, contents selected by operation of switch parts 4a of a touch panel 4 and the like are displayed and formed on transparent or semitransparent color plates by characters or symbols. This fixed information display operation terminal T2 is also assembled by superposing the operation unit U, the touch panel 4 and the display device 238 with each other, inserting the same in a case 235 and thereafter screwing fixed screws 237 into screw holes 235a of the case 235 through mounting holes 236. In this fixed information display operation terminal T2, display contents can be readily changed by simply exchanging the name plates 242.

Since the display device 238 is in a light-emission displaying mode, the push buttons 32 may not be rendered transparent but may be made of a translucent material. Further, the light emitting parts 240 are not restricted to light emitting diodes, but ELs which are made to emit light in correspondence to the push buttons 32, EL plates which are combined with liquid crystal shutters transmitting or intercepting light in correspondence to the push buttons 32, or a combination of fluorescent lamps and back lights employing light guide plates can be employed.

Figure 57:
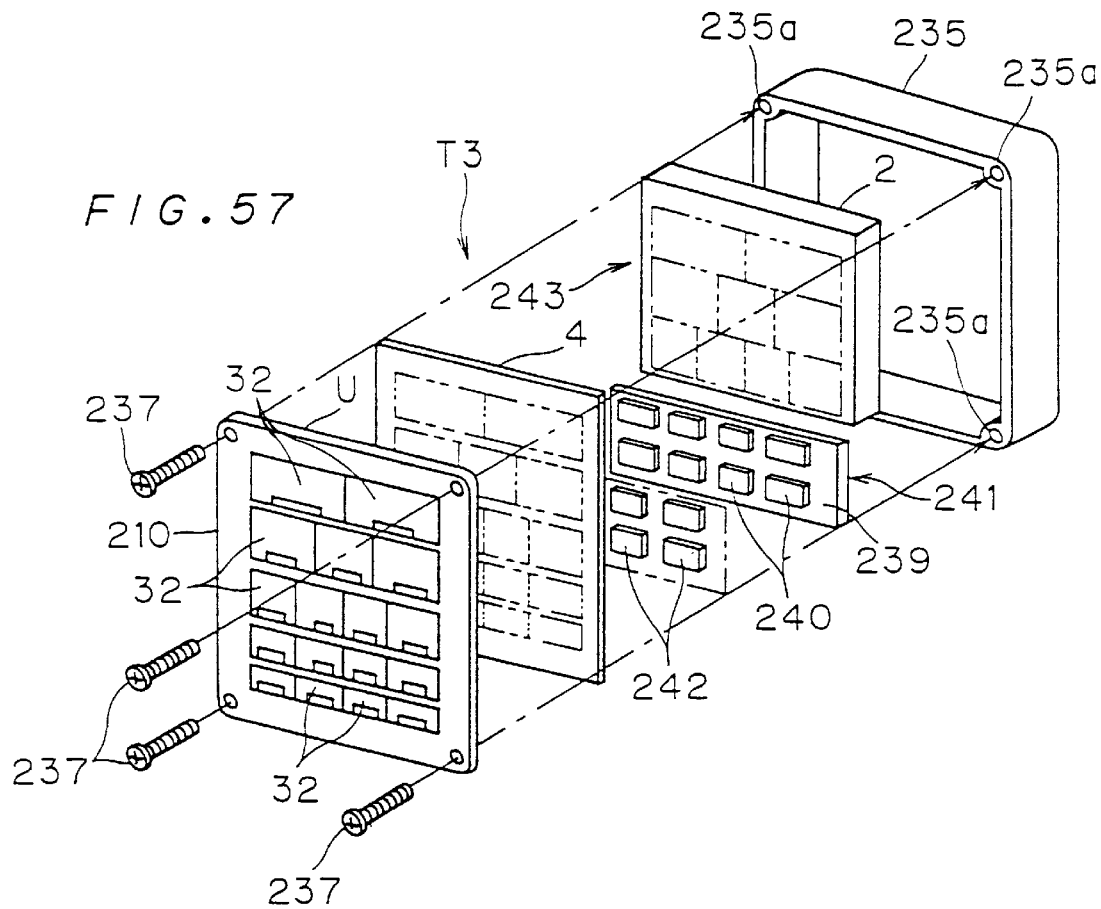

FIG. 57 shows an exploded perspective view of an information display operation terminal T3 which can display variable information and fixed information in combination. A display device 243 is formed by a display panel 2 consisting of a liquid crystal display serving as variable information display means, a light emitting board 241 prepared by arranging light emitting parts 240 which are formed by arranging a plurality of light emitting diodes on a substrate 239 for serving as fixed information display means, and name plates 242 opposed to the respective emitters 240. An assembling procedure is similar to the above, while the display device 243 is inserted in a case 235 by combining the display panel 2, the light emitting board 241 and the name plates 242 in prescribed arrangement. Also in this information display operation terminal T3, change of variable information and fixed information is performed similarly to those described in FIG. 54 and FIG. 56.

Figure 58:
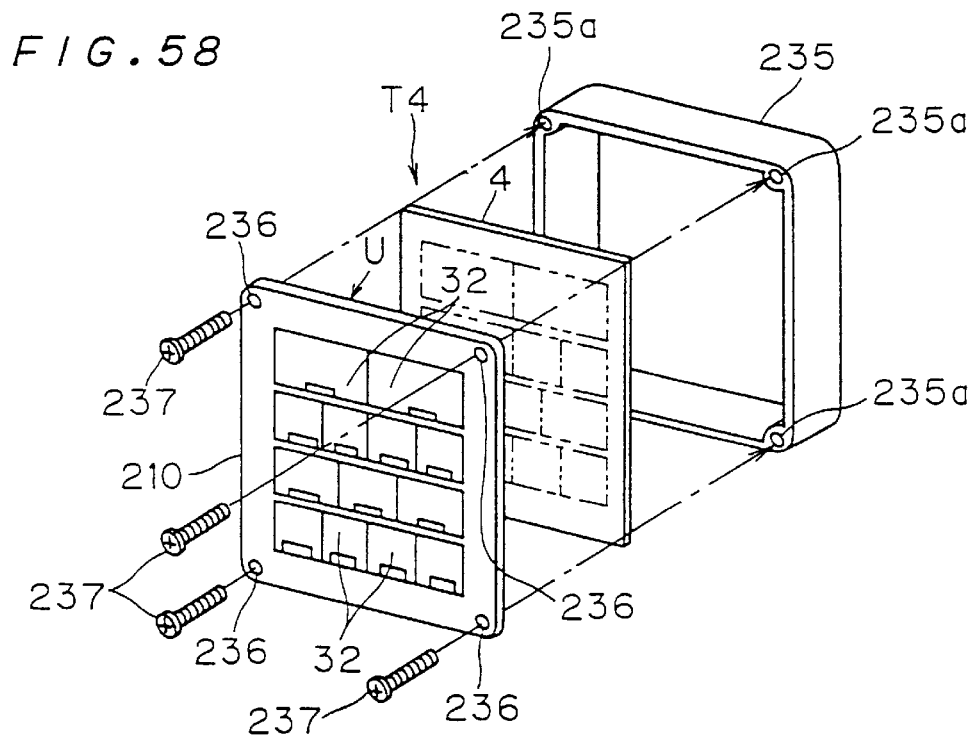

FIG. 58 is an exploded perspective view of the simplest fixed information display operation terminal T4. Namely, the operation unit U which is the embodiment of the present invention and a touch panel 4 are combined with each other and stored in a case 235. In this case, push buttons 32 are made of a non-transparent and opaque material, while fixed information is to be displayed on external surfaces. This fixed information display operation terminal T4 may be exchanged to push buttons 32 displaying required information in change of fixed information, and the push buttons 32 can be readily attached/detached from below since the same are simply held by attractive force of permanent magnets 15 attached thereto and holding bridges 118 (FIG. 48) consisting of a magnetic metal. Further, membrane switches may be employed in place of the touch panel.

<4-3A. Other Mounting Method>

While FIG. 54 to FIG. 58 show means of mounting the operation unit U by the fixed screws 237, the same can also be readily mounted by employing other mounting means. As shown in FIG. 59A, for example, engaging grooves 244a are concavely provided on both side surfaces of a case 244, while hook bodies 245 which engage in the engaging grooves 244a for holding the case 244 from both sides are integrally formed on the operation unit U in states projecting from a frame body 210 or fixed to the frame body 21(0. The operation unit U can be detachably mounted on the case 244 without employing any tool, by bringing the hook bodies 245 into shapes having elasticity by synthetic resin.

In FIG. 59B, magnetic metal plates 247 such as iron plates and magnets 248 are engaged in and fixed to opposite portions of respective ones of a case 246 and the operation unit U, thereby detachably mounting the operation unit U to the case 246 by attraction of the magnets 248 to the magnetic metal plates 247. Further, FIG. 59C forms a step portion 249a in an inner peripheral surface of an opening portion of a case 249, while forming a projecting surface 250 engaging in the step portion 249a in an opposite surface of the operation unit U. Therefore, the operation unit U can be detachably mounted on the case 249 by simply fitting the projecting surface 250 in the step portion 249a from above.

<5. Touch Panel of Other Type>

<5-1. Photoelectric Touch Panel>

<Twenty-Sixth Embodiment>

As to the touch panel, a photoelectric touch panel for intermitting or damping light outgoing from a light emitting device and entering a photoreceptor device, or an ultrasonic wave type touch panel for intermitting or damping ultrasonic waves outgoing from an ultrasonic oscillation device entering a receiving device, in addition to the aforementioned touch panel of a resistor film type. Therefore, embodiments employing photoelectric touch panels or ultrasonic wave type touch panels are now described mainly with reference to differences between the same and the precedent embodiments.

<5-1A. Combination with Translation Type>

<Twenty-Seventh Embodiment>

Figure 60:
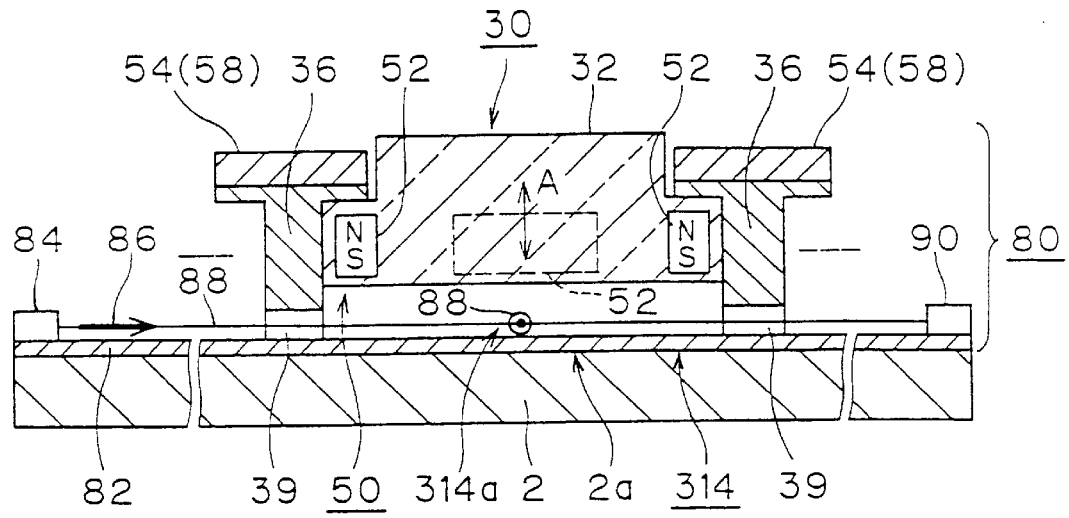
FIG. 60 to FIG. 74 are explanatory diagrams of a further embodiment of the present invention which is formed by utilizing photoelectric touch switches.

FIG. 60 is a sectional view partially showing an embodiment of a display panel with switches employing a thin type switch 80 having a touch panel of a photoelectric type and a push button of a translation type, which can provide stroke feeling and click feeling.

The thin type switch 80 in this embodiment of FIG. 60 comprises an operation part 30 which is similar to the embodiment of FIG. 15, and a touch panel 314 of a photoelectric type.

Figure 61:
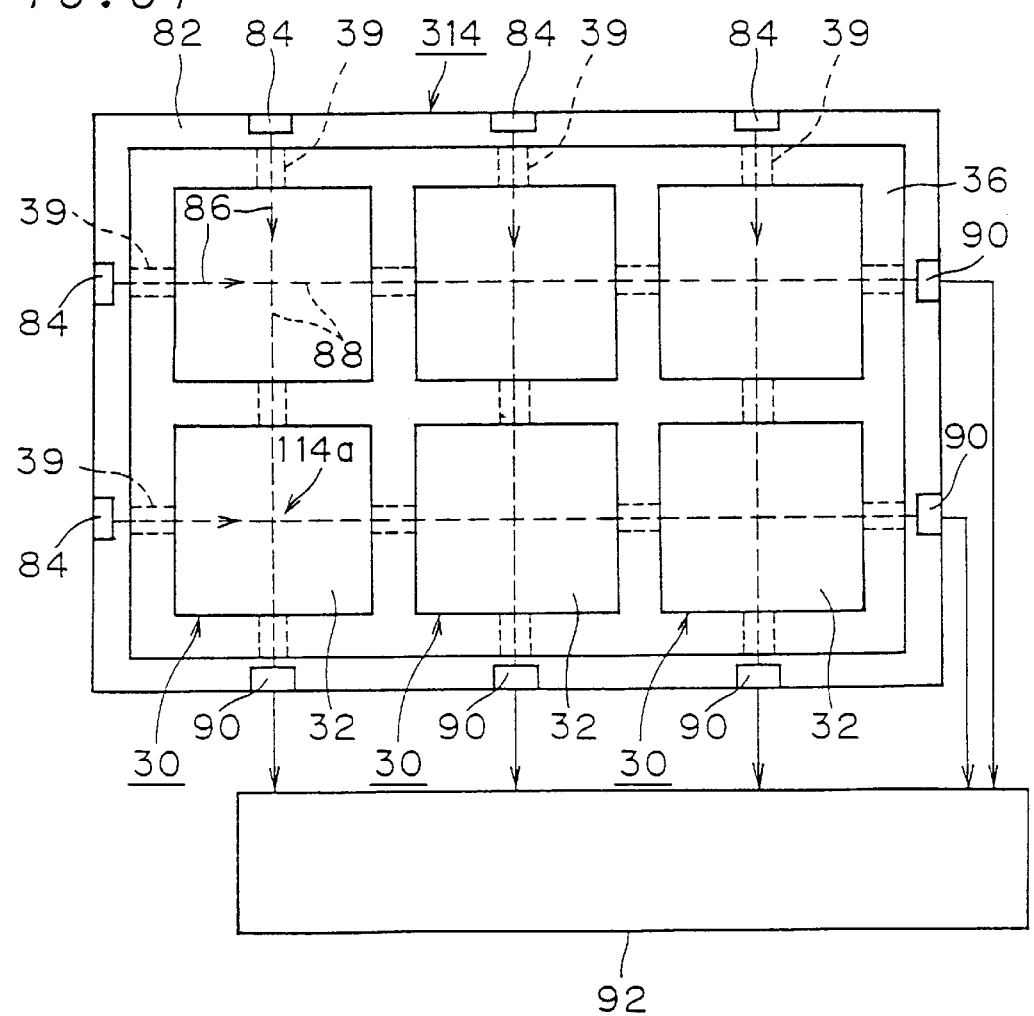

Referring also to FIG. 61, the touch panel 314 has a structure prepared by arranging a plurality of light emitting devices 84 outputting light 86 and a plurality of photoreceptor elements 90 receiving the light 86 and converting the same to electric signals on marginal parts of a substrate 82 while vertically and transversely opposing the same to each other, and forming matrix-shaped optical paths 88 in spatial surfaces between the surface of the substrate 82 and push buttons 32. A portion around an intersection between two optical paths 88 defines a switch part 314a respectively.

Holes or notches 39 for passing the light 86 therethrough are provided in base portions of respective support frames 36. However, these portions may be made of transparent resin or the like.

The substrate 82 is a transparent or semi-transparent glass substrate, for example. However, it is also possible to omit the substrate 82 by making a substrate forming a display panel 2 or the like substitute for this substrate 82.

Each light emitting device 84 is an LED, a semiconductor laser or the like, for example. Each photoreceptor device 90 is a photodiode, a phototransistor or the like, for example.

The light 86 outputted from each light emitting device 84 is preferably infrared light since the same is inconspicuous, while visible light may be employed, as a matter of course. On the other hand, the system of making, each light emitting device 84 emit light may be a system of regularly making the same emit light, or a system of making the same successively emit light through a microcomputer or the like (this is also called a successive light emitting system or a scanning system). This microcomputer or the like may be defined by that forming, a detection circuit 92 described next, for example.

The detection circuit 92 which detects the position (coordinates) of an intersection of an optical path 88 whose light quantity reduces in response to a signal from each photoreceptor device 90, i.e., specifies a switch part 114a where an operation has been performed, is connected to the vertical and transverse respective photoreceptor devices 90, as shown in FIG. 61 in this example. However, such a detection circuit 92 may not be attached to this touch panel 114, but a circuit or a microcomputer provided in a device to which it is connected may be utilized.

In general, an operation of shading the light 86 is performed by approaching a finger or the like to a portion close to the surface of such a touch panel 314, and stroke feeling cannot be attained as such since there is no movable part and a push-in stroke is zero. When the finger is carelessly approached to the portion close to the surface of the touch panel or an operation ("tracing operation") of perplexedly running the finger over a plurality of switch parts is performed, it malfunctions.

In this embodiment, on the other hand, it is so formed that the light 86 is shaded or damped by pushing down the push buttons 32. Namely, the push buttons 32 enter the light paths 88 when the push buttons 32 are pushed down. When the push buttons 32 are opaque, the light 86 is completely shaded by the same. When the push buttons 327 are transparent or semi-transparent, the light quantities reduces by refraction or damping in the push buttons 32 and output signal levels from the corresponding photoreceptor devices 90 reduce, whereby the fact that the push buttons 32 enter the optical paths 88 can be detected, although the light cannot be completely shaded. In order to more strongly shade or damp the light 86 in the case where the push buttons 32 are transparent or semi-transparent, end surfaces of the push buttons 32 positioned on the optical paths 88 may be painted black etc. to be rendered opaque, or satin working for diffusing the light 86 or mirror finishing of reflecting the light 86 may be performed on the end surfaces. Alternatively, the movable side magnetic bodies 52 are opaque and hence the same may be arranged to be positioned on the optical paths 88.

Thus, the stroke for pushing in the push buttons 32 can be ensured in this thin type switch 80, whereby clear stroke feeling can be attained, dissimilarly to the case of the independent conventional photoelectric touch panel. Further, click feeling can also be attained in these operation parts 30, as described above.

While there has been such a problem in the independent conventional photoelectric touch panel that the same malfunctions when foreign matters (e.g., bugs, dust or the like) adhere to its surface since the optical paths are blocked by the same, no malfunction is caused in this thin type switch 80 even if foreign matters such as bugs or dust adhere to the push buttons 32. Thus, reliability is high.

In the display panel with switches according to this embodiment, further, it is possible to make the distances between the push buttons 32 and the display panel 2 small (e.g., to about 1 to 2 mm) similarly to the case of the precedent embodiments, whereby it comes to that the display content of the display panel 2 is displayed immediately in proximity to depths of the push buttons 32, and the display content of the display panel 2 can be clearly visually recognized without employing an image guide etc. for floating up the display.

The numbers of the matrix-arranged operation parts 30 and the optical paths 88 are not restricted to 3×2 as in the example shown in FIG. 61, but arbitrary in m×n (m and n are integers of at least 1), and may be decided in response to application or the like in more concrete terms.

<Twenty-Eighth Embodiment>

Figure 62:
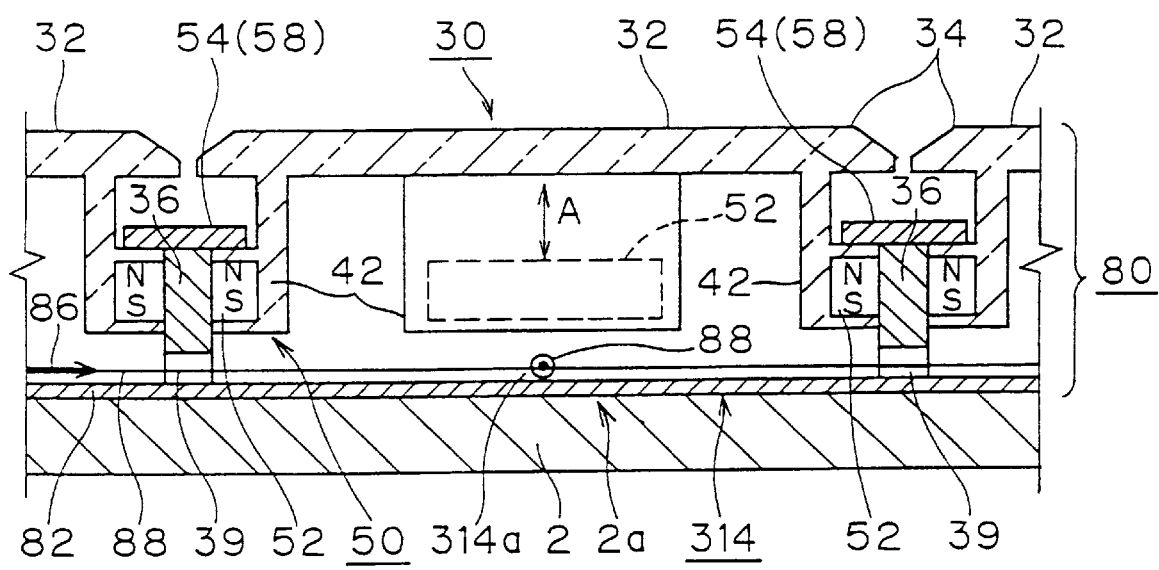

FIG. 62 is a sectional view partially showing an embodiment of a display panel with switches employing a thin type switch 80 having a touch panel of a photoelectric type and a push button of a translation type, which can provide stroke feeling and click feeling.

The thin type switch 80 in this embodiment of FIG. 62 is formed by combining an operation part 30 similar to the embodiment of FIG. 22 and a photoelectric touch panel 314 similar to the embodiment of FIG. 60, and attains function/effect similar to those described in advance as to the respective embodiments. However, an operation of an switch part 314a of the touch panel 314, i.e., interruption or damping of light 86 is performed through lea portions 42 provided on the push button 32.

<Twenty-Ninth Embodiment>

Figure 63:
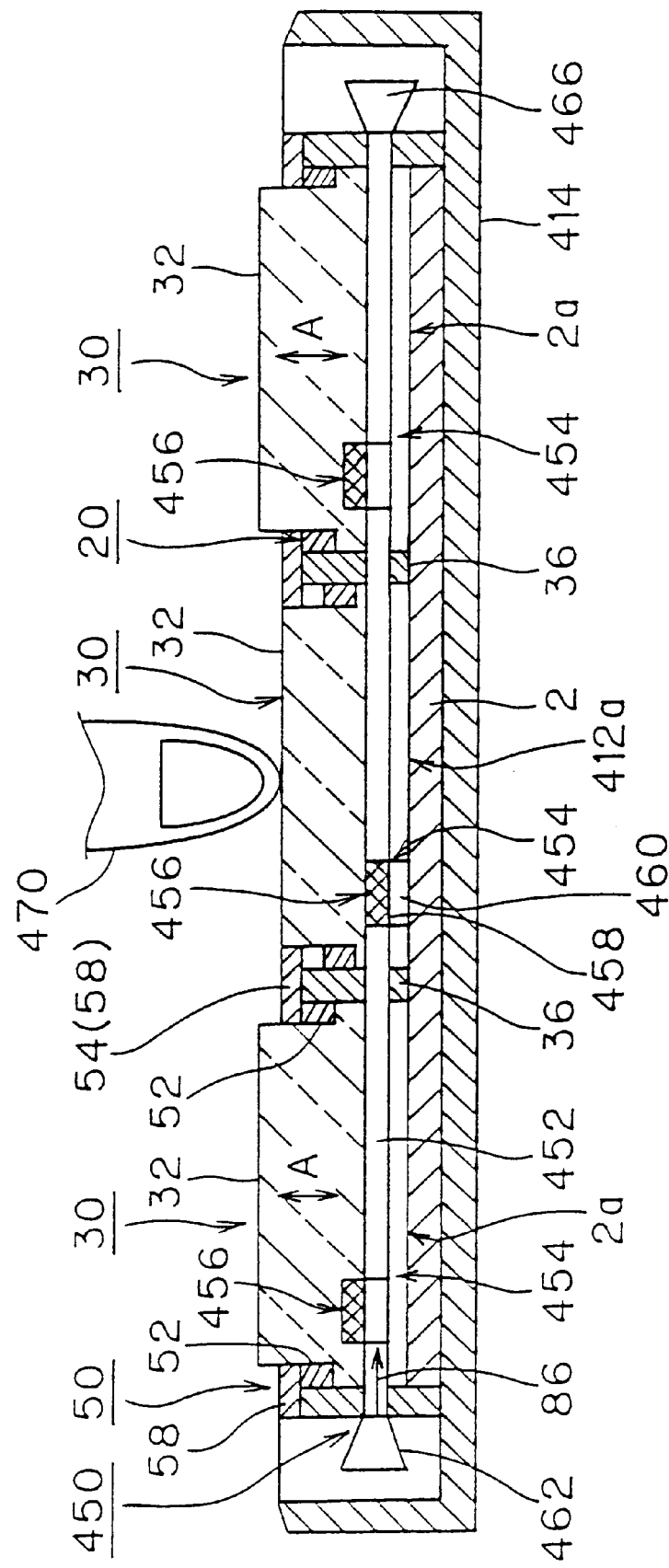
Figure 64:
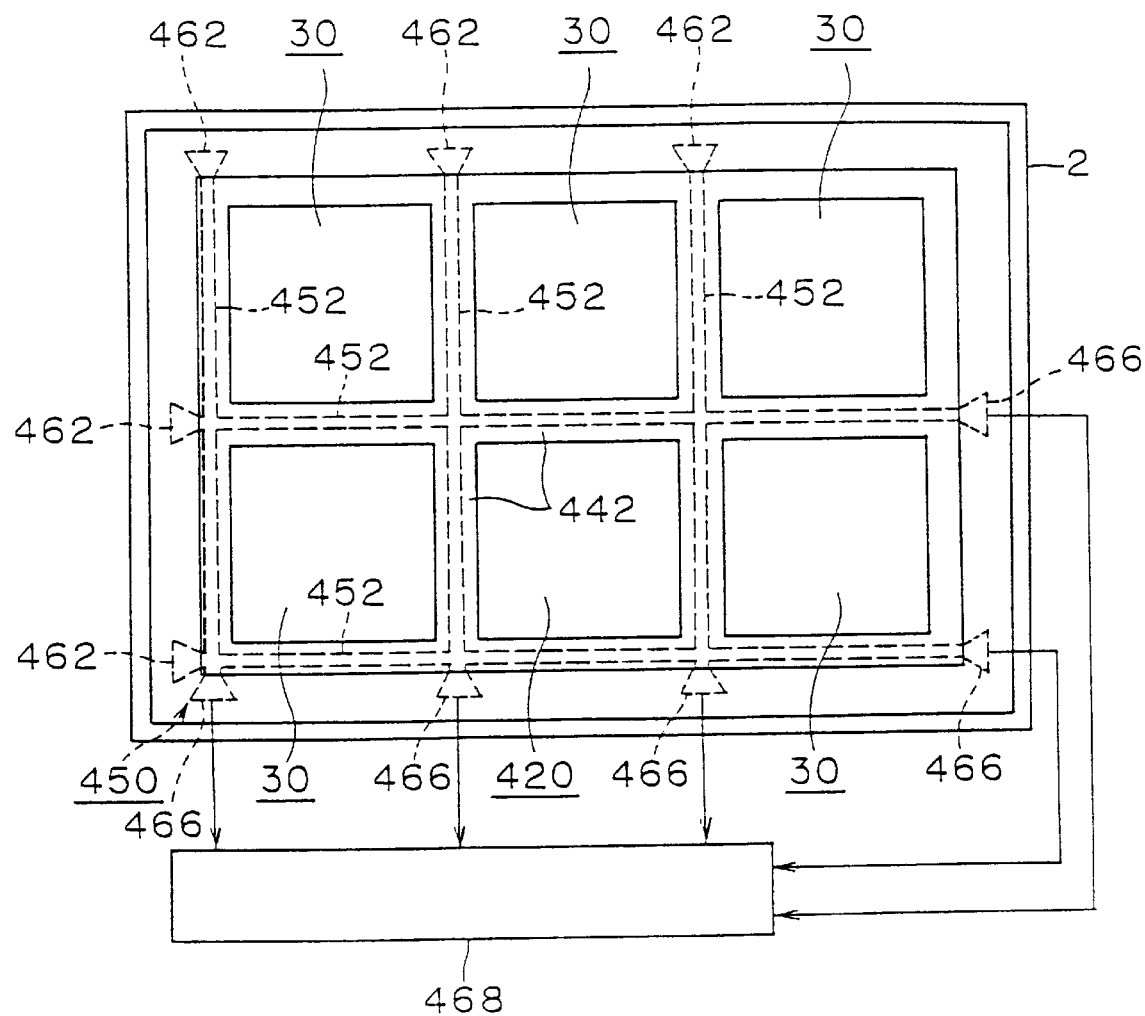
Figure 65:
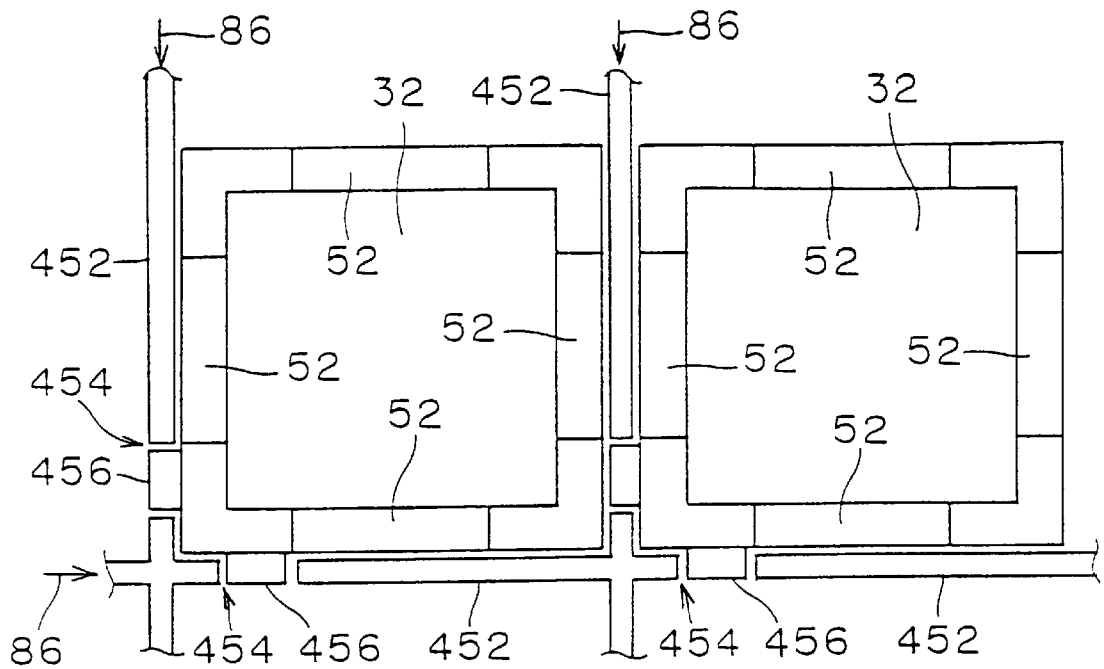
Figure 66:
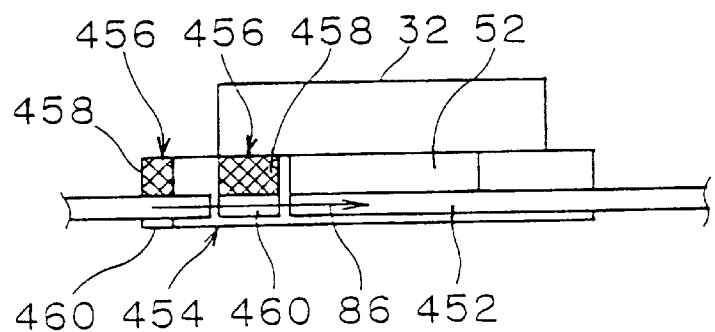

FIG. 63 is a sectional view showing a further example of a display panel with switches employing a photoelectric touch panel and FIG. 64 is a plan view showing the display panel with switches of FIG. 63 along with a detection circuit. Further, FIG. 65 and FIG. 66 are partially enlarged diagrams of these.

Photoelectric switches 450 in this example comprise a plurality of transparent light guide bodies 452, and these light guide bodies 452 are arranged in the form of a matrix around the exterior of lower portions of perpendicular pairs of side surfaces of push buttons 32 forming respective operation parts 30, and have slits 454 corresponding to the respective push buttons 32 halfway. Pairs of projections 456 project from the plurality of transparent light guide bodies 452 and the said perpendicular pairs of side surfaces of the respective push buttons 32, and these projections 456 are positioned in the slits 454 of the light guide bodies 452 corresponding to these push buttons 32. A plurality of light emitting devices 462 are adapted to make light 86 incident upon the respective light guide bodies 452 from single end sides thereof respectively. Further, a plurality of light emitting devices 466 receive the light 86 outgoing from other end sides of the respective light guide bodies 452 respectively and convert the same to electric signals.

The respective light guide bodies 452 are arranged in base portions of the aforementioned guide members 432 vertically and transversely dividing the respective operation parts 30 in positions raised from a display panel 2 by the stroke for the push buttons 32. The light guide bodies 452 can be thus arranged by double-molding the light guide bodies 452 in the guide members 432, for example. When the light guide bodies 452 are arranged in the guide members 432, notches for receiving the projections 456 and allowing vertical movement thereof are also provided in the guide members 432 in the same portions as the slits 454.

The respective light guide bodies 452 consist of transparent plastic, for example. Sectional shapes of these respective light guide bodies 452 may be square or circular.

Vertical and transverse single light guide bodies 452 are approximately arranged on one push button 32, as shown in FIG. 65. Each of the vertical and transverse light guide bodies 452 is provided with a slit 454 interrupting this light guide body 452 one for every push button 32.

In perpendicular two side surfaces of each push button 32 where the light guide bodies 452 are approximately arranged, two projections 456 projecting to be positioned in the two slits 454 of the light guide body 452 corresponding to this push button 32 are provided respectively.

As to each projection 456, referring also to FIG. 66, its upper portion is an opaque part 458 and a lower portion is a transparent part 460 in this example. When the push button 32 is raised, i.e., at an ordinary time, the transparent part 460 is positioned in the slit 454, for not only allowing but helping the light 86 passing through the light guide body 452 to pass through the slit 454 by this transparent part 460. When the push button 32 is pushed down, the opaque part 458 is positioned in the slit 454, for intercepting the light 86 passing through the light guide body 452 passing through the slit 454 by this opaque part 458.

Movable side magnetic bodies 52 may be rendered to also serve as the opaque parts 458 of the projections 456. This can be readily implemented by displacing the movable side magnetic bodies 52 toward the projections 456, or extending the same, as also understood from FIG. 66.

Each light emitting device 462 is an LED, a semiconductor laser or the like, for example. Each photoreceptor device 466 is a photodiode, a phototransistor or the like, for example. These are connected to both end portions of each light guide body 452 respectively.

The wavelength of the light 86 outputted from each light emitting device 462 and a light emission control system are similar to the case of FIG. 60. A microcomputer or the like which is used in a scanning system may be defined by that forming a detection circuit 468 described next, for example.

The detection circuit 468 which detects the position (coordinates) of an intersection of a shaded light guide body 452 in response to a signal from each photoreceptor device 90, specifies a pushed push button 32 in more concrete terms, is connected to the vertical and transverse respective photoreceptor devices 466, as shown in FIG. 64 in this example. However, such a detection circuit 468 may not be attached to this touch panel with switches, but a circuit or a microcomputer provided in a device to which this touch panel with switches is connected may be utilized.

Further, the movable side magnetic bodies 52 and the light guide bodies 452 are planarly separated from each other in FIG. 65. Therefore, it comes to that the light guide bodies 452 and the projections 456 do not appear in FIG. 63 in which the sections of the movable side magnetic bodies 52 appear correctly, while the light guide bodies 452 and the projections 456 have been illustrated in FIG. 63 for convenience. Referring to FIG. 63, the central push button 32 shows a state pressed with a finger 470.

The fact that stroke feeling and click feeling can be attained in this display panel with switches is similar to the already described other embodiments. When the push button 32 is pushed down in a switching operation, the two projections 456 of this push button 32 intercept passage of the light 86 through the slits 454 of the vertical and transverse two light guide bodies 452 corresponding to this push button 32. In more concrete terms, the opaque part 458 of each projection 456 is positioned in each slit 454, and this opaque part 458 intercepts the light 86 passing therethrough respectively as described above. Thus, the light 86 is not incident upon the two photoreceptor devices 466 which are connected to the light guide body 452 in which the light 86 is intercepted, whereby it comes to that these two circuits are turned off. Which push button 32 has been pushed is specified by the combination.

When pushdown of the push button 32 is stopped, the push button 32 returns by force of the movable side magnetic bodies 52 attracting the fixed side magnetic bodies 54. When the push button 32 returns, the transparent parts 460 forming the projections 456 of this push button 32 are positioned in the slits 454 of the light guide bodies 452, and relay passage of the light 86 therethrough. Thus, the light 86 is incident upon the aforementioned two photoreceptor devices 466, and these two circuits are turned on and return.

In this display panel with switches, the light 86 outgoing from the light emitting devices 462 is not flown through a space to be incident upon the photoreceptor devices 466, but the light 86 is guided through the interior of the light guide bodies 452 in a structure of intermitting this light 86 halfway by the projections 456. When the light 86 is flown through a space, divergence of the light 86 in the space is large and damping quantities of the light 86 up to entrance in the photoreceptor devices 466 are large, and hence there is a possibility of malfunctioning unless the outputs of the respective light emitting devices 462 are made to increase. Further, there is also such a possibility that the light 86 emitted from one light emitting device 462 is incident upon adjacent irrelevant photoreceptor devices 466 to malfunction. When the light guide bodies 452 are provided as in this embodiment, on the other hand, the light 86 is guided to the corresponding photoreceptor devices 466 through the interiors thereof, whereby there is no possibility that the same is incident upon the adjacent other photoreceptor devices 466 to malfunction. Further, the damping quantities of the light 86 up to entrance upon the photoreceptor devices 466 reduce as compared with the case of going out to the space to be diverged, whereby the output of each light emitting device 462 can be made small.

Further, this display panel with switches has such a structure that the opaque parts 458 are not merely introduced into/discharged from the slits 454 of the light guide bodies 452 for intermitting passage of the light 64 therethrough but the transparent parts 460 are introduced into the slits 454 when the light 86 is passed for relaying the light 86 by the transparent parts 460. When the transparent parts 460 are not introduced into the slits 454, the light 86 goes to the space and is diverged in the slits 454, whereby the ratio of the light 86 again entering the light guide bodies 452 reduces. Namely, the damping quantities of the light 86 in the slits 454 are large. Further, it cannot be said that there is absolutely no possibility that the light 86 diverged in one slit 454 enters an extremely near another slit 454 to malfunction. When the transparent parts 460 are introduced, on the other hand, the light 86 passing through the slits 454 is guided in these transparent parts 460, whereby the rate of going out to the space to be diverged extremely reduces. Namely, the damping quantities of the light 86 in the slits 454 extremely reduce. Further, there is no possibility that the same enters another light guide body 452 to malfunction either.

Thus, it is possible to eliminate the possibility for a malfunction from both by employing the light guide bodies 452 and the transparent parts 350, while such an effect can be attained that the output of each light emitting device 462 can be made small.

In addition, photoelectric switches are employed in this display panel with switches, whereby there is no problem of contact lives dissimilarly to the conventional display panel with switches of a resistor film type.

Further, while transparent electrodes forming a touch panel are not completely transparent in the display panel with switches of a resistor film type, it is not necessary to provide substances deteriorating light transmissivity such as transparent electrodes on the push buttons 32 in the display panel with switches according to this embodiment, whereby the same is particularly excellent in visibility of a display screen.

<Thirtieth Embodiment>

Figure 67:
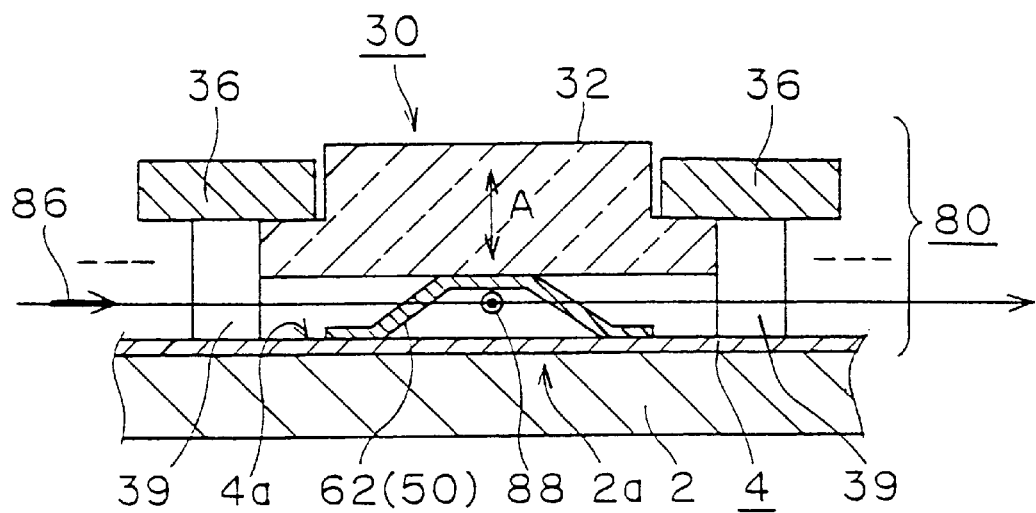

FIG. 67 is a longitudinal sectional view showing a display device with switches according to an embodiment employing a plate spring 62. Also in this example, light 86 is adapted to pass through notches 39 of support frames 36, so that the light 86 is intercepted by a push button 32 when the push button 32 is pushed down. The optical path of the light 86 is set to avoid the plate spring 62. This also applies to another light 88.

In each example employing a photoelectric touch panel, the plurality of operation parts 30 may not necessarily be arranged on the display panel 2 in the form of a matrix. For example, a plurality of operation parts 30 may be lined up in one direction (e.g., the transverse direction or the vertical direction) to make photoelectric switches 450 having light guide bodies 452, light emitting devices 90 and photoreceptor devices 84 correspond to the respective operation parts 30 respectively, for intermitting slits 454 of the respective light guide bodies 452 by projections 456 of push-buttons 32 corresponding thereto respectively as in an example shown in FIG. 68. Alternatively, the operation parts 30 and the photoelectric switches 450 may be arranged one by one.

Figure 68:
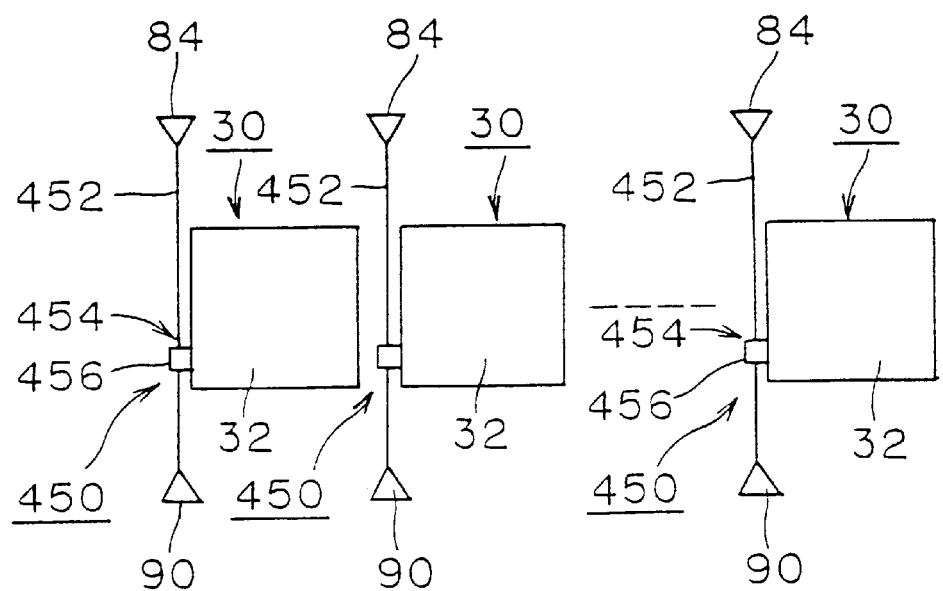

When one operation part 30 is provided for one light guide body 452 as in th example of FIG. 68, light may be rendered to pass through the slit 454 of the light guide body 454 contrarily to the aforementioned embodiment only when the push button 32 is pushed. In this case, a transparent part may be provided on an upper portion of the projection 456, while providing an opaque part on a lower portion, contrarily to the aforementioned embodiment. Such a modification is similar in the following embodiments of rotation type push buttons.

<5-1B. Combination with Rotation Type>

Figure 69:
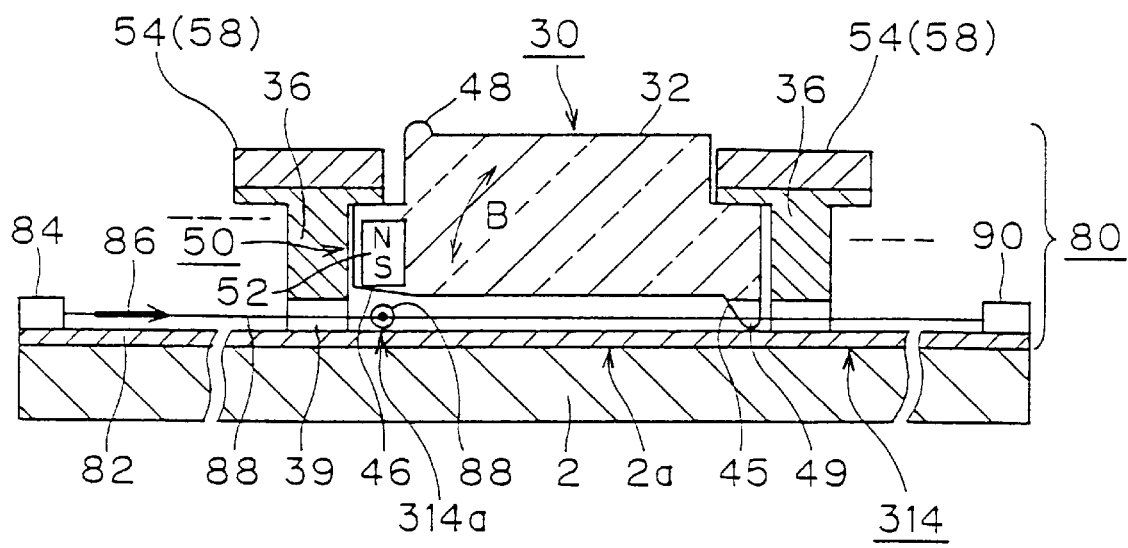
Figure 70:
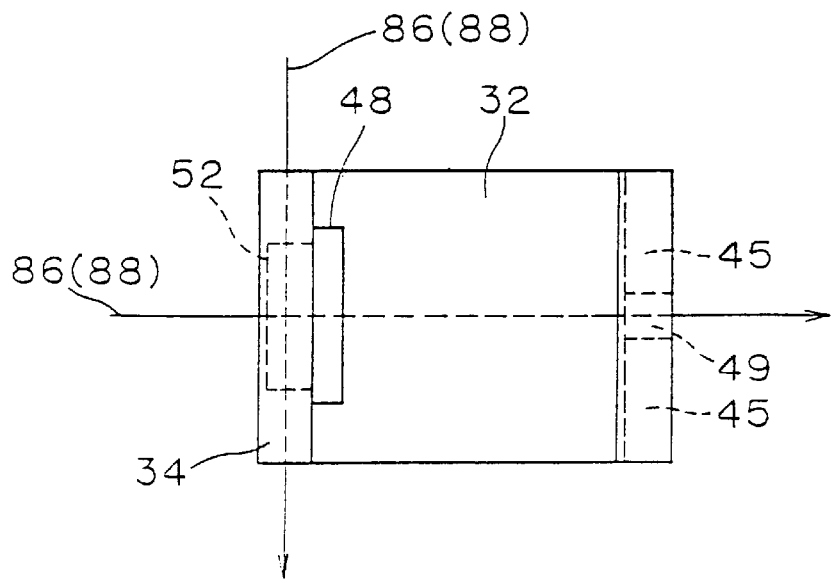

FIG. 69 is a partial sectional view of a display panel with switches in case of employing a rotation type push button. FIG. 70 is a plan view of a push button part in FIG. 69.

A thin type switch 80 in this embodiment of FIG. 69 comprises an operation part 30 similar to the embodiment of FIG. 28, and a photoelectric touch panel 114.

Figure 71:
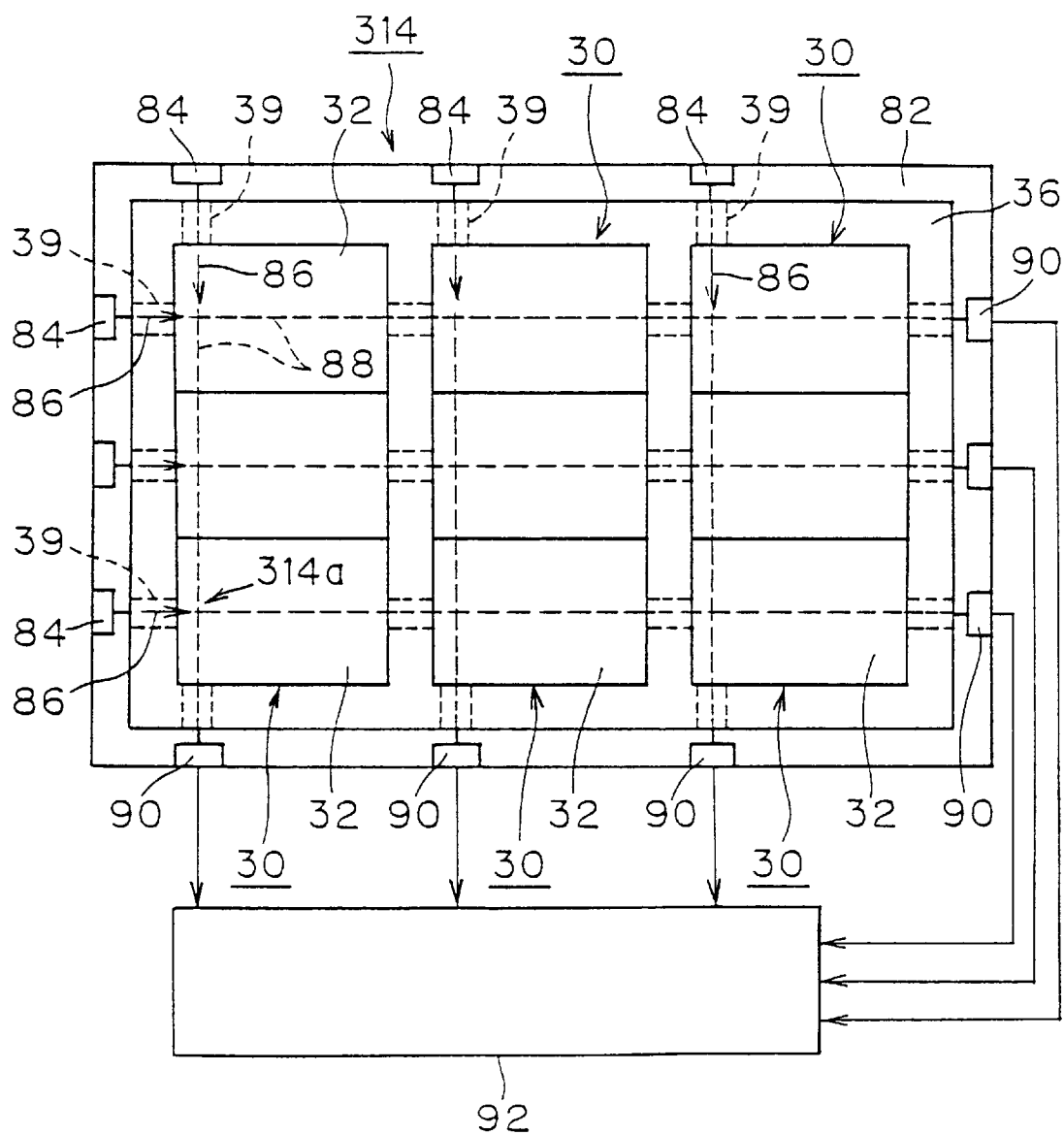

Referring also to FIG. 71, the touch panel 314 has a structure prepared by arranging a plurality of light emitting devices 84 outputting light 86 and a plurality of photoreceptor devices 90 receiving the light 86 and converting the same to electric signals vertically and transversely on marginal parts of a substrate 82 to be opposed to each other, and forming optical paths 88 in the form of a matrix in a space between a surface of the substrate 82 and push buttons 32. Portions around intersections between pairs of optical paths 88 are switch parts 314a respectively.

Holes or notches 38 and 49 for passing the light 86 are provided on a base portion of each support frame 36 and a forward end portion of a fulcrum projection 45 respectively. However, these portions may be formed by transparent resin or the like. Further, the fulcrum projection 45 may be divided in place of providing the hole or notch 49.

The optical path 88 of the vertical direction (vertical direction in FIG. 70) is positioned on a lower portion of an operation forward end portion 46 of the push button 32. In this example, this operation forward end portion 46 is obliquely cut and the area of the operation forward end portion 46 entering the vertical optical path 88 is made large so that the vertical optical path 88 can be more reliably intercepted by the portion of the operation forward end portion 46. Opaque sponge rubber or the like may be attached to the portion of this operation forward end portion 46 at need, and the area for intercepting the vertical optical path 88 can be made larger in this case.

A detection circuit 92 which detects the position (coordinates) of an intersection of an optical path 88 whose light quantity reduces in response to oat signal from each photoreceptor device 90, i.e., specifies a switch part 314a where an operation has been performed, is connected to the vertical and transverse respective photoreceptor devices 90, as shown in FIG. 71 in this example. However, such a detection circuit 92 may not be attached to this touch panel 114, but a circuit or a microcomputer provided in a device to which it is connected may be utilized.

When the push button 32 is pushed down, the push button 32, more concretely its operation forward end portion 46, enters the light path 88. When the push button 32 is opaque, the light 86 is completely shaded by the same. When the push button 32 is transparent or semi-transparent, the light quantity reduces by refraction or damping in the operation forward end portion 46 of the push button 32 and an output signal level from the corresponding photoreceptor device 90 reduces, whereby the fact that the push button 32 enters the optical path 88 can be detected, although the light cannot be completely shaded. In order to more strongly shade or damp the light 86 in the case where the push button 32 is transparent or semi-transparent, an end surface of the push button 32 positioned on the optical path 88 may be painted black etc. to be rendered opaque, or satin working, for diffusing the light 86 or mirror finishing of reflecting the light 86 may be performed on the end surface. Alternatively, movable side magnetic bodies 52 are opaque and hence the same may be arranged to be positioned on the optical path 88. Further, opaque sponge rubber or the like may be attached to the operation forward end portion 46, as described above.

<Thirty-First Embodiment>

Figure 72:
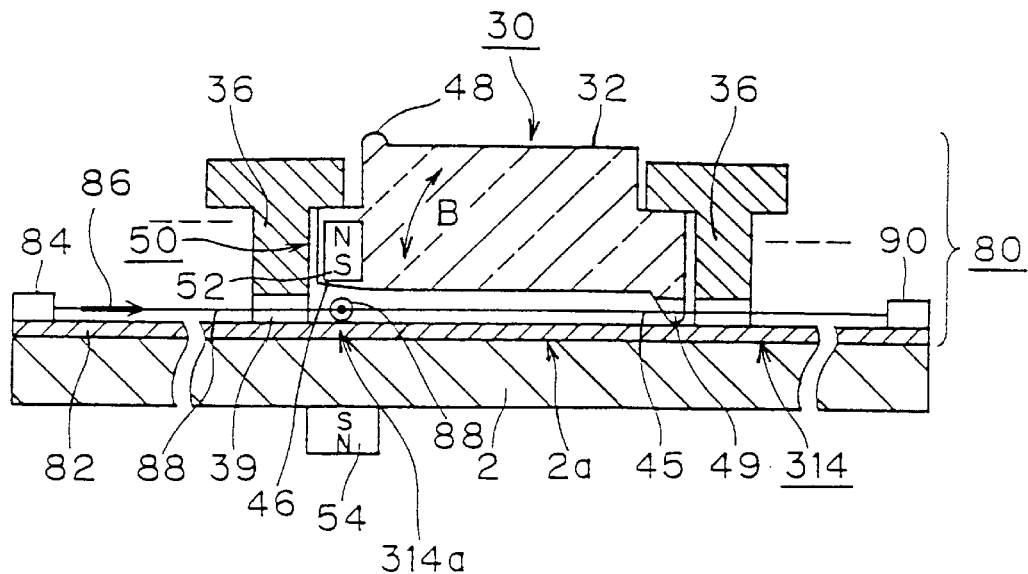

FIG. 72 is a sectional view partially showing another embodiment of a display panel with switches employing a thin type switch 80 whose touch panel is of a photoelectric type.

The thin type switch 80 in this embodiment of FIG. 72 comprises an operation part 30 similar to the embodiment of FIG. 28, and a photoelectric touch panel 314 similar to FIG. 69. Thus, the operation of this embodiment of FIG. 72 can be understood from the already described explanation.

<Thirty-Second Embodiment>

Figure 73:
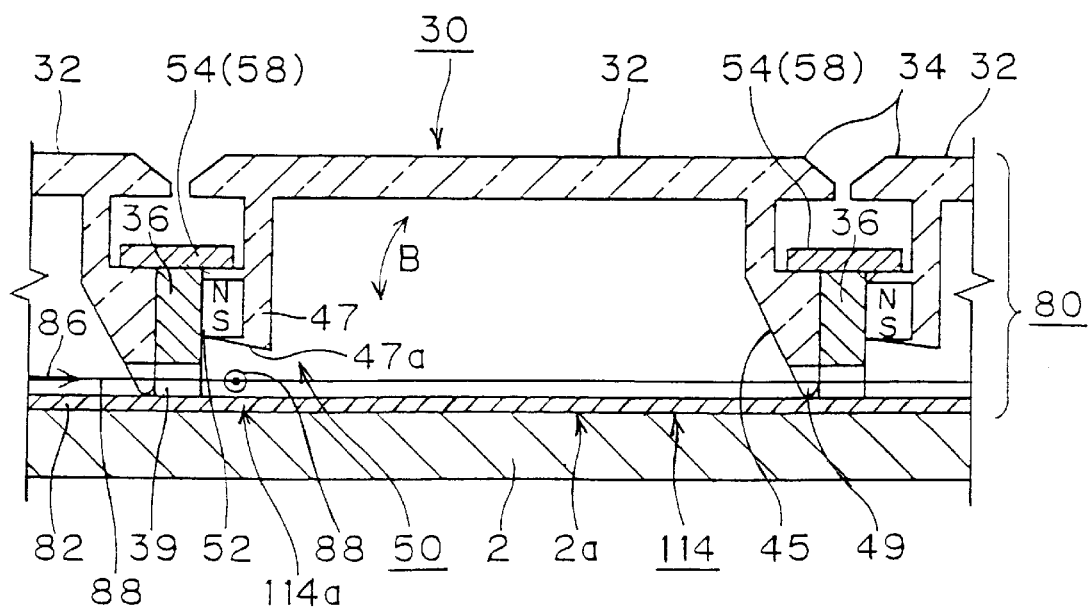

FIG. 73 comprises a push button 32 similar to FIG. 41 and a photoelectric type touch panel 314 similar to FIG. 72. Therefore, the operation of this embodiment of FIG. 73 can also be understood from the already described explanation.

<Thirty-Third Embodiment>

Figure 74:
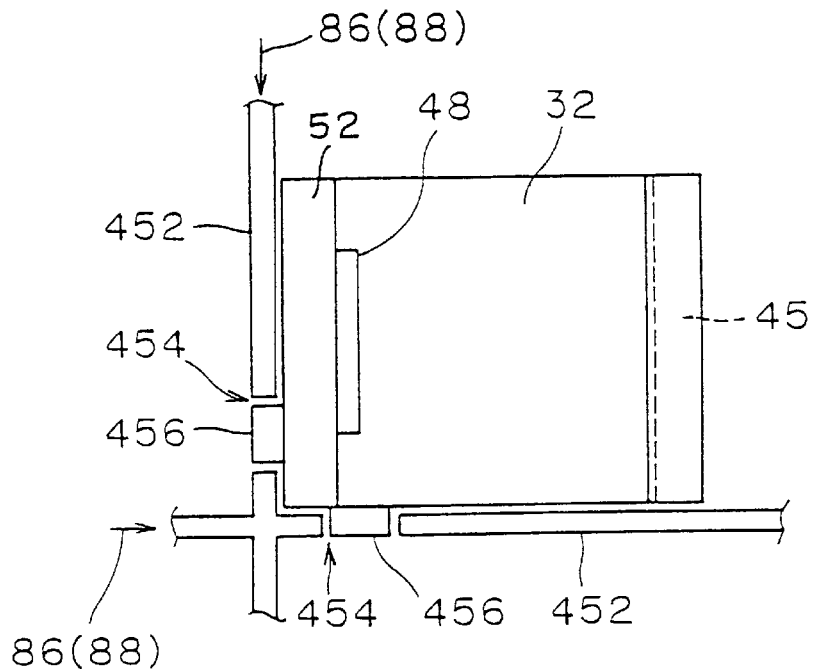

FIG. 74 is a plan view in case of forming projections 456 similar to the translation type push button 32 of FIG. 65 as to a rotation type push button 32. The operation in this structure of FIG. 74 can also be understood from the description of FIG. 65.

<5-2. Ultrasonic Wave Type Touch Panel>
<5-2A. Combination with Translation Type>

<Thirty-Fourth Embodiment>

Figure 75:
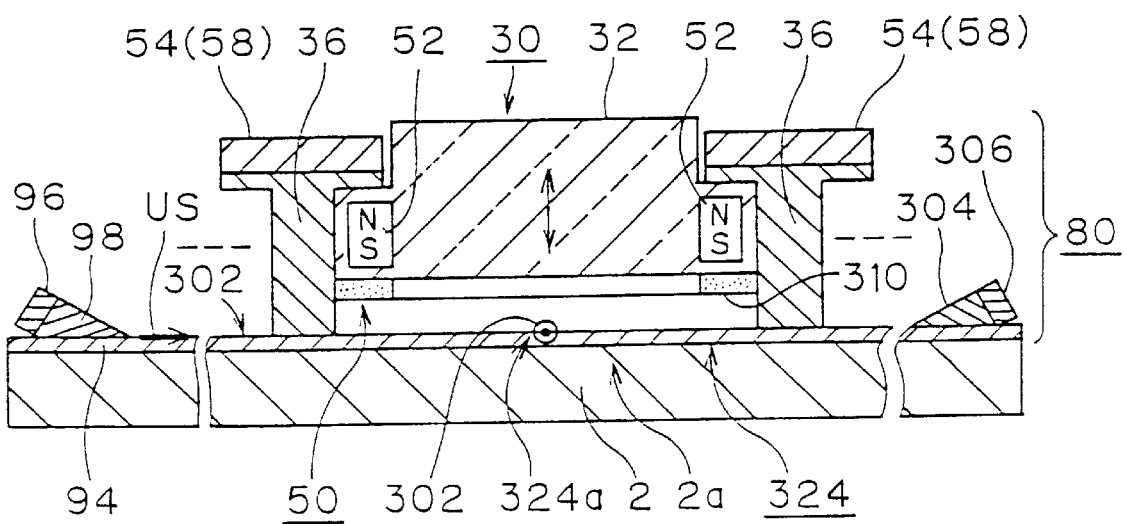
FIG. 75 to FIG. 84 are explanatory diagrams of a further embodiment of the present invention which is formed by utilizing ultrasonic wave type touch switches.

FIG. 75 is a sectional view partially showing an embodiment of a display panel with switches employing a thin type switch 80 having a touch panel of an ultrasonic wave type and a push button of a translation type, which can provide stroke feeling and click feeling.

The thin type switch 80 in this embodiment of FIG. 75 comprises an ultrasonic wave type touch panel 324 and an operation part 30 similar to the embodiment of FIG. 15.

This touch panel 324 is similar to a touch panel described in U.S. Pat. No. 5,177,327, for example.

Figure 76:
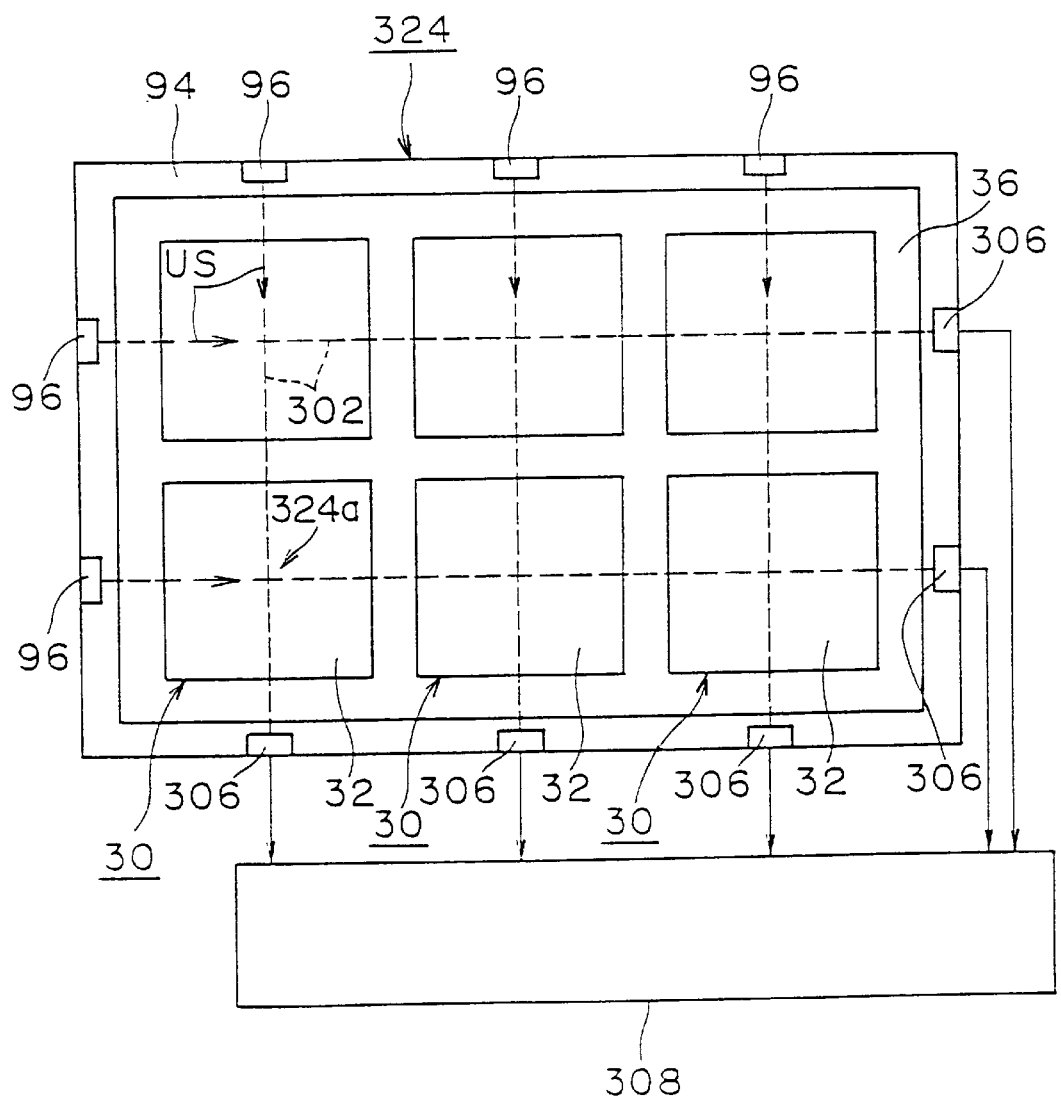

Namely, this touch panel 324 has a structure prepared by vertically and transversely arranging a plurality of oscillation elements 96 outputting ultrasonic waves US and a plurality of receiving elements 306 receiving the ultrasonic waves US and converting the same to electric signals on surfaces of marginal parts of a substrate 94 to be opposed to each other and forming ultrasonic wave paths 302 in the form of a matrix on the surface of the substrate 94, referring also to FIG. 76. Portions around intersections of pairs of ultrasonic wave paths 302 are switch parts 324a respectively. In this case, directivity of the ultrasonic waves US is extremely high and hence there is no apprehension that the ultrasonic waves US propagating through one ultrasonic wave path 302 enter the adjacent ultrasonic wave path 302 to interfere with the same, in general.

The substrate 94 is a transparent or semi-transparent glass substrate, for example.

The ultrasonic waves US are surface acoustic waves in this example, and the ultrasonic waves US from the oscillation elements 96 are guided to the surface of the substrate 94 via waveguide paths 98, while the ultrasonic waves US on the surface of the substrate 94 are guided to the receiving elements 306 via waveguide paths 304.

The respective oscillation elements 96 and the respective receiving elements 306 are piezoelectric vibrators, for example.

A detection circuit 308 which detects the position (coordinates) of an intersection of an ultrasonic wave path 302 where the ultrasonic waves US are damped in response to a signal from each receiving element 306, i.e., specifies a switch part 324a where an operation has been performed, is connected to the vertical and transverse respective receiving elements 306, as shown in FIG. 76 in this example. However, such a detection circuit 308 may not be attached to this touch panel 324, but a circuit or a microcomputer provided in a device to which it is connected may be utilized.

In general, an operation of absorbing the ultrasonic waves US and clamping the same is performed by touching the surface of the substrate 94 forming such a touch panel 324 with a finger or the like, and stroke feeling cannot be attained as such since there is no movable part and a push-in stroke is zero.

On the other hand, this embodiment is formed to damp the ultrasonic waves US by pushing down the push button 32. Thus, an ultrasonic wave absorber 310 is provided on a marginal part of a lower surface of the push button 32. The ultrasonic wave absorber 310 is properly soft, excellently absorbs the ultrasonic waves US, and is rubber such as silicone rubber or urethane rubber, for example. This ultrasonic wave absorber 310 may be provided at least on a portion positioned in the ultrasonic wave path 302.

However, the push button 32 may be made of resin having elasticity or the like, and the ultrasonic wave absorber 310 may not be provided in this case since the ultrasonic waves US can be absorbed and damped by the push button 32 itself.

The support frame 36 generally consists of hard resin or the like and hardly absorbs the ultrasonic waves US, whereby there is no inconvenience even if the same is present on the ultrasonic wave path 302. Granted that there is inconvenience, a notch may be provided in the base portion of the support frame 36 which is positioned on the ultrasonic wave path 302 or the like.

When the push button 32 is pushed down, the ultrasonic wave absorber 310 comes into contact with the ultrasonic wave path 302 on the surface of the substrate 94, the ultrasonic waves US are absorbed by this ultrasonic wave absorber 310 so that the same are damped, and the output signal level from the corresponding receiving element 306 reduces, whereby it is possible to detect a switch part 324a in which an operation has been performed.

Thus, the stroke for pushing in the push buttons 32 can be ensured in this thin type switch 80, whereby clear stroke feeling can be attained, dissimilarly to the case of the independent conventional photoelectric touch panel. Further, click feeling can also be attained in these operation parts 30, as described above.

While there has been such a problem in the independent conventional ultrasonic wave type touch panel that the same malfunctions when foreign matters (e.g., bugs, dust or the like) adhere to its surface since the ultrasonic waves are absorbed by the same, no malfunction is caused in this thin type switch 80 even if foreign matters such as bugs or dust adhere to the push buttons 32. Thus, reliability is high.

The remaining characteristics are similar to the case of employing resistor film type or photoelectric touch switches.

Figure 77:
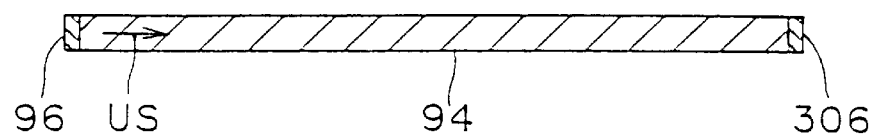

As the ultrasonic waves US, distortional waves propagating through the interior of the substrate 94 may be utilized as in an example shown in FIG. 77, in place of the aforementioned surface acoustic waves. In this case, an oscillation element 96 and a receiving element 306 are mounted on opposite end surfaces of the substrate 94. This system is also called an internal waveguide type.

Also in this case, the ultrasonic waves US (distortional waves) propagating through the interior are damped when the push button 32 is pushed down and the ultrasonic wave absorber 310 is pressed against the substrate surface on the path of the ultrasonic waves US, when the same is slightly strongly pressed than the case of utilizing the surface acoustic waves in more concrete terms, it is possible to detect the fact that the push button 32 has been pushed down.

<Thirty-Fifth Embodiment>

FIG. 75 is a sectional view partially showing an embodiment of a display panel with switches employing a thin type switch 80 having a touch panel of an ultrasonic wave type and a push button of a translation type, which can provide stroke feeling and click feeling.

Figure 78:
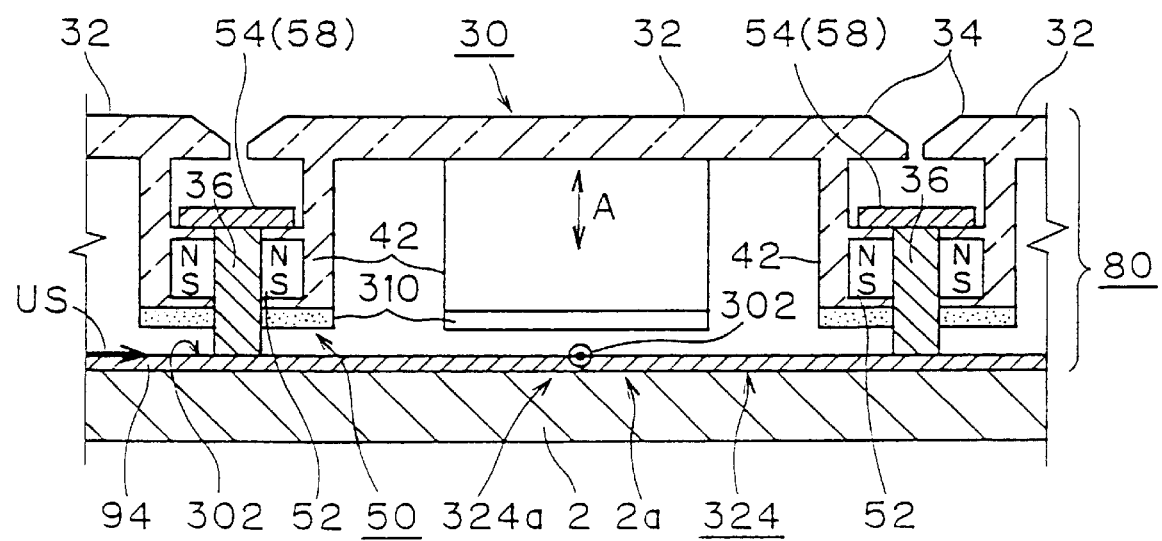

The thin type switch 80 in this embodiment of FIG. 78 is a combination of an operation part 30 similar to the embodiment of FIG. 22 and an ultrasonic wave type touch panel 324 similar to the embodiment of FIG. 75, and attains function/effect similar to those previously described as to the respective embodiments. However, an operation of a switch part 324a of the touch panel 324 is performed through ultrasonic wave absorbers 310 which are provided on lower surface parts of leg portions 42 of the push button 32.

<5-2B. Combination with Rotation Type>

<Thirty-Sixth Embodiment>

Figure 79:
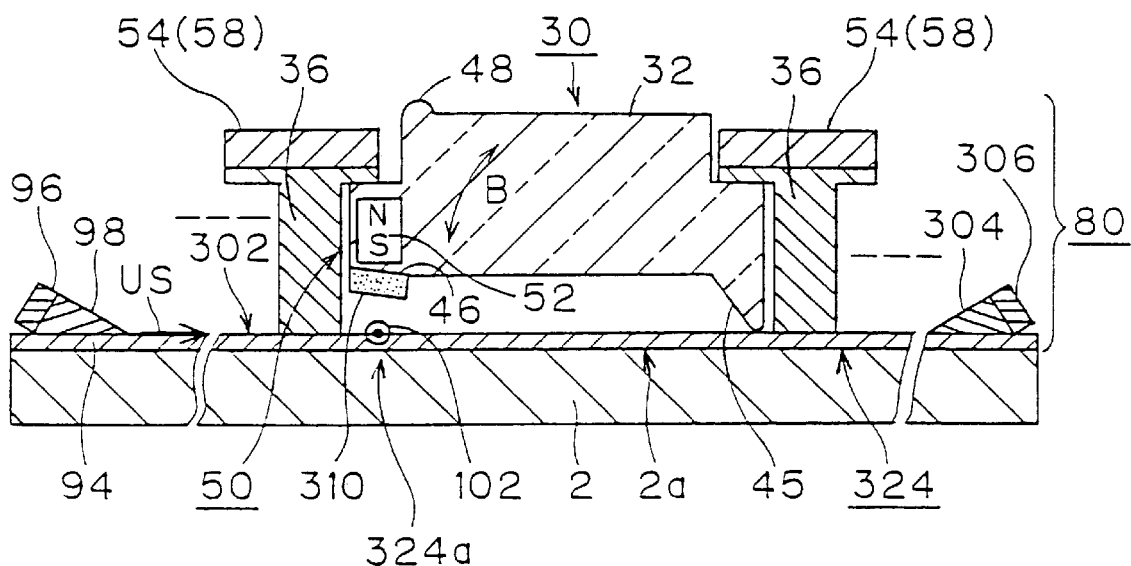
Figure 80:
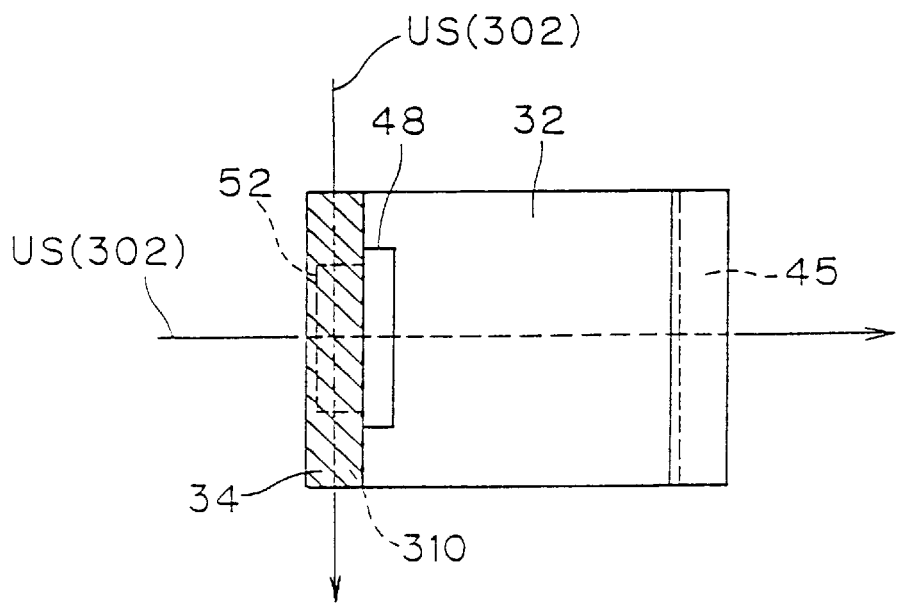
Figure 81:
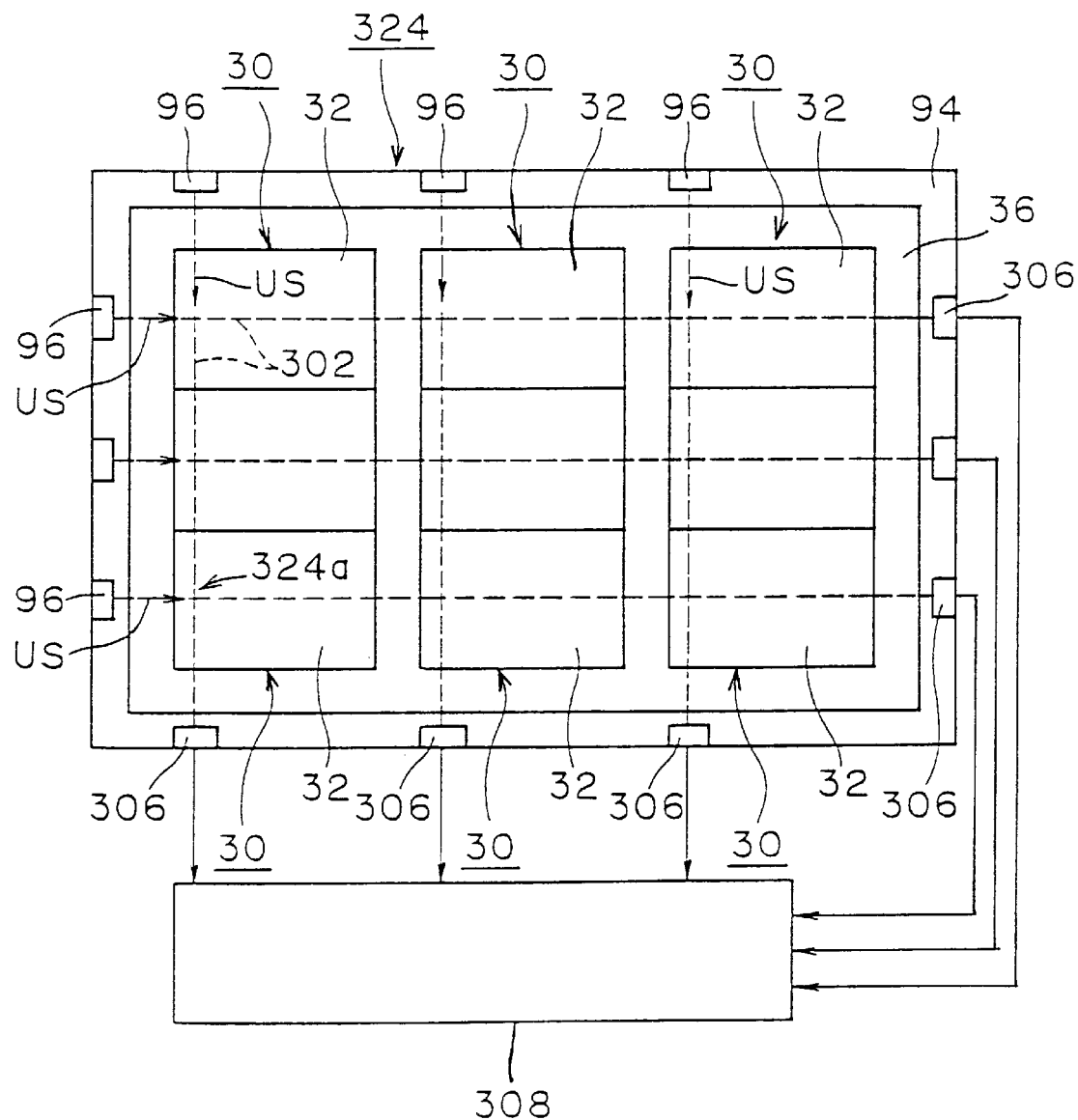

FIG. 79 is a sectional view partially showing an embodiment of a display panel with switches employing a thin type switch 80 whose touch panel is of an ultrasonic wave type. FIG. 80 is a plan view of a push button part in FIG. 79. Further, FIG. 81 is a conceptual plan view of the overall panel.

The thin type switch 80 in this embodiment of FIG. 79 applies a substance prepared by mounting an ultrasonic wave absorber 310 to a push button 32 which is similar to the embodiment of FIG. 28 to operation of an ultrasonic wave type touch panel 324 which is similar to FIG. 75. Therefore, structures and operations of respective parts can be understood from the already described explanation as to FIG. 28 and FIG. 75 to FIG. 77. As understood from FIG. 81, however, ultrasonic wave paths 302 intersect with each other not at the centers of the respective push buttons 32, but immediately under movable side magnetic bodies 52 of FIG. 79. In correspondence to the fact that the push buttons 32 are of a rotation type, operation forward end portions 46 are rendered slant faces, so that the ultrasonic wave absorbers 310 are mounted on the slant faces.

<Thirty-Seventh Embodiment>

Figure 82:
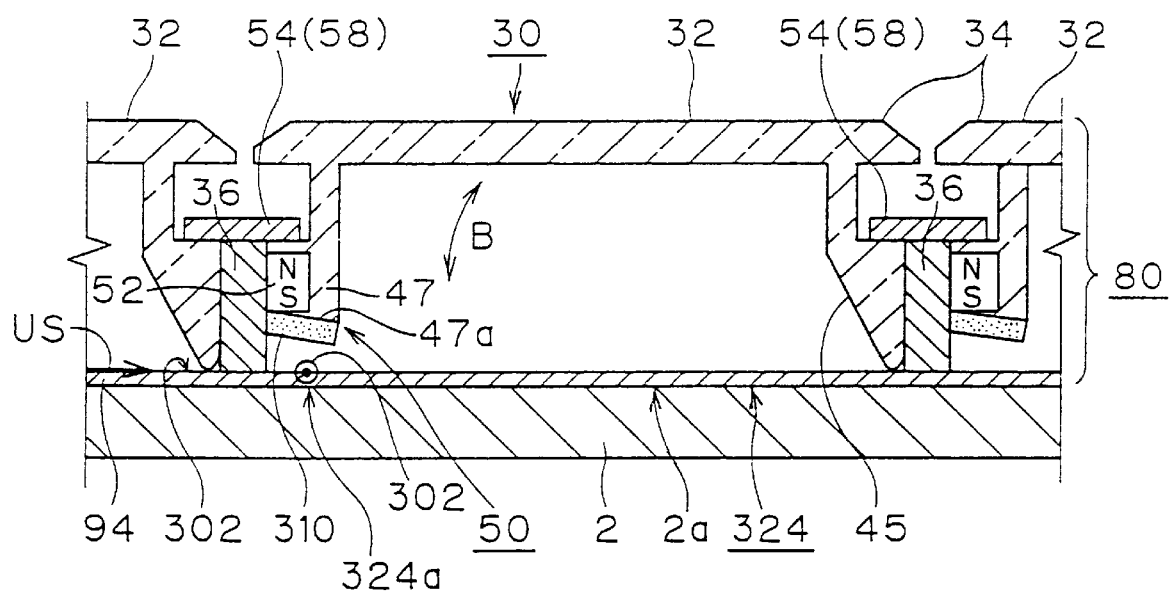

FIG. 82 is a sectional view partially showing a further embodiment of a display panel with switches employing a thin type switch 80 whose touch panel is of an ultrasonic wave type.

The thin type switch 80 in this embodiment of FIG. 82 utilizes the push button 30 of FIG. 41 to operation of an ultrasonic wave type touch panel 324 which is similar to FIG. 75. Therefore, the structures and operations of respective parts can be understood from the already described explanation as to FIG. 41 and FIG. 75.

<5-3. Additional Description to Photoelectric Type and Photoelectric Type>

Figure 33:
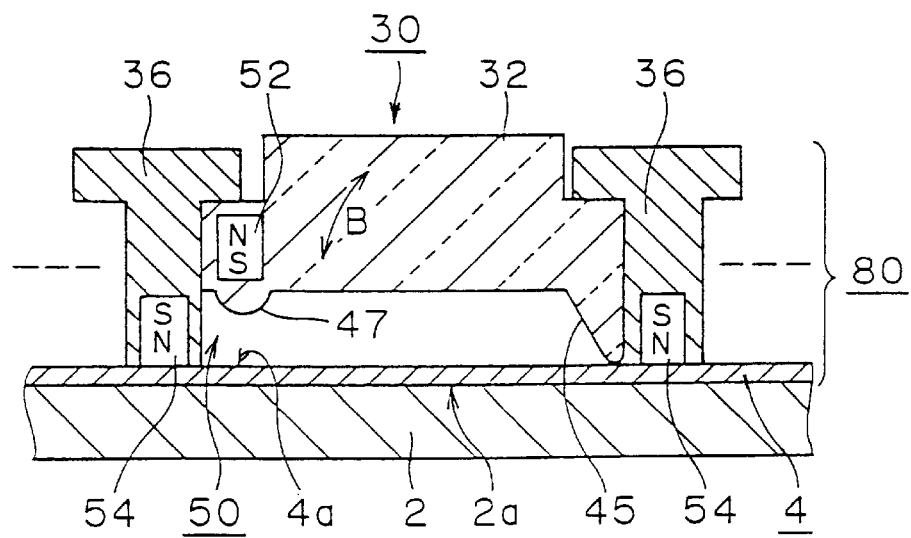
Figure 83:
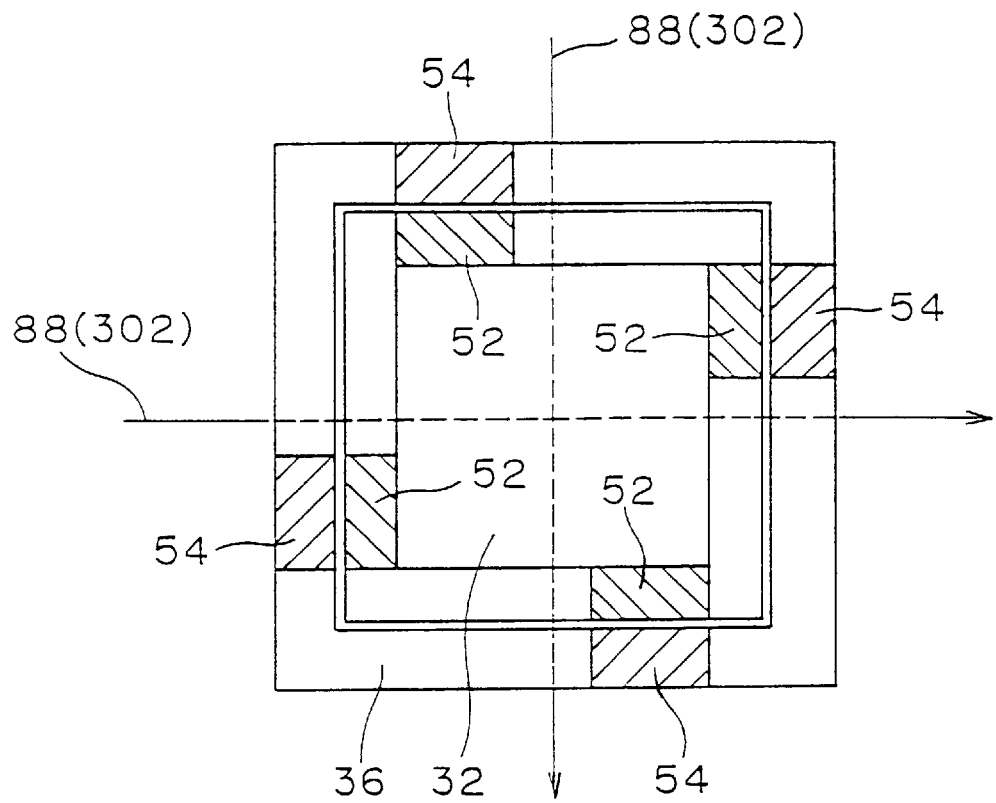
Figure 84:
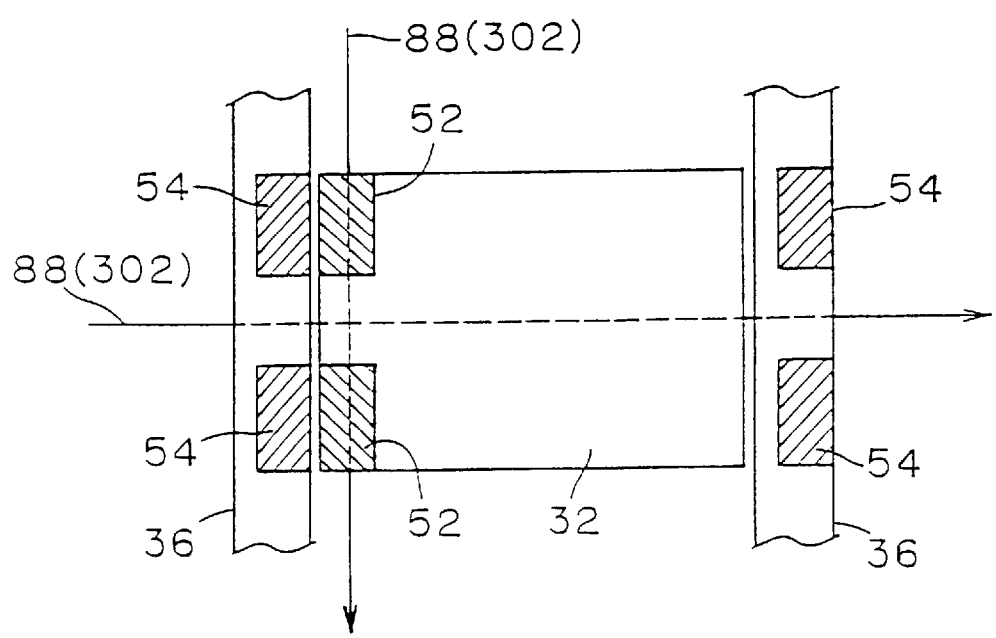

Also when the aforementioned photoelectric touch panels 314 and the ultrasonic wave type touch panels 324 are employed, return means 50 of the same idea as that previously shown in FIG. 33, FIG. 34 or FIG. 42 can be utilized for the return means 50, as a matter of course. Further, it is also possible to employ the push button 32 shown in FIG. 35 or FIG. 36. When the fixed side magnetic bodies 54 obstruct transmission of the light 86 or the ultrasonic waves US in this case, these may be arranged to be out of an optical path 88 or an ultrasonic wave path 302, as shown in FIG. 83 (translation type) or FIG. 84 (rotation type), for example.

<6. Characteristics in Respective Embodiments>

<6-1. General Characteristics>

Figure 85A:
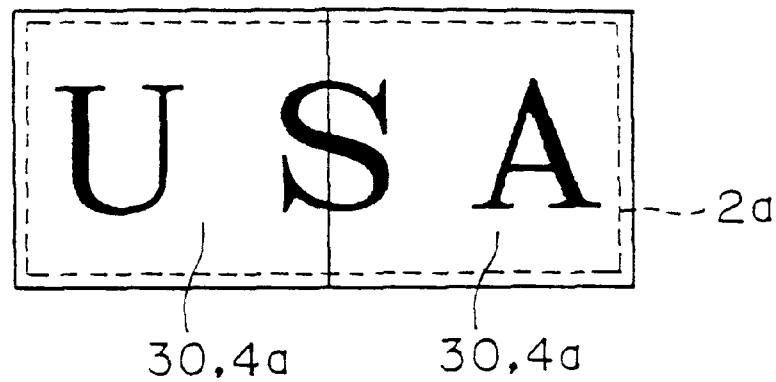
FIG. 85A and FIG. 85B are explanatory diagrams of display of characters.
Figure 85B:
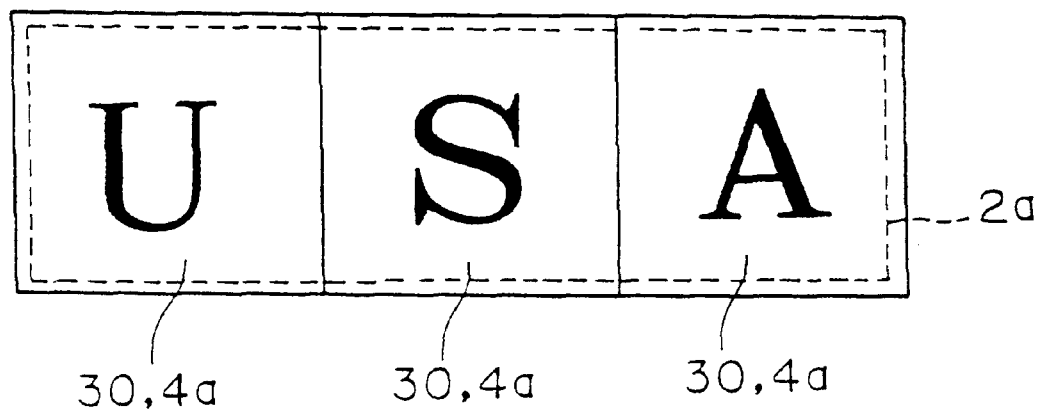

According to the display panel with switches of the aforementioned each embodiment, the following effects are attained as compared with the conventional display panel with switches providing a switching unit on a display panel. Namely, it is also possible to arrange a plurality of unit operation parts 30 and switch parts 4a corresponding thereto together on one large display region 2a of a display panel 2, i.e., to provide, under a plurality of unit operation parts 30 which are adjacent thereto and switch parts 4a corresponding thereto, one (common) display region 2a displaying contents selected by these, as illustrated in FIG. 85A or FIG. 85B, for example. Thus, it is possible to readily make the display region of the display panel 2 and the operation parts selecting its display contents substantially large. Consequently, display of continuous characters, large figures, a bar graph and the like is enabled, for example. Further, it is possible to freely perform arrangement/structure of operation parts and a display region in one display panel with switches by changing shapes, sizes etc. of the respective unit operation parts 30 and the switch parts 4a corresponding thereto, and the display region 2a corresponding to these.

<6-2. Characters Specific to Rotation System>

Advantages of the embodiments employing the rotation type push buttons 32 described in relation to the resistor film type touch panels also correspond to the case of employing the photoelectric touch panels 314 or the ultrasonic wave type touch panels 324 for the touch panels.

Namely, when the push buttons 32 are of a translation type, the same are inclinedly pushed down as already described while how the same are inclined is not constantly decided since it depends on the pushed portions. Therefore, it is necessary to devise the positions of the switch parts 314a and 324a of the touch panels 114 and 124 or make the areas of the switch parts large, to be capable of coping with that. In the rotation type respective embodiments, on the other hand, the push buttons 32 merely rotate, whereby the positions of the operation forward end portions 46 operating the switch parts of the touch panels are specified. Therefore, the positions of the switch parts 314a and 324a provided on the touch panels 314 and 324 are also specified. Namely, the switch parts 314a and 324a of the touch panels 314 and 324 may be present at least under the operation forward end portions 46 or the operation projections 47, and it is not necessary to indiscreetly widen the areas thereof.

<7. Other Examples>

<7-1. In-Plane Magnetization>

Figure 86:
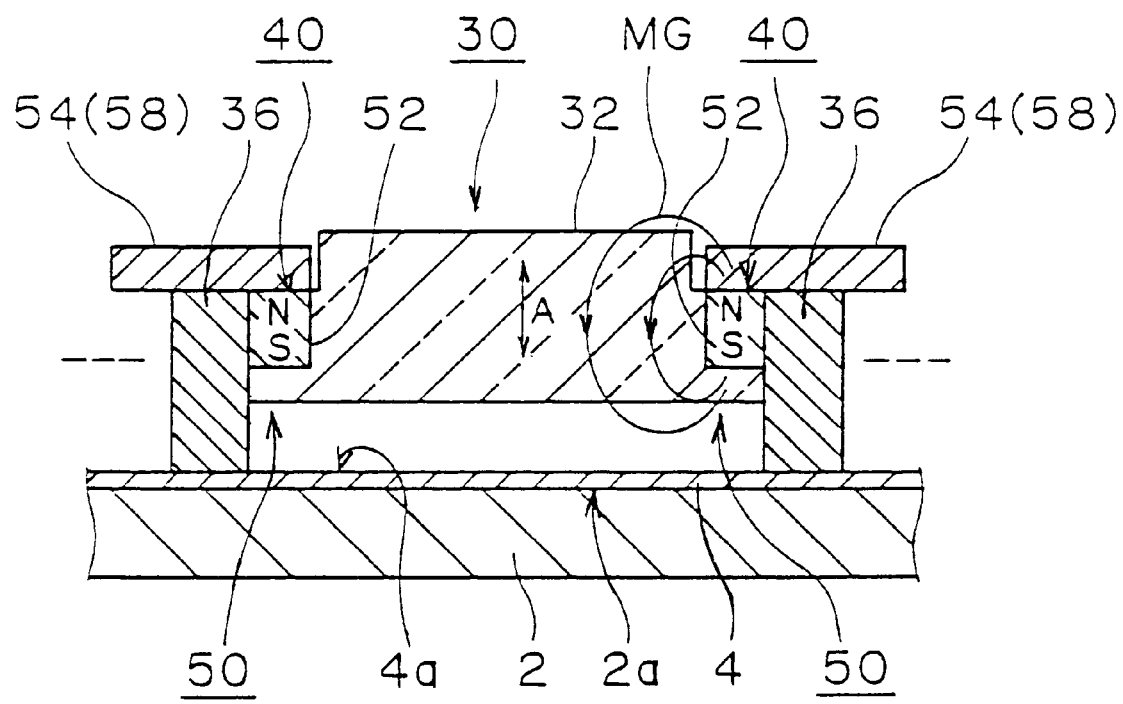
FIG. 86 is an explanatory diagram of an example utilizing permanent magnets which are not in-plane magnetized.

In the permanent magnets employed in the return means of the already described each embodiment, N poles and S poles are formed on opposite surfaces of the permanent magnets. In FIG. 86 corresponding to the embodiment of FIG. 15, for example, N poles are formed on upper end surfaces of permanent magnets of movable side magnetic bodies 52, and S poles are formed on lower end surfaces. Lines MG of magnetic force leak around the exterior of the permanent magnets in case of such a structure, and embodiments improving this point are now described. The following embodiments embodies "in-plane magnetization", i.e., such an idea that S poles and N poles are formed in surfaces opposed to magnetic metals and no magnetic poles are formed in other surfaces.

<7-1A. In-Plane Magnetization of Permanent Magnet in Translation Type>

<Thirty-Eighth Embodiment>

Figure 87:
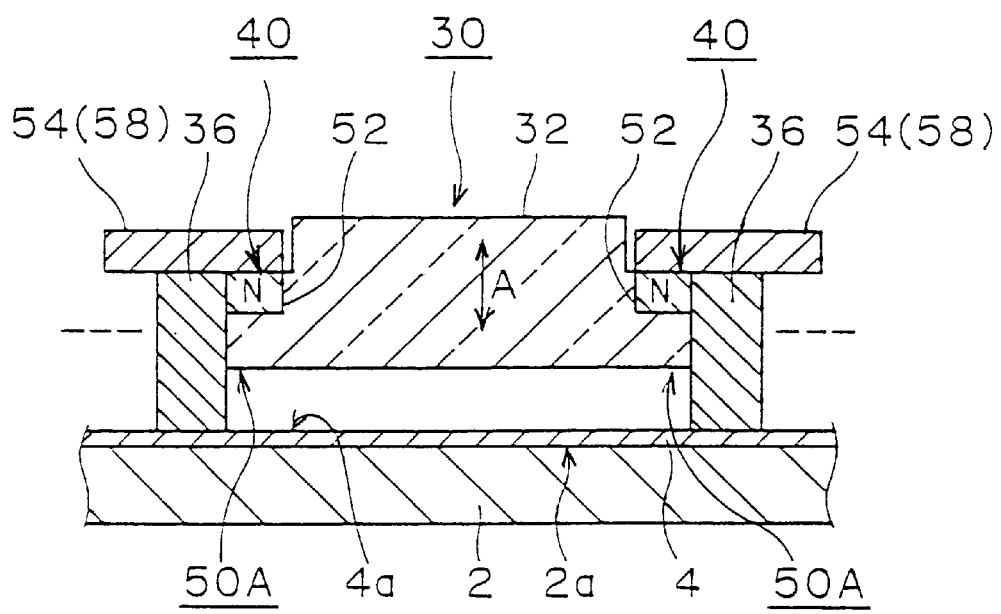
FIG. 87 to FIG. 94 are explanatory diagrams of a further embodiment of the present invention utilizing in-plane magnetized permanent magnets.

FIG. 87 is a sectional view partially showing an example of a display panel with switches utilizing in-plane magnetized permanent magnets for return means. Parts identical or corresponding to the embodiment of FIG. 86 are denoted by the same reference numerals, and difference between the same and the embodiment of FIG. 86 is mainly described below.

The display panel with switches according to the embodiment of FIG. 87 comprises return means 50A of the following structure, as that corresponding to the return means 50 of the embodiment of FIG. 86:

Namely, the return means 50A comprises fixed side magnetic bodies 54 which are provided on upper parts of support frames 36 serving as guide members for enclosing a push button 32, and movable side magnetic bodies 52 which are provided on marginal parts of the push button 32 in portions located under these fixed side magnetic bodies 54 to be opposed to the movable side magnetic bodies 54, in this example. The fixed side magnetic bodies 54 are made of a magnetic metal similarly to the embodiment of FIG. 86.

On the other hand, the movable side magnetic bodies 52 are permanent magnets which are so in-plane magnetized that N poles and S poles are present in single surfaces (i.e., in upper surfaces) directed to the counter fixed side magnetic bodies 54 and no magnetic poles are present in planes opposite thereto (i.e., in lower surfaces).

Figure 88:
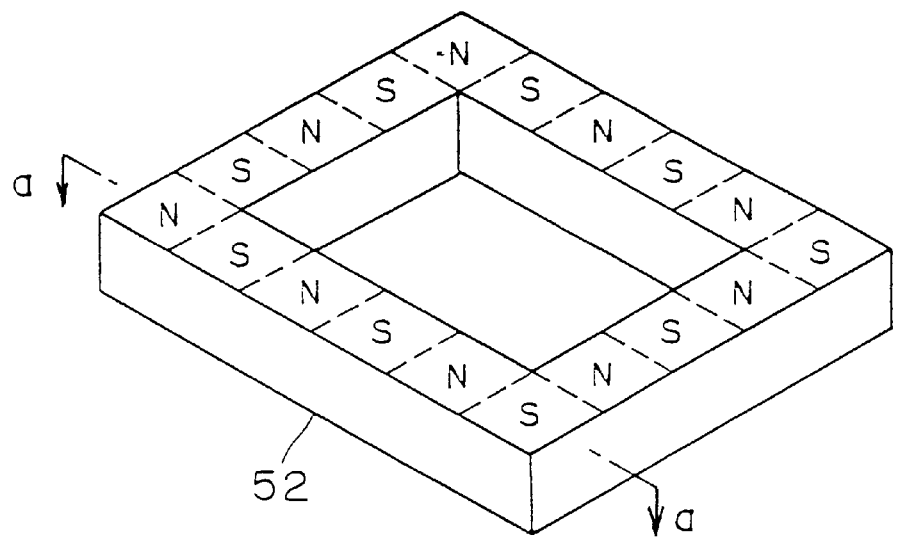

FIG. 88 shows an example of this movable side magnetic body 52. The movable side magnetic body 52 is in the form of a square ring in this example, and N poles and S poles are alternately formed in a peripheral direction of its upper surface. No magnetic poles are formed on a lower surface.

Figure 89:
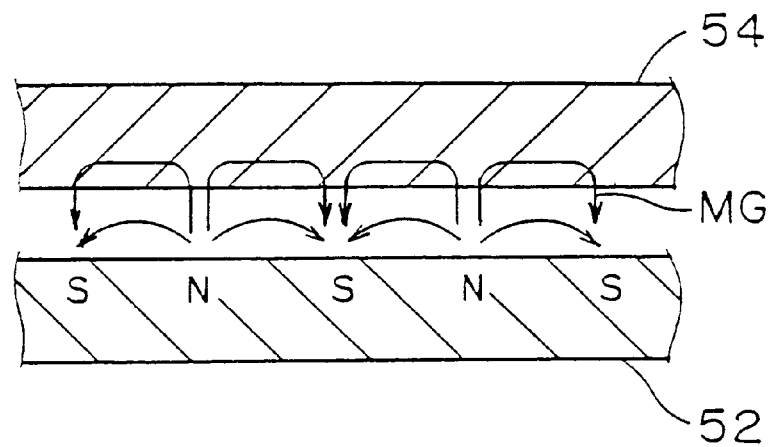

FIG. 89 shows a section of the movable side magnetic body 52 along a line a—a direction in FIG. 88, and distribution of lines MG of magnetic force is also described.

Figure 90:
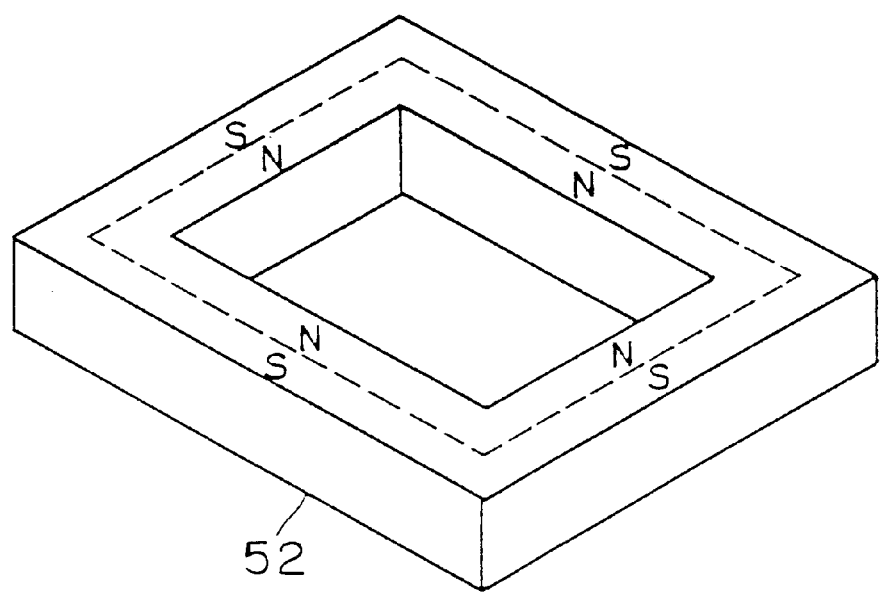

The manner of in-plane magnetization of the movable magnetic body 52 may be that in which N poles and S poles are concentrically present on an upper surface of a movable side magnetic body 52, as in an example shown in FIG. 90.

Figure 91A:
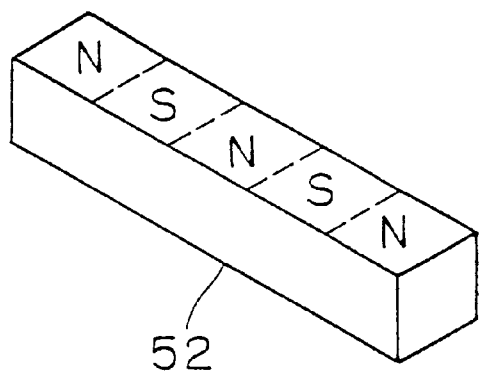
Figure 91B:
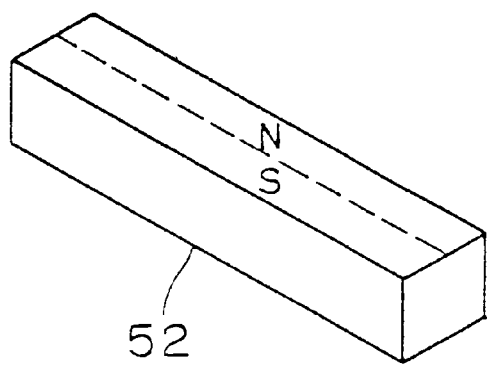

In place of employing the aforementioned annular movable side magnetic body 52, an in-plane magnetized bar-shaped movable side magnetic body 52 may be provided on each side of a push button 32 as shown in FIG. 91A or FIG. 91B, for example, while an operation is possible when the same is provided at least on one side.

It is possible to attract the counter fixed side magnetic body 54 by the movable side magnetic body 52 which is a permanent magnet also by the aforementioned return means 50A, whereby return force can be supplied to the push button 32 similarly to the case of the return means 50 of the embodiment of FIG. 86.

In this return means 50A, further, the N poles and the S poles of the movable side magnetic body 52 which is a permanent magnet are present only on the upper surface directed to the counter fixed side magnetic body 54 and no magnetic poles are present on the lower surface, whereby the lines MG of magnetic force outgoing from the N poles of the movable side magnetic body 52 draw small closed loops for returning to the S poles adjacent in the same plane or passing through the opposed fixed side magnetic body 54 to return to the S poles in the same plane as shown in FIG. 89, for example, and spreading of the lines MG of magnetic force to the space is suppressed extremely small dissimilarly to the case of the embodiment employing the movable side magnetic bodies 52 of FIG. 86 which are magnetized in the thickness direction.

Particularly when the movable side magnetic body 52 which is a permanent magnet attracts the counter fixed side magnetic body 54, a substantially complete closed magnetic circuit is formed by the attracted fixed side magnetic body 54, whereby leakage of the lines of magnetic force to the space hardly takes place. In FIG. 87, therefore, lines of magnetic force entering/outgoing from the movable side magnetic body 52 cannot be illustrated, dissimilarly to the case of the embodiment of FIG. 86.

The spreading of the lines of magnetic force to the space is suppressed extremely small in the aforementioned manner, whereby the force of the movable side magnetic body 52 which is a permanent magnet attracting the counter fixed side magnetic body 54 also increases, whereby the strength of magnetization (remanent magnetism) of the movable side magnetic body 52 may be made small and a leakage magnetic field from the movable side magnetic body 52 reduces following this as a matter of course, and hence this also contributes to reduction of the leakage magnetic field.

Due to the aforementioned action, it is possible to suppress the leakage magnetic field from the operation part 30 extremely small. Even if a magnetic recording medium such as a magnetic card is approached to this display panel with switches, therefore, there is no apprehension that the recorded contents of this magnetic recording medium are disturbed by leakage magnetic fields from the operation parts 30.

Further, it is not necessary to particularly increase the thickness of the fixed side magnetic body 54 in this return means 50, whereby the overall display panel with switches may not be thickened.

<7-1B. In-Plane Magnetization of Permanent Magnet in Rotation Type>

<Thirty-Ninth Embodiment>

Figure 92:
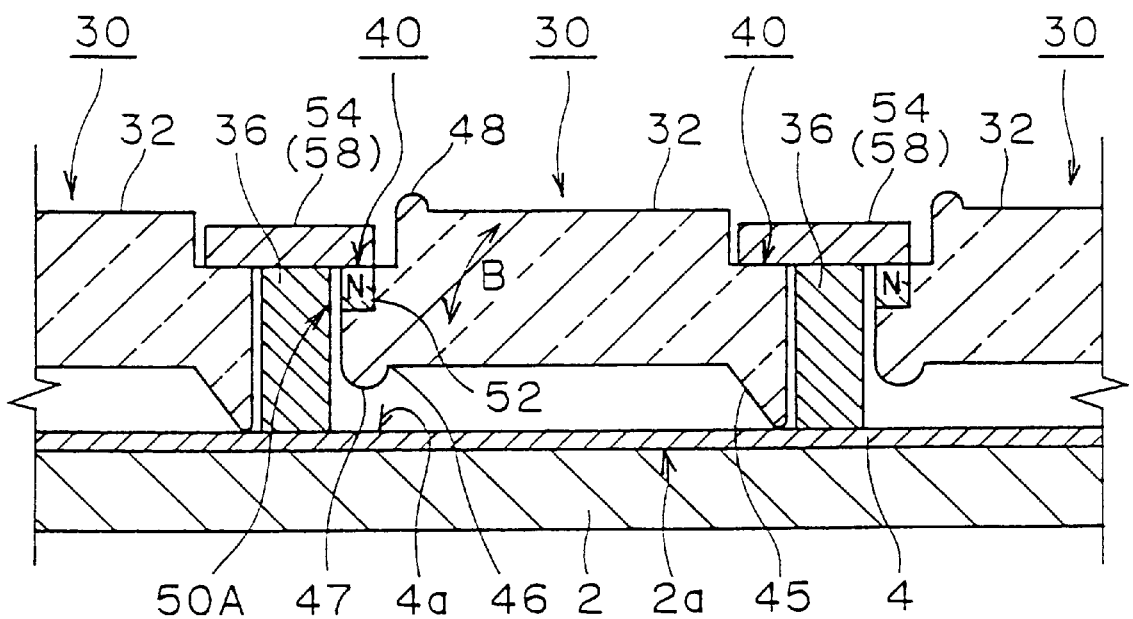
Figure 93:
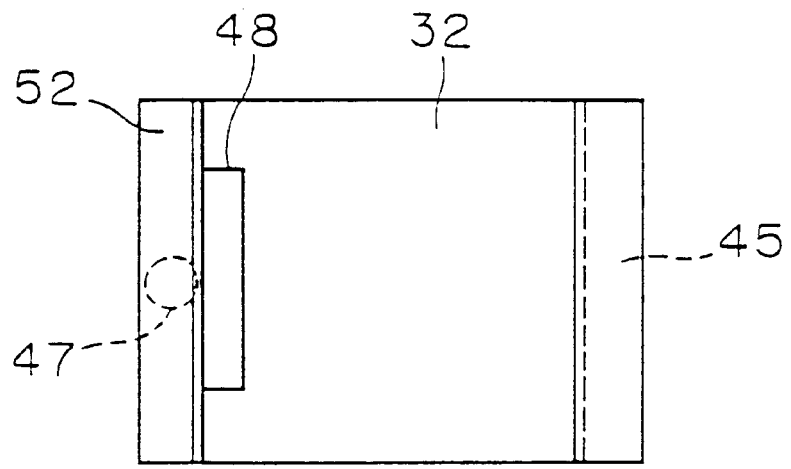

An embodiment shown in FIG. 92 shows an embodiment employing in-plane magnetized permanent magnets for push buttons 32 in a display device with switches of a rotation type which is similar to the already described rotation type embodiment of FIG. 28. FIG. 93 is a plan view of a push button in FIG. 92. Description is now made mainly with respect to difference between the same and the embodiment of FIG. 28 and the embodiment of FIG. 87.

Return means 50A employed in the embodiment of FIG. 92 is provided around an end portion which is opposite to a fulcrum projection 45 of each push button 32, i.e., around a side on the same side as the aforementioned operation forward end portion 46. This return means 50A comprises a fixed side magnetic body 54 which is provided on an upper portion of a support frame 36, and a movable magnetic body 52 which is provided on an end portion opposite to the fulcrum projection 45 of the push button 32 in a portion located under this fixed side magnetic body 54 to be opposed to the fixed side magnetic body 54.

The movable side magnetic body 52 is a magnetized permanent magnet which is so in-plane magnetized that N poles and S poles are present in one plane (i.e., in an upper surface) which is directed to the counter fixed side magnetic body 54 and no magnetic poles are present in a plane (i.e., in a lower surface) of an opposite side. In-plane magnetization of this movable side magnetic body 52 is identical to the example shown in FIG. 91A or FIG. 91B.

FIG. 93 shows an example of plane arrangement of the movable side magnetic body 52. This movable side magnetic body 52 may be provided on the overall opposite side of the fulcrum projection 45 as in this example, may be provided on a part around the central part of this side, or may be provided around both side end portions of this side. Which is selected may be decided in response to attractive force of this movable side magnetic body 52 and the fixed side magnetic body 54 etc. In every case, however, the counter fixed side magnetic body 54 is provided above this movable side magnetic body 52.

Also in this embodiment, the return means 50A has a structure substantially similar to that of the embodiment of FIG. 87, whereby a leakage magnetic field from an operation part 30 can be suppressed extremely small similarly to the case of the embodiment of FIG. 87, while such an effect that the overall display panel with switches may not be thickened can be attained.

<7-1C. Modification in Case of Employing In-Plane Magnetization>

Figure 94:
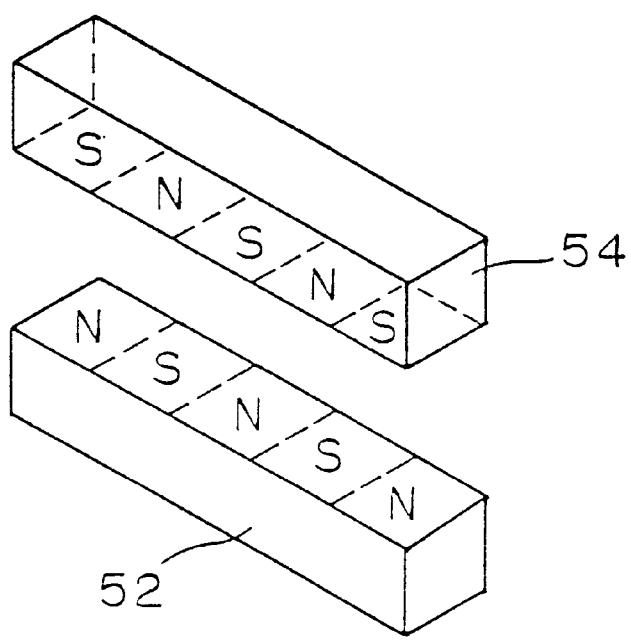

When the fixed side magnetic body 54 in the aforementioned each embodiment is also formed by a permanent magnet, it is preferable to perform such in-plane magnetization that N poles and S poles are alternate in a plane (i.e., a lower surface) opposed to the movable side magnetic body 52 in upper and lower respective surfaces of the fixed side magnetic body 54 so that no magnetic poles are present in the opposite plane (i.e., the upper surface). In this case, the respective magnetic poles of the in-plane magnetized movable side magnetic body 52 are so arranged as to be opposed to magnetic poles of reverse polarity in the fixed side magnetic body 52. When in-plane magnetization is made as N, S, N . . . in the peripheral direction of the upper surface of the movable side magnetic body 52, for example, in-plane magnetization is made as S, N, S . . . in the peripheral direction of the lower surface of the fixed side magnetic body 54. FIG. 94 shows a combination of the movable side magnetic body 52 of FIG. 91A and a fixed side magnetic body 54 which is in-plane magnetized in correspondence to this.

When both of the fixed side magnetic body 54 and the movable side magnetic body 52 are thus rendered permanent magnets which are in-plane magnetized in reverse polarity to each other, attractive force is more improved than the case where one is a simple (i.e., non-magnetized) magnetic body, whereby it is possible to improve return force in the return means 50A, i.e, pressing force required for turning on the switch region 4a of the touch panel 4 by pushing the push button 32. If attractive force may not be improved, strength of magnetization (remanent magnetism) of the fixed side magnetic body 54 and the movable side magnetic body 52 can be made small while it comes to that leakage magnetic fields from both magnetic bodies 54 and 52 reduce following this as a matter of course, whereby leakage magnetic fields from the operation part 30 can be suppressed further small.

<7-2. Magnetic Powder Utilization>

<Fortieth Embodiment>

Permanent magnets prepared by magnetizing bulk state magnetic materials are used in the aforementioned each embodiment. In the example shown in FIG. 86, for example, iron plates are employed as the fixed side magnetic bodies 54, while bulk state permanent magnets 44 are employed as the movable side magnetic bodies 52. When pushdown of the push button 3 2 is stopped and it returns upward. i.e., when the movable side magnetic body 54 attracts the magnetic metal plate 52 of the fixed side magnetic body 54, both directly strike and a relatively large sound of "click" comes out. There are many such applications that no troubles are caused even if such sounds come out, it may be unpreferable when employed for a device for a studio of a broadcasting station, for example.

While there is an idea of interposing an elastic material such as rubber between the fixed side magnetic body 54 and the movable side magnetic body 52 in order to make such a sound in return small, the number of parts and the number of assembling steps increase in this case, and cost increase is large.

In order to make the sound in return of the push button 32 small, it is preferable to make the fixed side magnetic bodies 54 and the movable side magnetic bodies 52 in the aforementioned each embodiment resin magnetic bodies prepared by mixing magnetic powder into resin. Typical examples of this resin are various types of nylons. The magnetic powder consists of a ferromagnetic metal, for example, preferably various types of ferrites. Such resin magnetic bodies can be molded in manufacturing, and are excellent in workability. Further, it is easy to make in-plane magnetization after manufacturing, as shown in the respective examples of FIG. 88, FIG. 90, FIG. 91A, FIG. 91B and FIG. 94.

When both of magnetic bodies 54 and 52 are thus made resin magnetic bodies, resin forming the same absorbs impact even if both magnetic bodies 54 and 52 attract each other and directly strike in return of the push button 32, whereby the sound in return is suppressed small. Therefore, this display panel with switches can be used for an application having strict conditions as to occurrence of sounds such as a studio of a broadcasting station with no trouble. Further, the number of parts and the number of assembling steps do not increase dissimilarly to the case of interposing an elastic material such as rubber, whereby there is no problem of cost increase.

When the fixed side magnetic body 54 is made a resin magnetic body, the same and the support frame 3(6 can be integrated and manufactured by the same resin magnetic body. When the fixed side magnetic body 54 is in-plane magnetized and converted to a permanent magnet in this case, magnetization may be performed only a necessary portion opposed to the movable side magnetic body 52. When the fixed side magnetic body 54 and the support frame 30 are thus integrally manufactured, assembling of the operation part 30, and the display panel with switches is simplified as compared with the case of separating the both and assembling the fixed side magnetic body 54.

When iron plates are employed as the fixed side magnetic bodies 54 as in the embodiment of FIG. 86, pinholes are unavoidably present in these even if the surfaces thereof are plated or coated, and hence rust is caused from the iron plates and the plating or coating is readily separated when time lapses, and there is also such a possibility that the appearance of this display panel with switches is deteriorated and the quality is made small.

When the fixed side magnetic bodies 54 in the aforementioned respective embodiments are made resin magnetic bodies and the magnetic powder is made ferrite, on the other hand, it is possible to prevent occurrence of rust from the fixed side magnetic bodies 54, and separation of coating on the surfaces of the fixed side magnetic bodies 54 can be suppressed as a result, whereby excellent appearance can be kept for a long period. This is because ferrite is an oxide magnetic body as expressed in a structural formula of $MFe_2O_4$ (M is a bivalent metal), originally oxidized in a stable state and is hardly oxidized any more, i.e., hard to corrode.

Typical examples of this ferrite are nickel ferrite, nickel cobalt ferrite, manganese magnesium ferrite and the like, while the same are not restricted to these.

When the movable side magnetic bodies 52 are formed by resin magnetic bodies, whether the magnetic powder is made ferrite or not is arbitrary, while it is economic to form the fixed side magnetic bodies 54 and the movable side magnetic bodies 52 by resin magnetic bodies of the same material.

<7-3. Further Example of Touch Panel>

While those of a resistor film type and a photoelectric type and an ultrasonic wave type have been described as touch panels in the aforementioned respective embodiments, the touch panel may be of still another system such as an electric capacitance type or a piezoelectric film type, for example.

While description has been made as to the respective embodiments of the present invention, the scope of the present invention is not restricted to the aforementioned embodiments, but defined by the scope of appended claims.

We claim:

1. A switching device for use with an information display, for switching a signal, comprising:

a touch panel having a transparent touch switch for switching said signal by being touched with a substantially zero stroke; and an operation part being provided on said touch switch and having at least one operation means for operating said touch switch, each operation means having a support frame being provided on said touch switch, a transparent push button being supported on a reference position on said touch switch by said support frame and operating said touch switch by being pushed from said reference position toward said touch switch, and return means for applying return force to said push button, said return force being directed from said touch switch toward said reference position;

wherein an item of information displayed on said information display can be viewed through said touch switch and said push button.

2. The switching device in accordance with claim 1, wherein said return means has first magnetic means being mounted on said push button, and second magnetic means being mounted on said support frame, said return force being generated by magnetic interaction of said first magnetic means and said second magnetic means.

3. The switching device in accordance with claim 2, wherein said push button slides along said support frame in a direction from said reference position toward said touch switch to operate said touch switch.

4. The switching device in accordance with claim 3, wherein a zone where said return force reduces is included in a movement range of said push button from said reference position toward said touch switch.

5. The switching device in accordance with claim 4, wherein said first magnetic means includes a first permanent magnet, and said second magnetic means includes a second permanent magnet.

6. The switching device in accordance with claim 5, wherein said return force is generated by magnetic attractive force between said first permanent magnet and said second permanent magnet.

7. The switching device in accordance with claim 6, wherein an upper surface of said first permanent magnet has arrangement of an N pole and an S pole, a bottom surface of said first permanent magnet has no magnetic pole, a bottom surface of said second permanent magnet has arrangement of an N pole and an S pole, a top surface of said second permanent magnet has no magnetic pole, said N pole of said first permanent magnet is opposed to said S pole of said second permanent magnet, and said S pole of said first permanent magnet is opposed to said N pole of said second permanent magnet.

8. The switching device in accordance with claim 7, wherein each of said first and second permanent magnets is magnetic resin being formed by mixing magnetic powder into resin.

9. The switching device in accordance with claim 4, wherein said first magnetic means includes a permanent magnet, and said second magnetic means includes a magnetic metal member being mounted on said support frame in a position upward beyond said first magnetic means.

10. The switching device in accordance with claim 9, wherein an upper surface of said permanent magnet has arrangement of an S pole and an N pole, a bottom surface of said permanent magnet has no magnetic pole, and said top surface of said permanent magnet is opposed to said magnetic metal member.

11. The switching device in accordance with claim 10, wherein said permanent magnet is magnetic resin being formed by mixing magnetic powder into resin.

12. The switching device in accordance with claim 2, wherein said push button is that rotates about a prescribed fulcrum to operate said touch switch.

13. The switching device in accordance with claim 12, wherein a zone where said return force reduces is included in a movement range of said push button from said reference position toward said touch switch.

14. The switching device in accordance with claim 13, wherein said first magnetic means includes a first permanent magnet, and said second magnetic means includes a second permanent magnet.

15. The switching device in accordance with claim 14, wherein said return force is generated by magnetic attractive force between said first permanent magnet and said second permanent magnet.

16. The switching device in accordance with claim 15, wherein a top surface of said first permanent magnet has arrangement of an N pole and an S pole, a bottom surface of said first permanent magnet has no magnetic pole, a bottom surface of said second permanent magnet has arrangement of an N pole and an S pole, a top surface of said second permanent magnet has no magnetic pole, said N pole of said first permanent magnet is opposed to said S pole of said second permanent magnet, and said S pole of said first permanent magnet is opposed to said N pole of said second permanent magnet.

17. The switching device in accordance with claim 16, wherein each of said first and second permanent magnets is magnetic resin being formed by mixing magnetic powder into resin.

18. The switching device in accordance with claim 13, wherein said first magnetic means includes a permanent magnet, and said second magnetic means includes a magnetic metal member being mounted on said support frame in a position upward beyond said first magnetic means.

19. The switching device in accordance with claim 18, wherein
  a top surface of said permanent magnet has arrangement of an S pole and an N pole, and
  a bottom surface of said permanent magnet has no magnetic pole,
  said top surface of said permanent magnet being opposed to said magnetic metal member.

20. The switching device in accordance with claim 19, wherein
  said permanent magnet is magnetic resin being formed by mixing magnetic powder into resin.

21. The switching device in accordance with claim 2, wherein
  said push button includes a lens.

22. The switching device in accordance with claim 2, wherein said operation part has
  a plurality of operation means being arranged on said touch panel.

23. The switching device in accordance with claim 22, wherein
  a top surface of said push button is higher than a top surface of said support frame when said push button is in said reference position,
  top surfaces of respective push buttons in said plurality of operation means being adjacent to each other.

24. The switching device in accordance with claim 22, further comprising a flexible sheet covering upper surfaces of said plurality of operation means.

25. The switching device in accordance with claim 1, wherein said return means has
  a spring being interposed between said touch switch and said push button.

26. The switching device in accordance with claim 2, wherein
  said signal is an electric signal,
  said touch switch having a plurality of electrode layers being separately opposed to each other and coming into contact with each other through touching by said push button.

27. The switching device in accordance with claim 26, further comprising a spacer being provided on said touch switch, said push button operating said touch switch through said spacer.

28. The switching device in accordance with claim 26, wherein said push button has
  a button body, and
  a leg being formed under said button body.

29. The switching device in accordance with claim 2, wherein
  said signal is an optical signal, and
  said touch switch has a path of said optical signal,
  a transmission state of said optical signal in said path being changed by pushdown of said push button.

30. The switching device in accordance with claim 2, wherein
  said signal is an ultrasonic signal, and
  said touch switch has a path of said ultrasonic signal,
  propagation of said ultrasonic signal in said path being cut off by pushdown of said push button.

31. A display device with a switch where prescribed items are displayed and operable to switch a signal in response to manual operation, said display device comprising:
  display means having a display surface being capable of displaying prescribed items;
  a touch panel provided on said display surface and having a light transmittable transparent touch switch for switching said signal by being touched with a substantially zero stroke; and
  an operation part being provided on said touch switch, and having at least one operation means for operating said touch switch,
  each operation means having
  a support frame being provided on said touch switch,
  a light transmittable transparent push button being supported on a reference position on said touch switch by said support frame and operating said touch switch by being pushed from said reference position toward said touch switch, and
  return means for applying return force to said push button, said return force being directed from said touch switch, toward said reference position;
  wherein an item of information displayed on said display surface can be viewed through said touch switch and said push button.

32. The display device with a switch in accordance with claim 31, wherein said return means has
  first magnetic means being mounted on said push button, and
  second magnetic means being mounted on said support frame,
  said return force being generated by magnetic interaction of said first magnetic means and said second magnetic means.

33. The display device with a switch in accordance with claim 32, wherein a zone where said return force reduces is included in a movement range of said push button from said reference position toward said touch switch.

34. The display device with a switch in accordance with claim 31, wherein said return means has
  a first permanent magnet being mounted on said push button, and
  a second permanent magnet being mounted under said display means,
  said return force being generated by magnetic repulsion of said first permanent magnet and said second permanent magnet.

35. The display device with a switch in accordance with claim 31, wherein said operation part has
  arrangement of operation means being arranged on said touch panel,
  said display means having
  arrangement of a display region in correspondence to arrangement of said operation means.

36. The display device with a switch in accordance with claim 35, wherein
  said display means is capable of changing said prescribed items to be displayed.

37. The display device with a switch in accordance with claim 36, wherein
  said display means is capable of displaying said prescribed items over a plurality of display regions.

38. The switching device in accordance with claim 1, wherein said item of information includes at least one character.

39. The display device in accordance with claim 31, wherein said item of information includes at least one character.

* * * * *